(12) United States Patent
Kerr et al.

(10) Patent No.: US 8,182,608 B2
(45) Date of Patent: May 22, 2012

(54) DEPOSITION SYSTEM FOR THIN FILM FORMATION

(75) Inventors: Roger S. Kerr, Brockport, NY (US); David H. Levy, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 1273 days.

(21) Appl. No.: 11/861,420

(22) Filed: Sep. 26, 2007

(65) Prior Publication Data
US 2009/0078204 A1   Mar. 26, 2009

(51) Int. Cl.
C23C 16/00   (2006.01)
(52) U.S. Cl. ....................................... 118/719
(58) Field of Classification Search ............... 118/718, 118/719
See application file for complete search history.

(56) References Cited

U.S. PATENT DOCUMENTS

| | | | |
|---|---|---|---|
| 3,681,042 A * | 8/1972 | Edwards et al. ............... 65/60.2 |
| 4,413,022 A | 11/1983 | Suntola et al. | |
| 5,838,345 A | 11/1998 | Kerr et al. | |
| 5,981,970 A | 11/1999 | Dimitrakopoulos et al. | |
| 5,997,119 A | 12/1999 | Kerr | |
| 6,677,975 B1 | 1/2004 | Kerr | |
| 6,821,563 B2 | 11/2004 | Yudovsky | |
| 7,413,982 B2 | 8/2008 | Levy | |
| 7,456,429 B2 | 11/2008 | Levy | |
| 7,572,686 B2 | 8/2009 | Levy et al. | |
| 7,789,961 B2 | 9/2010 | Nelson et al. | |
| 2003/0194493 A1 * | 10/2003 | Chang et al. ............... 427/248.1 |
| 2004/0067641 A1 | 4/2004 | Yudovsky | |
| 2005/0084610 A1 | 4/2005 | Selitser | |
| 2005/0095846 A1 | 5/2005 | Basol | |
| 2006/0214154 A1 | 9/2006 | Yang et al. | |
| 2008/0166880 A1 | 7/2008 | Levy | |
| 2009/0081366 A1 | 3/2009 | Kerr et al. | |
| 2009/0081885 A1 | 3/2009 | Levy et al. | |
| 2009/0130858 A1 | 5/2009 | Levy | |

OTHER PUBLICATIONS

U.S. Appl. No. 11/392,006, filed Mar. 29, 2006, Levy.
U.S. Appl. No. 11/392,007, filed Mar. 29, 2006, Levy.
U.S. Appl. No. 11/620,738, filed Jan. 8, 2007, Levy.
U.S. Appl. No. 11/620,740, filed Jan. 8, 2007, Nelson et al.
U.S. Appl. No. 11/620,744, filed Jan. 8, 2007, Levy.
Putkonen et al., "Atomic Layer Deposition of Polyimide Thin Films", Journal of Materials Chemistry, vol. 17, 2007, pp. 664-669.

* cited by examiner

*Primary Examiner* — Karla Moore
(74) *Attorney, Agent, or Firm* — William R. Zimmerli

(57) ABSTRACT

An apparatus for maintaining the alignment or positional relationship between at least two coating modules in an ALD system, the apparatus comprising a plurality of coating modules in a coating section, at least a first bar and a second bar for supporting the coating modules, and at least a first bar mounting structure and a second bar mounting structure for supporting the bars, wherein each of the coating modules are supported by the first bar and the second bar, and wherein the combination of the at least two coating modules and the first bar and the second bar define a coating section profile for the output faces of the coating modules. Also disclosed is a process for making such apparatus.

22 Claims, 40 Drawing Sheets

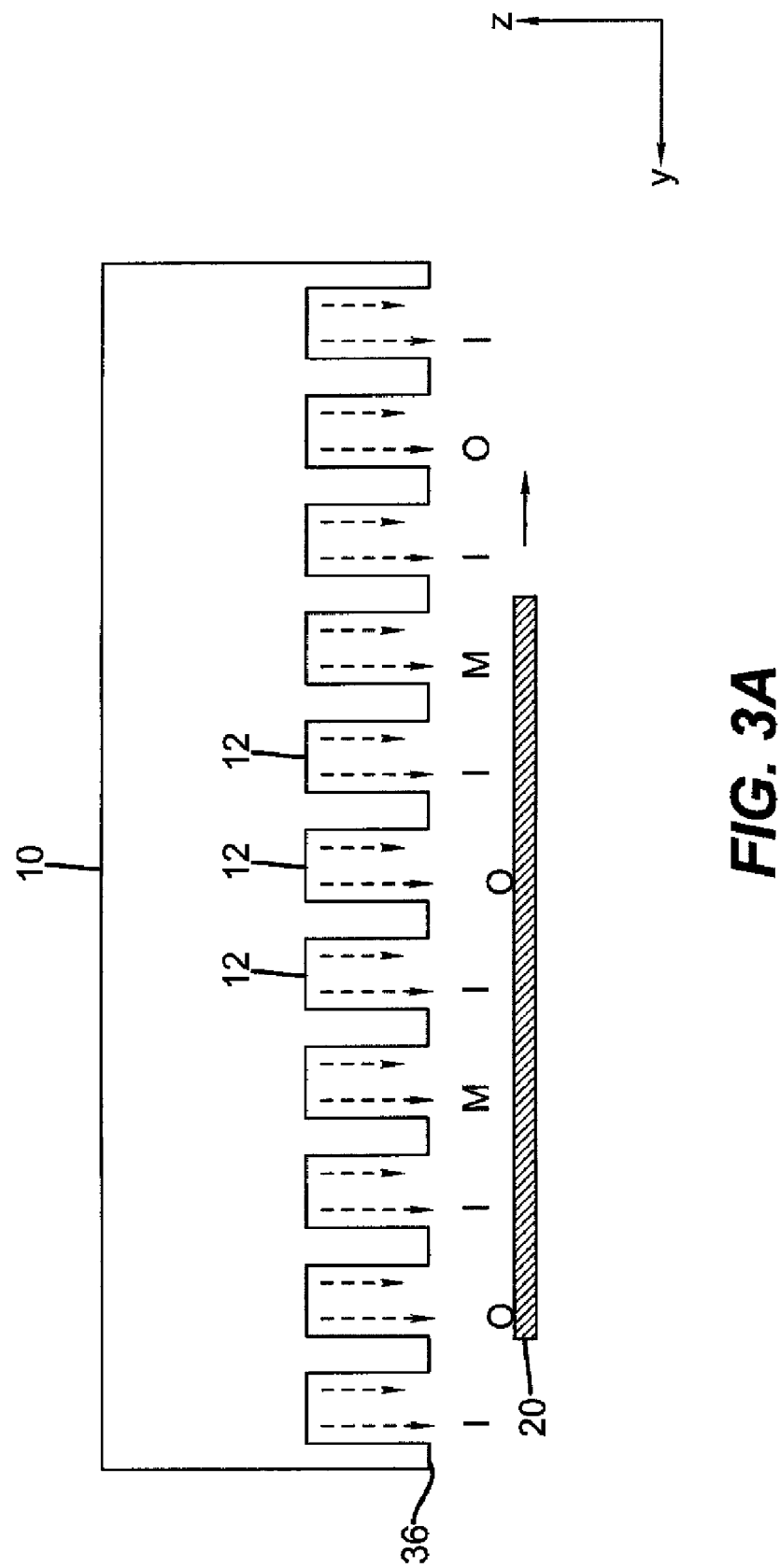

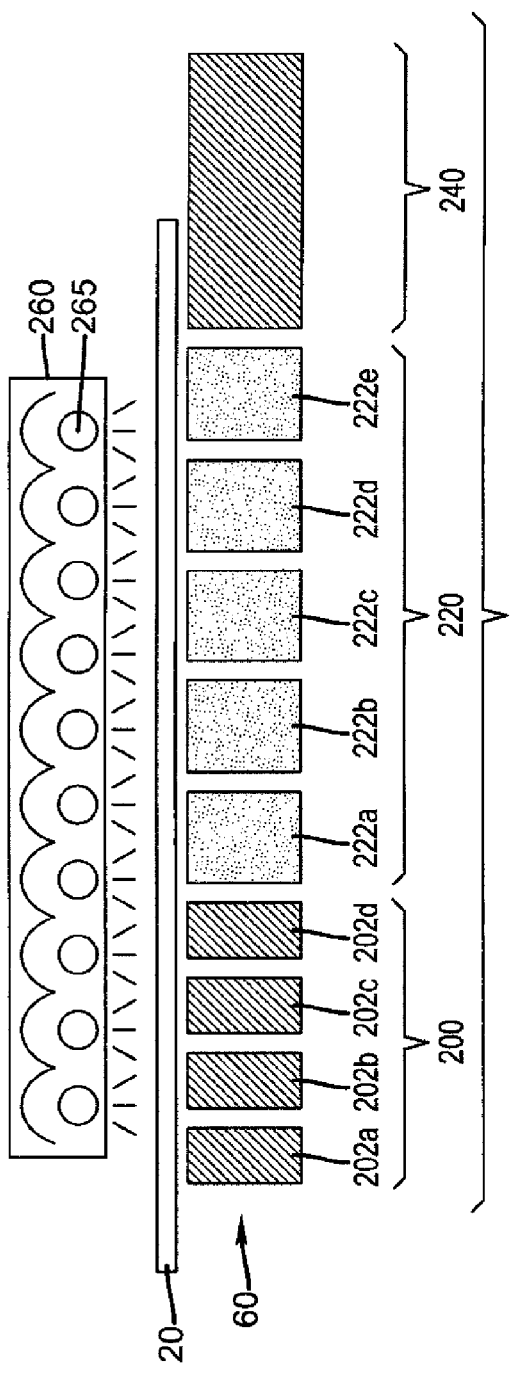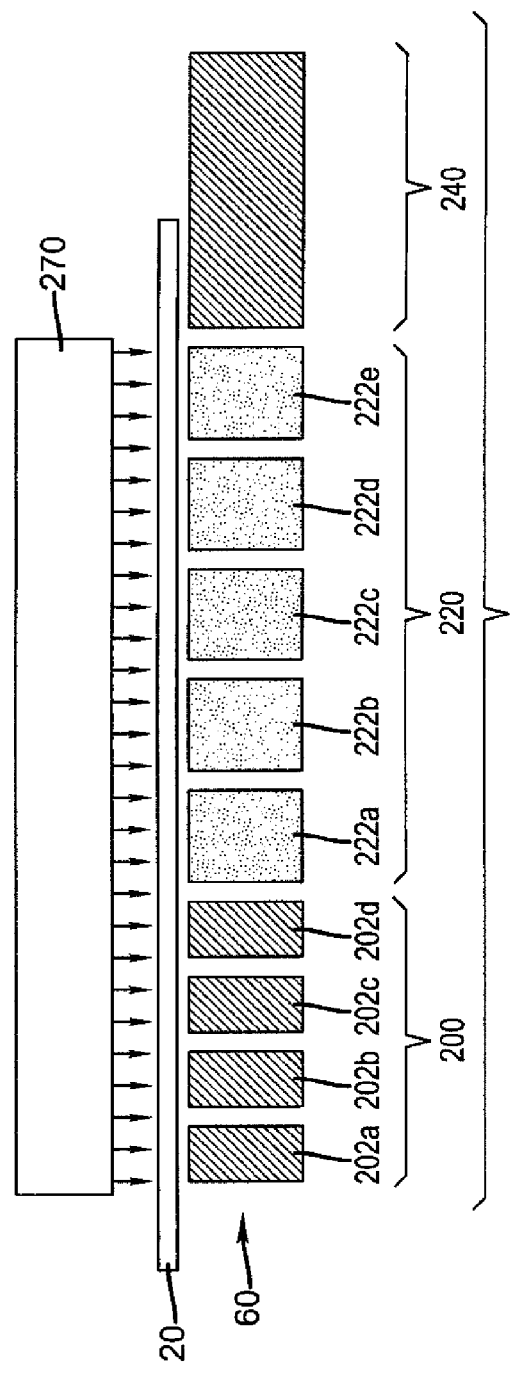

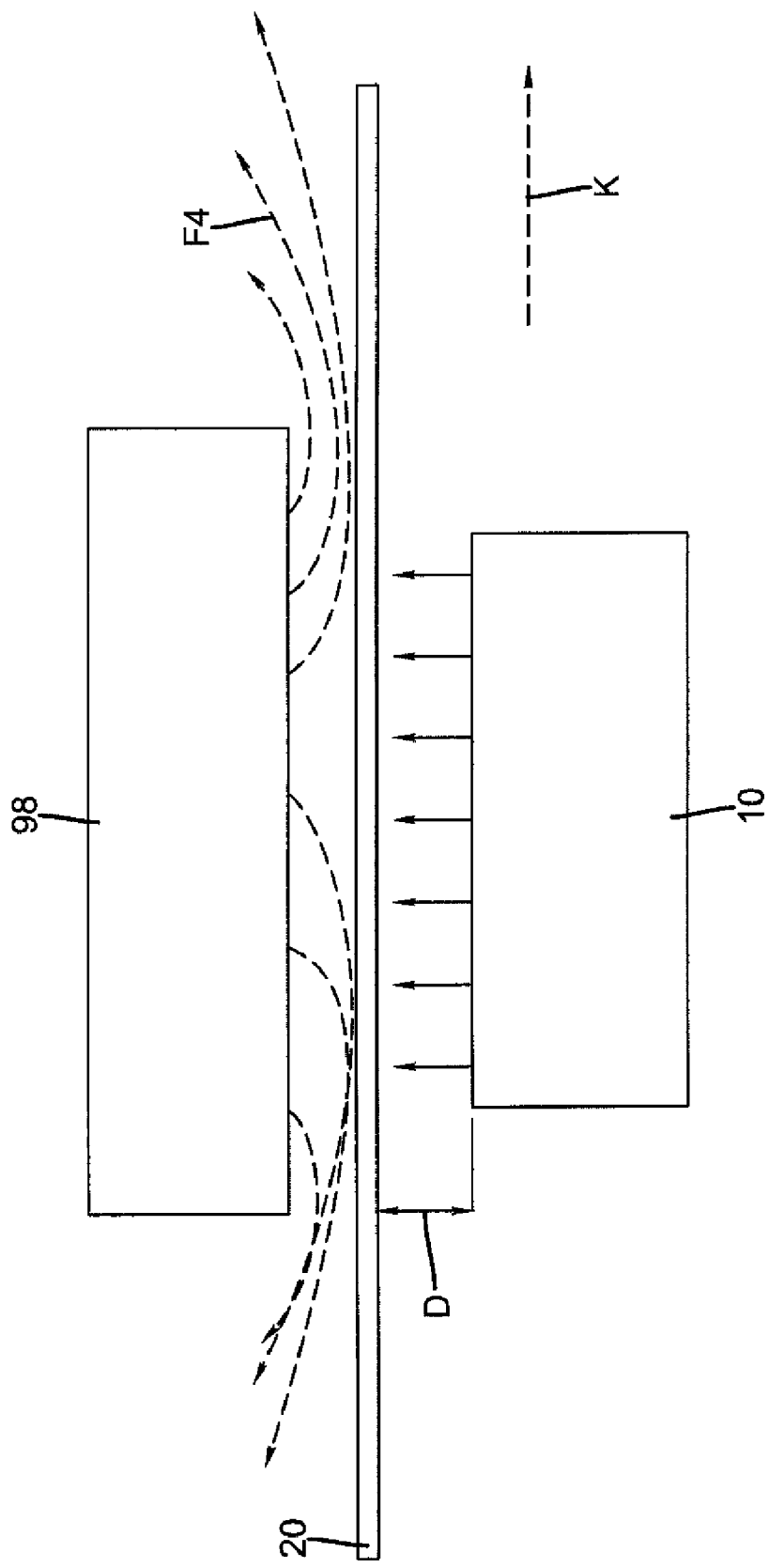

DEPOSITION SYSTEM FOR THIN FILM FORMATION

CROSS-REFERENCE TO RELATED APPLICATIONS

The present application is related to US Publication No. 2007/0238311, filed Mar. 29, 2006 by Levy and entitled, "PROCESS FOR ATOMIC LAYER DEPOSITION," US Publication No. 2007/0228470, filed Mar. 29, 2006 by Levy and entitled "APPARATUS FOR ATOMIC LAYER DEPOSITION," U.S. application Ser. No. 11/620,738, filed Jan. 8, 2007, by Levy and entitled "DELIVERY DEVICE FOR DEPOSITION," U.S. application Ser. No. 11/620,740, filed Jan. 8, 2007 by Nelson et al. and entitled "DELIVERY DEVICE COMPRISING GAS DIFFUSER FOR THIN FILM DEPOSITION," U.S. application Ser. No. 11/620,744, filed Jan. 8, 2007 by Levy and entitled, "DEPOSITION SYSTEM AND METHOD USING A DELIVERY HEAD SEPARATED FROM A SUBSTRATE BY GAS PRESSURE," U.S. application Ser. No. 11/861,372, filed concurrently herewith by Levy et al. and entitled, "SYSTEM FOR THIN FILM DEPOSITION UTILIZING COMPENSATING FORCES," U.S. application Ser. No. 11/861,402, filed concurrently herewith by Kerr et al. and entitled "DELIVERY DEVICE FOR DEPOSITION," and U.S. application Ser. No. 11/861,359, filed concurrently herewith by Levy et al. and entitled, "DEPOSITION SYSTEM FOR THIN FILM FORMATION." All the above-identified applications incorporated by reference in their entirety.

FIELD OF THE INVENTION

This invention generally relates to the deposition of thin film materials and, more particularly, to apparatus for atomic layer deposition onto a substrate that advantageously allows a plurality of deposition delivery heads each directing simultaneous gas flows onto a substrate. In particular, the invention relates to alignment of delivery heads for improved performance.

BACKGROUND OF THE INVENTION

Among the techniques widely used for thin-film deposition is Chemical Vapor Deposition (CVD) that uses chemically reactive molecules that react in a reaction chamber to deposit a desired film on a substrate. Molecular precursors useful for CVD applications comprise elemental (atomic) constituents of the film to be deposited and typically also include additional elements. CVD precursors are volatile molecules that are delivered, in a gaseous phase, to a chamber in order to react at the substrate, forming the thin film thereon. The chemical reaction deposits a thin film with a desired film thickness.

Common to most CVD techniques is the need for application of a well-controlled flux of one or more molecular precursors into the CVD reactor. A substrate is kept at a well-controlled temperature under controlled pressure conditions to promote chemical reaction between these molecular precursors, concurrent with efficient removal of byproducts. Obtaining optimum CVD performance requires the ability to achieve and sustain steady-state conditions of gas flow, temperature, and pressure throughout the process, and the ability to minimize or eliminate transients.

Especially in the field of semiconductor, integrated circuit, and other electronic devices, there is a demand for thin films, especially higher quality, denser films, with superior conformal coating properties, beyond the achievable limits of conventional CVD techniques, especially thin films that can be manufactured at lower temperatures.

Atomic layer deposition ("ALD") is an alternative film deposition technology that can provide improved thickness resolution and conformal capabilities compared to its CVD predecessor. The ALD process segments the conventional thin-film deposition process of conventional CVD into single atomic-layer deposition steps. Advantageously, ALD steps are self-terminating and can deposit one atomic layer when conducted up to or beyond self-termination exposure times. An atomic layer typically ranges from about 0.1 to about 0.5 molecular monolayers, with typical dimensions on the order of no more than a few Ångstroms (Å). In ALD, deposition of an atomic layer is the outcome of a chemical reaction between a reactive molecular precursor and the substrate. In each separate ALD reaction-deposition step, the net reaction deposits the desired atomic layer and substantially eliminates "extra" atoms originally included in the molecular precursor. In its most pure form, ALD involves the adsorption and reaction of each of the precursors in the absence of the other precursor or precursors of the reaction. In practice, in any system it is difficult to avoid some direct reaction of the different precursors leading to a small amount of chemical vapor deposition reaction. The goal of any system claiming to perform ALD is to obtain device performance and attributes commensurate with an ALD system while recognizing that a small amount of CVD reaction can be tolerated.

In ALD applications, typically two molecular precursors are introduced into the ALD reactor in separate stages. For example, a metal precursor molecule, $ML_x$, comprises a metal element, M that is bonded to an atomic or molecular ligand, L. For example, M could be, but would not be restricted to, Al, W, Ta, Si, Zn, etc. The metal precursor reacts with the substrate when the substrate surface is prepared to react directly with the molecular precursor. For example, the substrate surface typically is prepared to include hydrogen-containing ligands, AH or the like, that are reactive with the metal precursor. Sulfur (S), oxygen (O), and Nitrogen (N) are some typical A species. The gaseous metal precursor molecule effectively reacts with all of the ligands on the substrate surface, resulting in deposition of a single atomic layer of the metal:

$$\text{substrate-AH} + ML_x \rightarrow \text{substrate-AML}_{x-1} + HL \qquad (1)$$

where HL is a reaction by-product. During the reaction, the initial surface ligands, AH, are consumed, and the surface becomes covered with L ligands, which cannot further react with metal precursor $ML_x$. Therefore, the reaction self-terminates when all of the initial AH ligands on the surface are replaced with $AML_{x-1}$ species. The reaction stage is typically followed by an inert-gas purge stage that eliminates the excess metal precursor from the chamber prior to the separate introduction of a second reactant gaseous precursor material.

The second molecular precursor then is used to restore the surface reactivity of the substrate towards the metal precursor. This is done, for example, by removing the L ligands and redepositing AH ligands. In this case, the second precursor typically comprises the desired (usually nonmetallic) element A (i.e., O, N, S), and hydrogen (i.e., $H_2O$, $NH_3$, $H_2S$). The next reaction is as follows:

$$\text{substrate-A-ML} + AH_y \rightarrow \text{substrate-A-M-AH} + HL \qquad (2)$$

This converts the surface back to its AH-covered state. (Here, for the sake of simplicity, the chemical reactions are not balanced.) The desired additional element, A, is incorporated into the film and the undesired ligands, L, are eliminated as volatile by-products. Once again, the reaction consumes the reactive sites (this time, the L terminated sites) and self-terminates when the reactive sites on the substrate are entirely depleted. The second molecular precursor then is removed from the deposition chamber by flowing inert purge-gas in a second purge stage.

In summary, then, the basic ALD process requires alternating, in sequence, the flux of chemicals to the substrate. The representative ALD process, as discussed above, is a cycle having four different operational stages:
1. $ML_x$ reaction;
2. $ML_x$ purge;
3. $AH_y$ reaction; and
4. $AH_y$ purge, and then back to stage 1.

ALD has been most typically utilized for the deposition of inorganic compounds where metal precursors have been halides, alkoxides, diketonate chelates, or organometallic compounds. The second precursor has been typically an oxygen, nitrogen or sulfur source, when oxides, nitrides, or sulfides are deposited, respectively. Although it is relatively less common, the deposition of organic compounds or organic/inorganic hybrid layers by ALD is also known. In these cases, it is possible to still have an alternating sequence of self-limiting reactions, except that the limiting layer produced by such a process may be a layer of molecules as opposed to atoms. Accordingly, such techniques may also be referred to as molecular layer deposition (MLD), although the basic concepts and deposition equipment are similar to ALD processes and equipment and so "ALD" is also used herein to refer to such molecular layer deposition. An example of atomic layer (molecular layer deposition) of organic films can be found in "Atomic Layer Deposition of Polyimide Thin Films," by Matti Putkonen, et. al. in the *Journal of Materials Chemistry*.

The repeated sequence of alternating surface reactions and precursor-removal that restores the substrate surface to its initial reactive state, with intervening purge operations, is a typical ALD deposition cycle. A key feature of ALD operation is the restoration of the substrate to its initial surface chemistry condition. Using this repeated set of steps, a film can be layered onto the substrate in equal metered layers that are all alike in chemical kinetics, deposition per cycle, composition, and thickness.

ALD can be used as a fabrication step for forming a number of types of thin film electronic devices, including semiconductor devices and supporting electronic components such as resistors and capacitors, insulators, bus lines, and other conductive structures. ALD is particularly suited for forming thin layers of metal oxides in the components of electronic devices. General classes of functional materials that can be deposited with ALD include conductors, dielectrics or insulators, and semiconductors.

Conductors can be any useful conductive material. For example, the conductors may comprise transparent materials such as indium-tin oxide (ITO), doped zinc oxide ZnO, $SnO_2$, or $In_2O_3$. The thickness of the conductor may vary, and according to particular examples it can range from about 50 to about 1000 nm.

Examples of useful semiconducting materials are compound semiconductors such as gallium arsenide, gallium nitride, cadmium sulfide, intrinsic zinc oxide, and zinc sulfide.

A dielectric material electrically insulates various portions of a patterned circuit. A dielectric layer may also be referred to as an insulator or insulating layer. Specific examples of materials useful as dielectrics include strontiates, tantalates, titanates, zirconates, aluminum oxides, silicon oxides, tantalum oxides, hafnium oxides, titanium oxides, zinc selenide, and zinc sulfide. In addition, alloys, combinations, and multilayers of these examples can be used as dielectrics. Of these materials, aluminum oxides are preferred.

A dielectric structure layer may comprise two or more layers having different dielectric constants. Such insulators are discussed in U.S. Pat. No. 5,981,970 hereby incorporated by reference and copending US Patent Publication No. 2006/0214154, hereby incorporated by reference. Dielectric materials typically exhibit a band-gap of greater than about 5 eV. The thickness of a useful dielectric layer may vary, and according to particular examples it can range from about 10 to about 300 nm.

A number of device structures can be made with the functional layers described above. A resistor can be fabricated by selecting a conducting material with moderate to poor conductivity. A capacitor can be made by placing a dielectric between two conductors. A diode can be made by placing two semiconductors of complementary carrier type between two conducting electrodes. There may also be disposed between the semiconductors of complementary carrier type a semiconductor region that is intrinsic, indicating that that region has low numbers of free charge carriers. A diode may also be constructed by placing a single semiconductor between two conductors, where one of the conductor/semiconductors interfaces produces a Schottky barrier that impedes current flow strongly in one direction. A transistor may be made by placing upon a conductor (the gate) an insulating layer followed by a semiconducting layer. If two or more additional conductor electrodes (source and drain) are placed spaced apart in contact with the top semiconductor layer, a transistor can be formed. Any of the above devices can be created in various configurations as long as the necessary interfaces are created.

In typical applications of a thin film transistor, the need is for a switch that can control the flow of current through the device. As such, it is desired that when the switch is turned on, a high current can flow through the device. The extent of current flow is related to the semiconductor charge carrier mobility. When the device is turned off, it is desirable that the current flow be very small. This is related to the charge carrier concentration. Furthermore, it is generally preferable that visible light have little or no influence on thin-film transistor response. In order for this to be true, the semiconductor band gap must be sufficiently large (>3 eV) so that exposure to visible light does not cause an inter-band transition. A material that is capable of yielding a high mobility, low carrier concentration, and high band gap is ZnO. Furthermore, for high-volume manufacture onto a moving web, it is highly desirable that chemistries used in the process be both inexpensive and of low toxicity, which can be satisfied by the use of ZnO and the majority of its precursors.

Self-saturating surface reactions make ALD relatively insensitive to transport non-uniformities, which might otherwise impair surface uniformity, due to engineering tolerances and the limitations of the flow system or related to surface topography (that is, deposition into three dimensional, high aspect ratio structures). As a general rule, a non-uniform flux of chemicals in a reactive process generally results in different completion times over different portions of the surface area. However, with ALD, each of the reactions is allowed to complete on the entire substrate surface. Thus, differences in completion kinetics impose no penalty on uniformity. This is because the areas that are first to complete the reaction self-terminate the reaction; other areas are able to continue until the full treated surface undergoes the intended reaction.

Typically, an ALD process deposits about 0.1-0.2 nm of a film in a single ALD cycle (with one cycle having numbered steps 1 through 4 as listed earlier). A useful and economically feasible cycle time must be achieved in order to provide a uniform film thickness in a range of from about 3 nm to 30 nm for many or most semiconductor applications, and even thicker films for other applications. According to industry throughput standards, substrates are preferably processed within 2 minutes to 3 minutes, which means that ALD cycle times must be in a range from about 0.6 seconds to about 6 seconds.

ALD offers considerable promise for providing a controlled level of highly uniform thin film deposition. However, in spite of its inherent technical capabilities and advantages, a number of technical hurdles still remain. One important consideration relates to the number of cycles needed. Because of its repeated reactant and purge cycles, effective use of ALD has required an apparatus that is capable of abruptly changing the flux of chemicals from $ML_x$ to $AH_y$, along with quickly performing purge cycles. Conventional ALD systems are designed to rapidly cycle the different gaseous substances onto the substrate in the needed sequence. However, it is difficult to obtain a reliable scheme for introducing the needed series of gaseous formulations into a chamber at the needed speeds and without some unwanted mixing. Furthermore, an ALD apparatus must be able to execute this rapid sequencing efficiently and reliably for many cycles in order to allow cost-effective coating of many substrates.

In an effort to minimize the time that an ALD reaction needs to reach self-termination, at any given reaction temperature, one approach has been to maximize the flux of chemicals flowing into the ALD reactor, using so-called "pulsing" systems. In order to maximize the flux of chemicals into the ALD reactor, it is advantageous to introduce the molecular precursors into the ALD reactor with minimum dilution of inert gas and at high pressures. However, these measures work against the need to achieve short cycle times and the rapid removal of these molecular precursors from the ALD reactor. Rapid removal in turn dictates that gas residence time in the ALD reactor be minimized. Gas residence times, $\tau$, are proportional to the volume of the reactor, V, the pressure, P, in the ALD reactor, and the inverse of the flow, Q, that is:

$$\tau = VP/Q \quad (3)$$

In a typical ALD chamber the volume (V) and pressure (P) are dictated independently by the mechanical and pumping constraints, leading to difficulty in precisely controlling the residence time to low values. Accordingly, lowering pressure (P) in the ALD reactor facilitates low gas residence times and increases the speed of removal (purge) of chemical precursor from the ALD reactor. In contrast, minimizing the ALD reaction time requires maximizing the flux of chemical precursors into the ALD reactor through the use of a high pressure within the ALD reactor. In addition, both gas residence time and chemical usage efficiency are inversely proportional to the flow. Thus, while lowering flow can increase efficiency, it also increases gas residence time.

Existing ALD approaches have been compromised with the trade-off between the need to shorten reaction times with improved chemical utilization efficiency, and, on the other hand, the need to minimize purge-gas residence and chemical removal times. One approach to overcome the inherent limitations of "pulsed" delivery of gaseous material is to provide each reactant gas continuously and to move the substrate through a region containing each gas in succession. In these systems, some mechanism must be employed to confine a particular gas to a spatial region in order that the substrate can sample all of the gases during its movement, but the individual mutually reactive gases cannot mix causing undesirable CVD deposition. Such systems can be referred to as spatially confined ALD systems. For example, U.S. Pat. No. 6,821,563 entitled "GAS DISTRIBUTION SYSTEM FOR CYCLICAL LAYER DEPOSITION" to Yudovsky, describes a processing chamber, under vacuum, having separate gas ports for precursor and purge gases, alternating with vacuum pump ports between each gas port. Each gas port directs its stream of gas vertically downward toward a substrate. The separate gas flows are separated by walls or partitions, with vacuum pumps for evacuating gas on both sides of each gas stream. A lower portion of each partition extends close to the substrate, for example, about 0.5 mm or greater from the substrate surface. In this manner, the lower portions of the partitions are separated from the substrate surface by a distance sufficient to allow the gas streams to flow around the lower portions toward the vacuum ports after the gas streams react with the substrate surface.

A rotary turntable or other transport device is provided for holding one or more substrate wafers. With this arrangement, the substrate is shuttled beneath the different gas streams, effecting ALD deposition thereby. In one embodiment, the substrate is moved in a linear path through a chamber, in which the substrate is passed back and forth a number of times.

Another approach using continuous gas flow is shown in U.S. Pat. No. 4,413,022 entitled "METHOD FOR PERFORMING GROWTH OF COMPOUND THIN FILMS" to Suntola et al. A gas flow array is provided with alternating source gas openings, carrier gas openings, and vacuum exhaust openings. Reciprocating motion of the substrate over the array effects ALD deposition, again, without the need for pulsed operation. In the embodiment of FIGS. 13 and 14, in particular, sequential interactions between a substrate surface and reactive vapors are made by a reciprocating motion of the substrate over a fixed array of source openings. Diffusion barriers are formed by having a carrier gas opening between exhaust openings. Suntola et al. state that operation with such an embodiment is possible even at atmospheric pressure, although little or no details of the process, or examples, are provided.

While systems such as those described in the '563 Yudovsky and '022 Suntola et al. patents may avoid some of the difficulties inherent to pulsed gas approaches, these systems have other drawbacks. Neither the gas flow delivery unit of the '563 Yudovsky patent nor the gas flow array of the '022 Suntola et al. patent can be used in closer proximity to the substrate than about 0.5 mm. Neither of the gas flow delivery apparatus disclosed in the '563 Yudovsky and '022 Suntola et al. patents are arranged for possible use with a moving web surface, such as could be used as a flexible substrate for forming electronic circuits, light sensors, or displays, for example. The complex arrangements of both the gas flow delivery unit of the '563 Yudovsky patent and the gas flow array of the '022 Suntola et al. patent, each providing both gas flow and vacuum, make these solutions difficult to implement, costly to scale, and limit their potential usability to deposition applications onto a moving substrate of limited dimensions. Moreover, it would be very difficult to maintain a uniform vacuum at different points in an array and to maintain synchronous gas flow and vacuum at complementary pressures, thus compromising the uniformity of gas flux that is provided to the substrate surface.

US Patent Publication No. 2005/0084610 to Selitser discloses an atmospheric pressure atomic layer chemical vapor deposition process. Selitser state that extraordinary increases in reaction rates are obtained by changing the operating pressure to atmospheric pressure, which will involve orders of magnitude increase in the concentration of reactants, with consequent enhancement of surface reactant rates. The embodiments of Selitser involve separate chambers for each stage of the process, although FIG. 10 in 2005/0084610 shows an embodiment in which chamber walls are removed. A series of separated injectors are spaced around a rotating circular substrate holder track. Each injector incorporates independently operated reactant, purging, and exhaust gas manifolds and controls and acts as one complete mono-layer deposition and reactant purge cycle for each substrate as is passes there under in the process. Little or no specific details of the gas injectors or manifolds are described by Selitser, although it is stated that spacing of the injectors is selected so that cross-contamination from adjacent injectors is prevented by purging gas flows and exhaust manifolds incorporated in each injector.

Another approach for spatially confining gases in an ALD processing device is described in the above-cited US Publication No. 2007/0228470 which discloses a transverse flow ALD device. In such a device, various gases are directed parallel to each other and thus limit any gas intermixing by limiting the degree of countercurrent flow.

An efficient method for allowing for gas isolation is the floating-head ALD device of the above-cited U.S. patent application Ser. No. 11/620,738. In this device, the pressure of flowing reactive and purge gases is used as a means to separate the coating head from the substrate. Due to the relatively large pressures that can be generated in such a system, gases are forced to travel in well-defined paths and thus eliminate undesired gas intermixing.

Commonly assigned U.S. Pat. Nos. 5,838,345 to Kerr et al., 5,997,119 to Kerr, and 6,677,975 to Kerr relate to apparatus for maintaining the positional relationship of a print head or an imaging subsystem, all three patents hereby incorporated by reference in their entirety. For example, U.S. Pat. No. 5,838,345, relates to an apparatus for maintaining the positional relationship of a print head in a lathe bed scanner, the apparatus comprising a first bar for supporting the print head of the lathe bed scanner. A magnet is positioned adjacent the first bar for magnetically attracting the first bar which, in turn, maintains the positional relationship of the bar and, consequently, the print head.

Problem to be Solved

Because a single cycle in the ALD deposition process only deposits on the order of one atomic layer of atoms, a typical thin film deposition requires many growth cycles. Usually an atomic layer has a thickness on the order of about 1 Ångstrom (Å). Since many films in semiconductor systems are on the order of 1000 Å or thicker, such growths would, therefore, require on the order of 1000 or more ALD cycles. In many of the above-cited references for spatially dependent ALD, it is proposed that a large number of ALD cycles be achieved with a relatively smaller deposition area that moved in some sort of repetitive or reciprocating motion over the substrate.

In view of the above, throughput considerations as well as elimination of unnecessary mechanical components has led Applicants to the important advantages of having a single large coating area that is stationary. Creating such a large deposition region might be difficult to achieve by creating a single monolithic deposition delivery head. The difficulty arises from several factors. First of all such long heads would be composed of thousands of parts, and a successfully constructed delivery head would require assembling this large number of parts without significant defects. Furthermore, there might be significant problems in mounting and handling a very large delivery head into an overall deposition system. Finally, if the delivery head is damaged in operation, replacing a single large delivery head would be very costly and time consuming.

An alternative to a single large deposition delivery head is to construct a plurality of delivery heads each comprising an independent module. A module of an overall deposition system can optionally also represent a full entrance section or exit section, in addition to a plurality of modules in a coating (deposition) section of the deposition system. Alternatively, each given section can be constructed from a number of modules.

In the case of many of the aforementioned spatially dependent ALD systems, a successful coating operation depends upon having each delivery head, or output face thereof, in very close proximity to the surface of the substrate being coated with a thin film. In preferred embodiments, a spatial separation of less than 50 microns is desired. In a system composed of modules, a substrate such as a piece of glass will be transported from the one module to its neighbor. Considering how close the substrate will be to the output face of a coating module, it is critical that the output face of a neighboring coating module be aligned with that of the first module very accurately. It is therefore necessary to devise a mechanism to provide for very accurate positioning and alignment of each coating module, and its output face, among a plurality of modules, relative to the other coating modules and their output faces.

SUMMARY OF THE INVENTION

The present invention is directed to an apparatus for maintaining the alignment or positional relationship between at least two modules in an ALD system, the apparatus comprising:

(a) a plurality of coating modules in a coating section of the ALD system;

(b) at least a first bar and a second bar for supporting at least a first coating module and a second coating module; and (c) at least a first bar mounting structure and a second bar mounting structure for supporting, respectively, the first far and the second bar; wherein each of the at least two coating modules are supported by the first bar and the second bar, wherein the combination of the at least two coating modules and the first bar and the second bar define a coating section profile for the output faces of the at least two coating modules.

In one preferred embodiment, a deposition system comprises a entrance section, a coating section comprising a plurality of coating modules or delivery heads, and an exit section, in which one or more of the gas flows from the delivery heads provides a pressure that at least contributes to the separation of the surface of the substrate from the output faces of the delivery heads.

Another aspect of the invention relates to a method of making the above-described apparatus, wherein the coating section profile is defined by a plurality of magnets within the bar mounting structures, and wherein the position of the plurality of magnets is set using a master set tool.

In particular, this invention provides a mechanical means of providing modules for the above apparatus that can be manufactured in a cost effective way while providing excellent alignment of the output face of one coating module to the output face of at least one neighboring module.

In a preferred embodiment, the system can be operated with continuous movement of a substrate being subjected to thin film deposition, wherein the system is capable of conveying the support or a web past the delivery head, preferably in an environment unsealed to ambient conditions at substantially atmospheric pressure.

It is an advantage of the present invention that it can provide a compact apparatus for atomic layer deposition onto a substrate that is well suited to a number of different types of substrates and deposition environments.

It is a further advantage of the present invention that it allows operation, in preferred embodiments, under atmospheric pressure conditions.

It is yet a further advantage of the present invention that it is adaptable for deposition on a web or other moving substrate, including deposition onto a large area substrate.

It is still a further advantage of the present invention that it can be employed in low temperature processes at atmospheric pressures, which process may be practiced in an unsealed environment, open to ambient atmosphere. The method of the present invention allows control of the gas residence time τ in the relationship shown earlier in equation (3), allowing residence time τ to be reduced, with system pressure and volume controlled by a single variable, the gas flow.

These and other objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

FIGS. 3A and 3B are cross-sectional side views of one embodiment of a delivery head, schematically showing the accompanying deposition operation;

FIG. 19A is a cross-sectional side view of one embodiment of a modular deposition system of the current invention;

FIG. 19B is a cross-sectional side view of another embodiment of a modular deposition system of the current invention;

FIG. 27 illustrates an embodiment for a deposition system comprising a backside gas fluid bearing.

DETAILED DESCRIPTION OF THE INVENTION

The present description is directed in particular to elements forming part of, or cooperating more directly with, apparatus in accordance with the invention. It is to be understood that elements not specifically shown or described may take various forms well known to those skilled in the art.

For the description that follows, the term "gas" or "gaseous material" is used in a broad sense to encompass any of a range of vaporized or gaseous elements, compounds, or materials. Other terms used herein, such as: reactant, precursor, vacuum, and inert gas, for example, all have their conventional meanings as would be well understood by those skilled in the materials deposition art. The figures provided are not drawn to scale but are intended to show overall function and the structural arrangement of some embodiments of the present invention.

For many thin film applications the substrate is commonly considered as a sheet of material which may or may not be planar. Examples of typical substrates are sheets of glass, metal, or plastic. Alternatively, the substrate to be coated may be a rigid object of arbitrary shape as long as the deposition head is able to achieve close proximity to the surface of that object. Examples of such objects might be cylindrical drums or spherical objects. In the event a substrate is not perfectly planar, the distance from the head to the substrate can be averaged as appropriate over the area of deposition.

For the description that follows, superposition has its conventional meaning, wherein elements are laid atop or against one another in such manner that parts of one element align with corresponding parts of another and that their perimeters generally coincide.

Terms "upstream" and "downstream" have their conventional meanings as relates to the direction of gas flow.

While this invention can be useful for any of a number of spatial ALD systems, a particularly preferred spatial ALD system comprises the embodiments of apparatus described below, which provide a significant departure from conventional approaches to ALD, employing an improved distribution device for delivery of gaseous materials to a substrate surface, adaptable to deposition on larger and web-based or web-supported substrates and capable of achieving a highly uniform thin-film deposition at improved throughput speeds. The apparatus and method employ continuous (as opposed to pulsed) gaseous material distribution. The apparatus allows operation at atmospheric or near-atmospheric pressures as well as under vacuum and is capable of operating in an unsealed or open-air environment.

Figure 1:
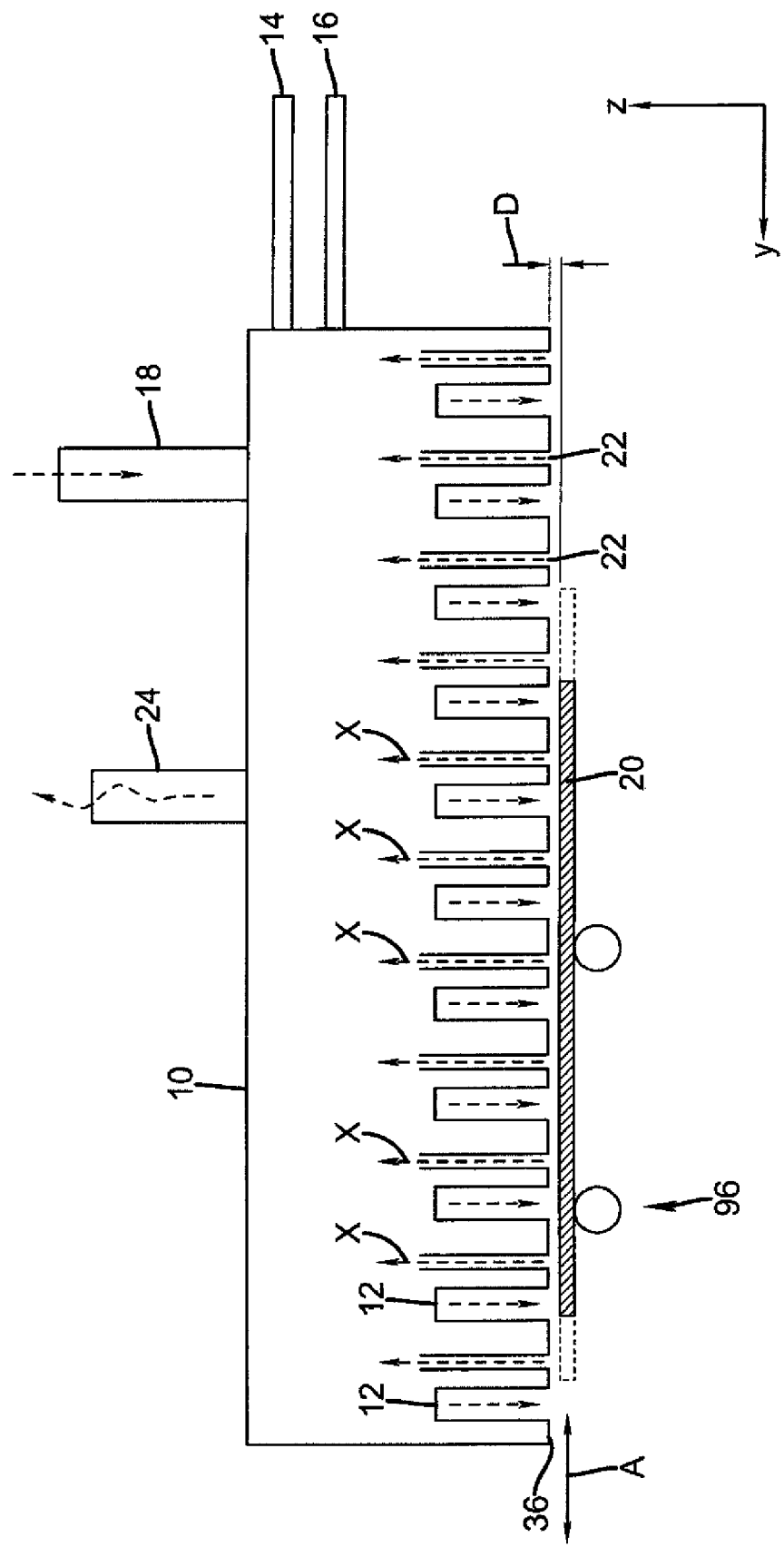
FIG. 1 is a cross-sectional side view of one embodiment of a delivery head for atomic layer deposition according to the present invention.

Referring to FIG. 1, there is shown a cross-sectional side view of one embodiment of a delivery head 10 for atomic layer deposition onto a substrate 20 according to the present invention. Delivery head 10 has a gas inlet conduit 14 that serves as an inlet port for accepting a first gaseous material, a gas inlet conduit 16 for an inlet port that accepts a second gaseous material, and a gas inlet conduit 18 for an inlet port that accepts a third gaseous material. These gases are emitted at a depositing output face 36 via output channels 12, having a structural arrangement that may include a diffuser, as described subsequently. The dashed line arrows in FIG. 1 and subsequent FIGS. 2-3B refer to the delivery of gases to substrate 20 from delivery head 10. In FIG. 1, dotted line arrows also indicate paths for gas exhaust (shown directed upwards in this figure) and exhaust channels 22, in communication with an exhaust conduit 24 that provides an exhaust port. For simplicity of description, gas exhaust is not indicated in FIGS. 2-3B. Because the exhaust gases still may contain quantities of unreacted precursors, it may be undesirable to allow an exhaust flow predominantly containing one reactive species to mix with one predominantly containing another species. As such, it is recognized that the delivery head 10 may contain several independent exhaust ports.

In one embodiment, gas inlet conduits 14 and 16 are adapted to accept first and second gases that react sequentially on the substrate surface to effect ALD deposition, and gas inlet conduit 18 receives a purge gas that is inert with respect to the first and second gases. Delivery head 10 is spaced a distance D from substrate 20, which may be provided on a substrate support, as described in more detail subsequently. Reciprocating motion can be provided between substrate 20 and delivery head 10, either by movement of substrate 20, by movement of delivery head 10, or by movement of both substrate 20 and delivery head 10. In the particular embodiment shown in FIG. 1, substrate 20 is moved by a substrate support 96 across depositing output face 36 in reciprocating fashion, as indicated by the arrow A and by phantom outlines to the right and left of substrate 20 in FIG. 1. It should be noted that reciprocating motion is not always required for thin-film deposition using delivery head 10. Other types of relative motion between substrate 20 and delivery head 10 could also be provided, such as movement of either substrate 20 or delivery head 10 in one or more directions, as described in more detail subsequently.

Figure 2:
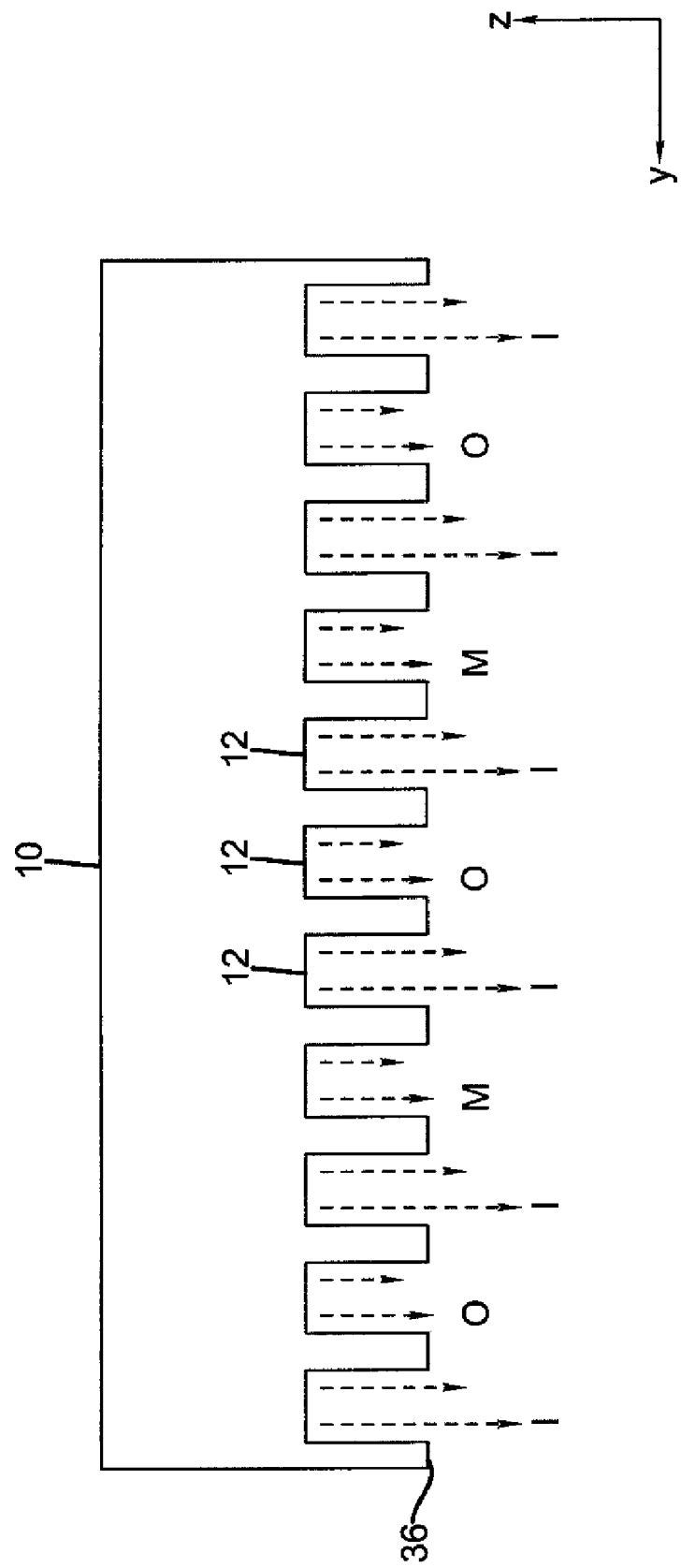
FIG. 2 is a cross-sectional side view of one embodiment of a delivery head showing one exemplary arrangement of gaseous materials provided to a substrate that is subject to thin film deposition.

The cross-sectional view of FIG. 2 shows gas flows emitted over a portion of depositing output face 36 of delivery head 10 (with the exhaust path omitted as noted earlier). In this particular arrangement, each output channel 12 is in gaseous flow communication with one of gas inlet conduits 14, 16 or 18 seen in FIG. 1. Each output channel 12 delivers typically a first reactant gaseous material O, or a second reactant gaseous material M, or a third inert gaseous material I.

FIG. 2 shows a relatively basic or simple arrangement of gases. It is envisioned that a plurality of non-metal deposition precursors (like material O) or a plurality of metal-containing precursor materials (like material M) may be delivered sequentially at various ports in a thin-film single deposition. Alternately, a mixture of reactant gases, for example, a mixture of metal precursor materials or a mixture of metal and non-metal precursors may be applied at a single output channel when making complex thin film materials, for example, having alternate layers of metals or having lesser amounts of dopants admixed in a metal oxide material. Significantly, an inter-stream labeled I for an inert gas, also termed a purge gas, separates any reactant channels in which the gases are likely to react with each other. First and second reactant gaseous materials O and M react with each other to effect ALD deposition, but neither reactant gaseous material O nor M reacts with inert gaseous material I. The nomenclature used in FIG. 2 and following suggests some typical types of reactant gases. For example, first reactant gaseous material O could be an oxidizing gaseous material; second reactant gaseous material M would be a metal-containing compound, such as a material containing zinc. Inert gaseous material I could be nitrogen, argon, helium, or other gases commonly used as purge gases in ALD systems. Inert gaseous material I is inert with respect to first or second reactant gaseous materials O and M. Reaction between first and second reactant gaseous materials would form a metal oxide or other binary compound, such as zinc oxide ZnO or ZnS, used in semiconductors, in one embodiment. Reactions between more than two reactant gaseous materials could form a ternary compound, for example, ZnAlO.

Figure 3B:
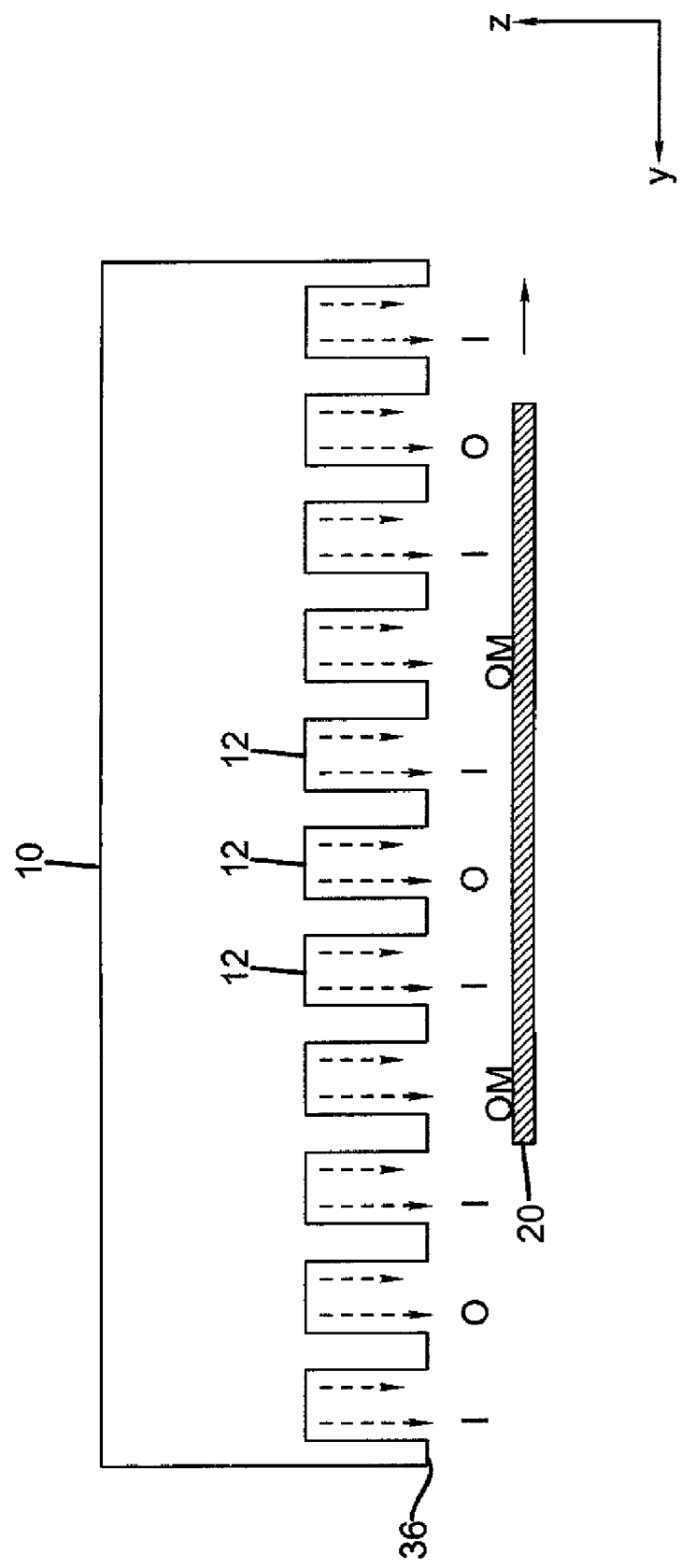

The cross-sectional views of FIGS. 3A and 3B show, in simplified schematic form, the ALD coating operation performed as substrate 20 passes along depositing output face 36 of delivery head 10 when delivering reactant gaseous materials O and M. In FIG. 3A, the surface of substrate 20 first receives an oxidizing material continuously emitted from output channels 12 designated as delivering first reactant gaseous material O. The surface of the substrate now contains a partially reacted form of material O, which is susceptible to reaction with material M. Then, as substrate 20 passes into the path of the metal compound of second reactant gaseous material M, the reaction with M takes place, forming a metallic oxide or some other thin film material that can be formed from two reactant gaseous materials. Unlike conventional solutions, the deposition sequence shown in FIGS. 3A and 3B is continuous during deposition for a given substrate or specified area thereof, rather than pulsed. That is, materials O and M are continuously emitted as substrate 20 passes across the surface of delivery head 10 or, conversely, as delivery head 10 passes along the surface of substrate 20.

As FIGS. 3A and 3B show, inert gaseous material I is provided in alternate output channels 12, between the flows of first and second reactant gaseous materials O and M. Notably, as was shown in FIG. 1, there are exhaust channels 22, but preferably no vacuum channels interspersed between the output channels 12. Only exhaust channels 22, providing a small amount of draw, are needed to vent spent gases emitted from delivery head 10 and used in processing.

One aspect of operation for delivery head 10 relates to its providing gas pressure against substrate 20, such that separation distance D is maintained, at least in part, by the force of pressure that is exerted. By maintaining some amount of gas pressure between depositing output face 36 and the surface of substrate 20, the apparatus of the present invention provides at least some portion of an air bearing, or more properly a gas fluid bearing, for delivery head 10 itself or, alternately, for substrate 20. This arrangement helps to simplify the transport requirements for delivery head 10, as described subsequently. Importantly, the effect of allowing the delivery head to approach the substrate such that it is supported by gas pressure, helps to provide isolation between the gas streams. By allowing the head to float on these streams, pressure fields are set up in the reactive and purge flow areas that cause the gases to be directed from inlet to exhaust with little or no intermixing of other gas streams.

In one embodiment, since the separation distance D is relatively small, even a small change in distance D (for example, even 100 micrometers) would require a significant change in flow rates and consequently gas pressure providing the separation distance D. For example, in one embodiment, doubling the separation distance D, involving a change less than 1 mm, would necessitate more than doubling, preferably more than quadrupling, the flow rate of the gases providing the separation distance D. As a general principle, it is considered more advantageous in practice to minimize separation distance D and, consequently, to operate at reduced flow rates.

Figure 4:
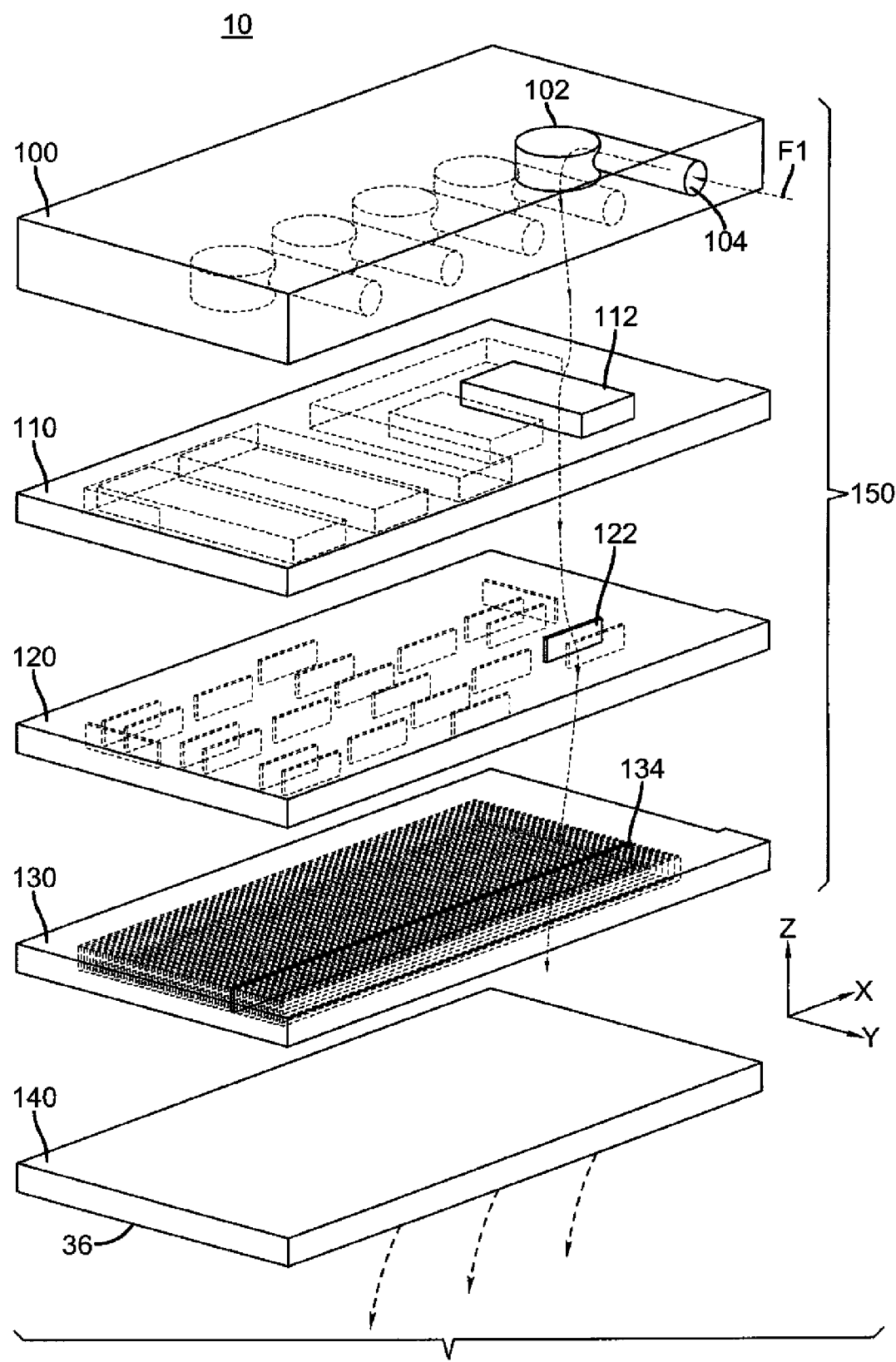
FIG. 4 is a perspective exploded view of a delivery head in a deposition system according to one embodiment.

The exploded view of FIG. 4 shows, for a small portion of the overall assembly in one embodiment, how delivery head 10 can be constructed from a set of apertured plates and shows an exemplary gas flow path for just one portion of one of the gases. A connection plate 100 for the delivery head 10 has a series of input ports 104 for connection to gas supplies that are upstream of delivery head 10 and not shown in FIG. 4. Each input port 104 is in communication with a directing chamber 102 that directs the received gas downstream to a gas chamber plate 110. Gas chamber plate 110 has a supply chamber 112 that is in gas flow communication with an individual directing channel 122 on a gas direction plate 120. From directing channel 122, the gas flow proceeds to a particular elongated exhaust channel 134 on a base plate 130. A gas diffuser unit 140 provides diffusion and final delivery of the input gas at its depositing output face 36. An exemplary gas flow F1 is traced through each of the component assemblies of delivery head 10. The x-y-z axis orientation shown in FIG. 4 also applies for FIGS. 5A and 7 in the present application.

As shown in the example of FIG. 4, delivery assembly 150 of delivery head 10 is formed as an arrangement of superposed apertured plates: connection plate 100, gas chamber plate 110, gas direction plate 120, and base plate 130. These plates are disposed substantially in parallel to depositing output face 36 in this "horizontal" embodiment. Gas diffuser unit 140 can also be formed from superposed apertured plates, as is described subsequently. It can be appreciated that any of the plates shown in FIG. 4 could itself be fabricated from a stack of superposed plates. For example, it may be advantageous to form connection plate 100 from four or five stacked apertured plates that are suitably coupled together. This type of arrangement can be less complex than machining or molding methods for forming directing chambers 102 and input ports 104.

Gas diffuser unit 140 can be used to equalize the flow through the output channel providing the gaseous materials to the substrate. Copending, co-assigned U.S. patent application Ser. No. 11/620,740, entitled "DELIVERY DEVICE FOR DEPOSITION," hereby incorporated by reference, discloses various diffuser systems that optionally can be employed. Other means for diffusing gaseous materials and/or providing desired back pressure can alternatively be provided in the delivery head. Still alternatively, the output channel can be used to provide the gaseous materials without a diffuser, as in U.S. Pat. No. 4,413,022 to Suntola et al., hereby incorporated by reference. By providing undiffused flows, higher throughputs may be obtained, possibly at the expense of less homogenous deposition. On the other hand, a diffuser system is especially advantageous for a floating head system described above, since it can provide a back pressure within the delivery device that facilitates the floating of the head.

Figure 5A:
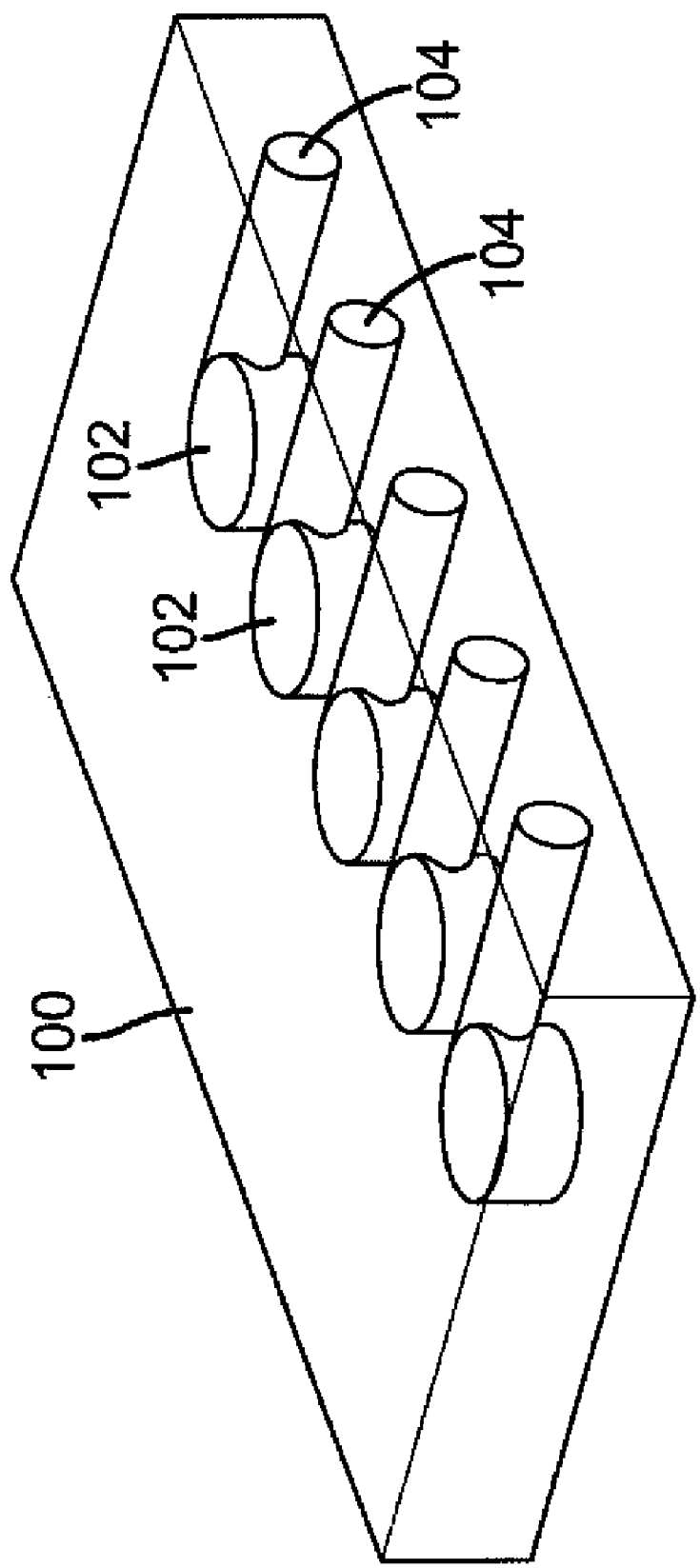
FIG. 5A is a perspective view of a connection plate for the delivery head of FIG. 4.
Figure 5B:
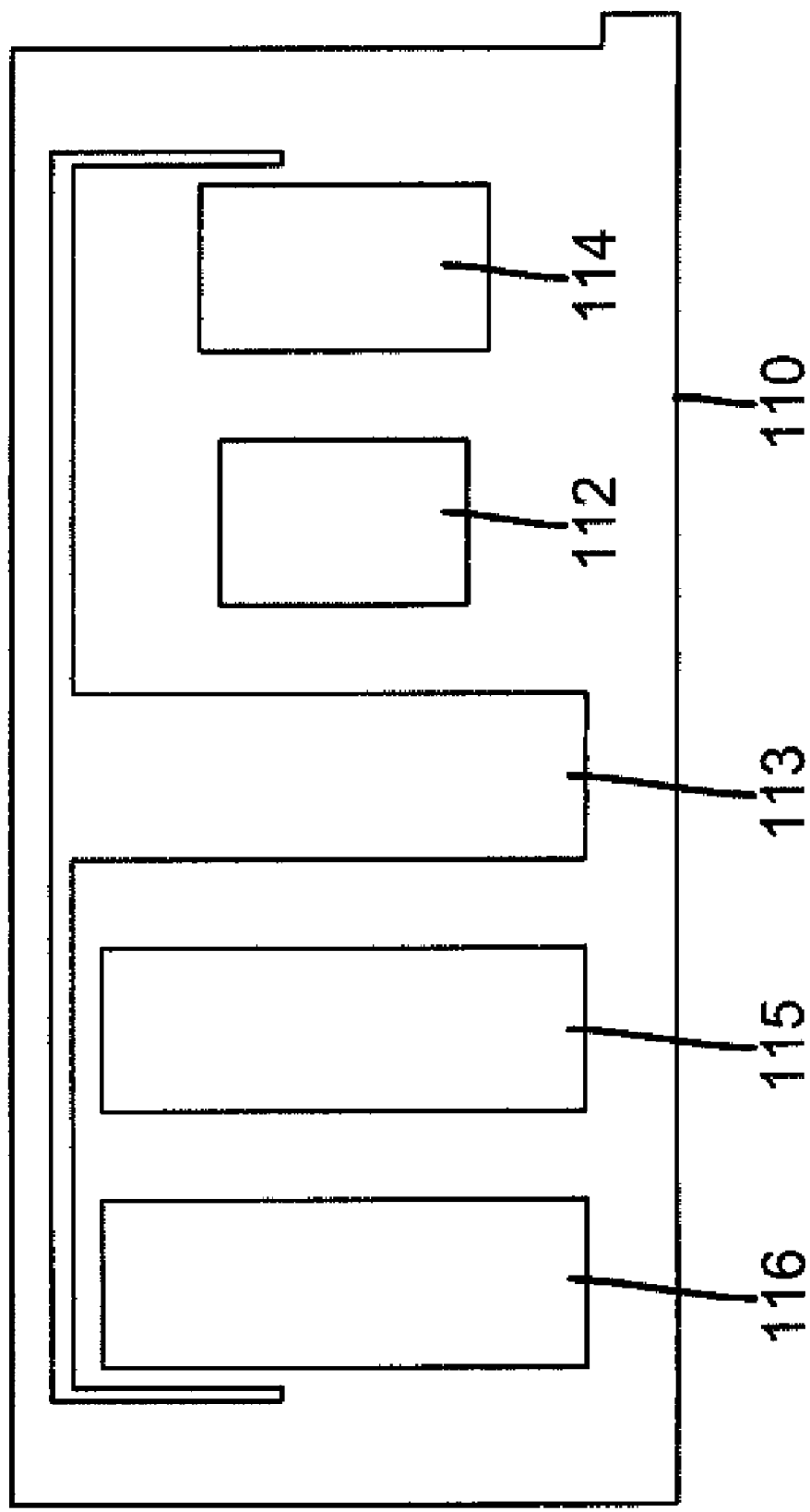
FIG. 5B is a plan view of a gas chamber plate for the delivery head of FIG. 4.

FIGS. 5A through 5D show each of the major components that are combined together to form delivery head 10 in the embodiment of FIG. 4. FIG. 5A is a perspective view of connection plate 100, showing multiple directing chambers 102. FIG. 5B is a plan view of gas chamber plate 110. A supply chamber 113 is used for purge or inert gas for delivery head 10 in one embodiment. A supply chamber 115 provides mixing for a precursor gas (O) in one embodiment; an exhaust chamber 116 provides an exhaust path for this reactive gas. Similarly, a supply chamber 112 provides the other needed reactive gas, metallic precursor gas (M); an exhaust chamber 114 provides an exhaust path for this gas.

Figure 5C:
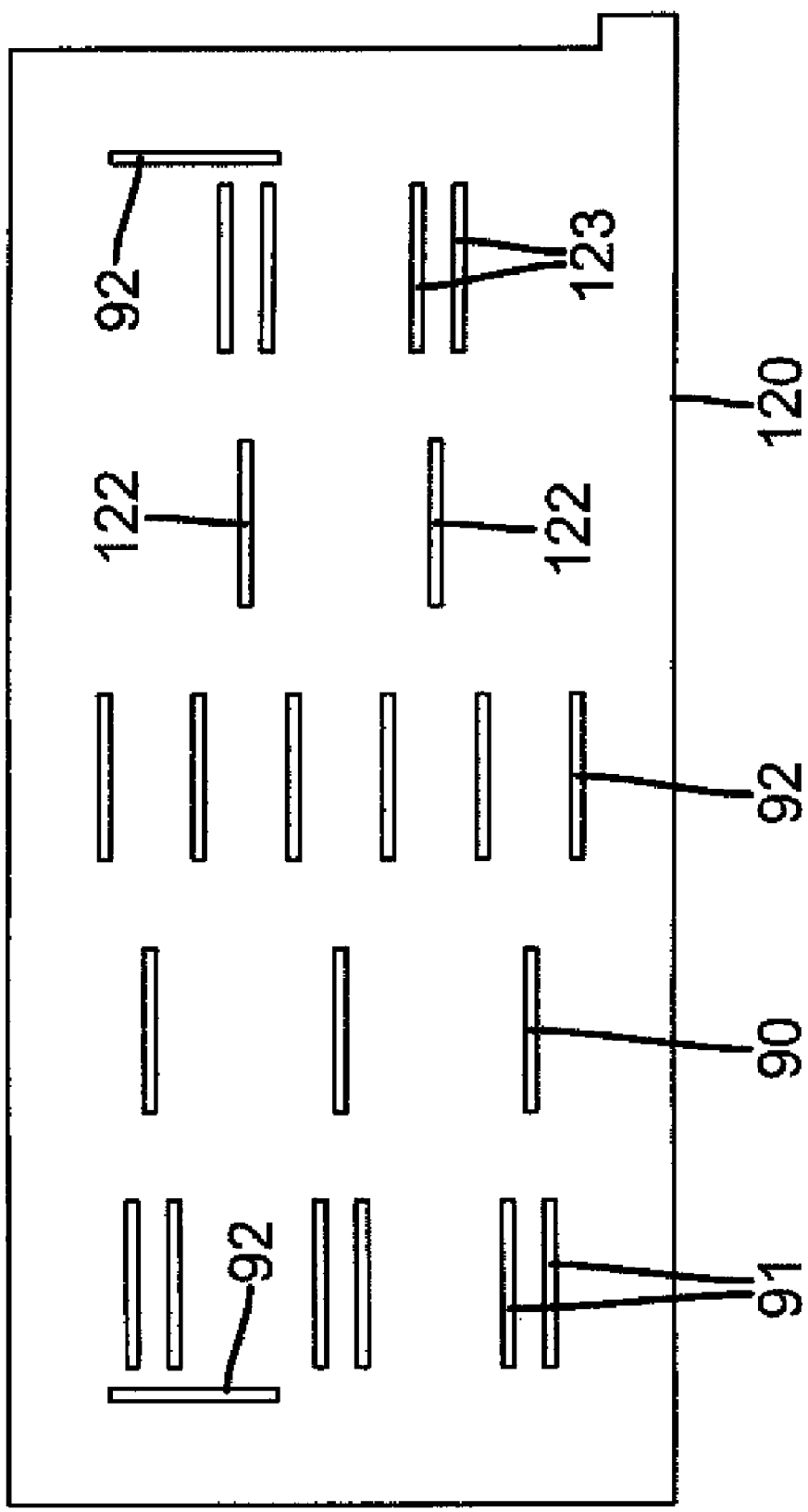
FIG. 5C is a plan view of a gas direction plate for the delivery head of FIG. 4.

FIG. 5C is a plan view of gas direction plate 120 for delivery head 10 in this embodiment. Multiple directing channels 122, providing a metallic precursor material (M), are arranged in a pattern for connecting the appropriate supply chamber 112 (not shown in this view) with base plate 130. Corresponding exhaust directing channels 123 are positioned near directing channels 122. Directing channels 90 provide the other precursor material (O) and have corresponding exhaust directing channels 91. Directing channels 92 provide purge gas (I). Again, it must be emphasized that FIGS. 4 and 5A-5D show one illustrative embodiment; numerous other embodiments are also possible.

Figure 5D:
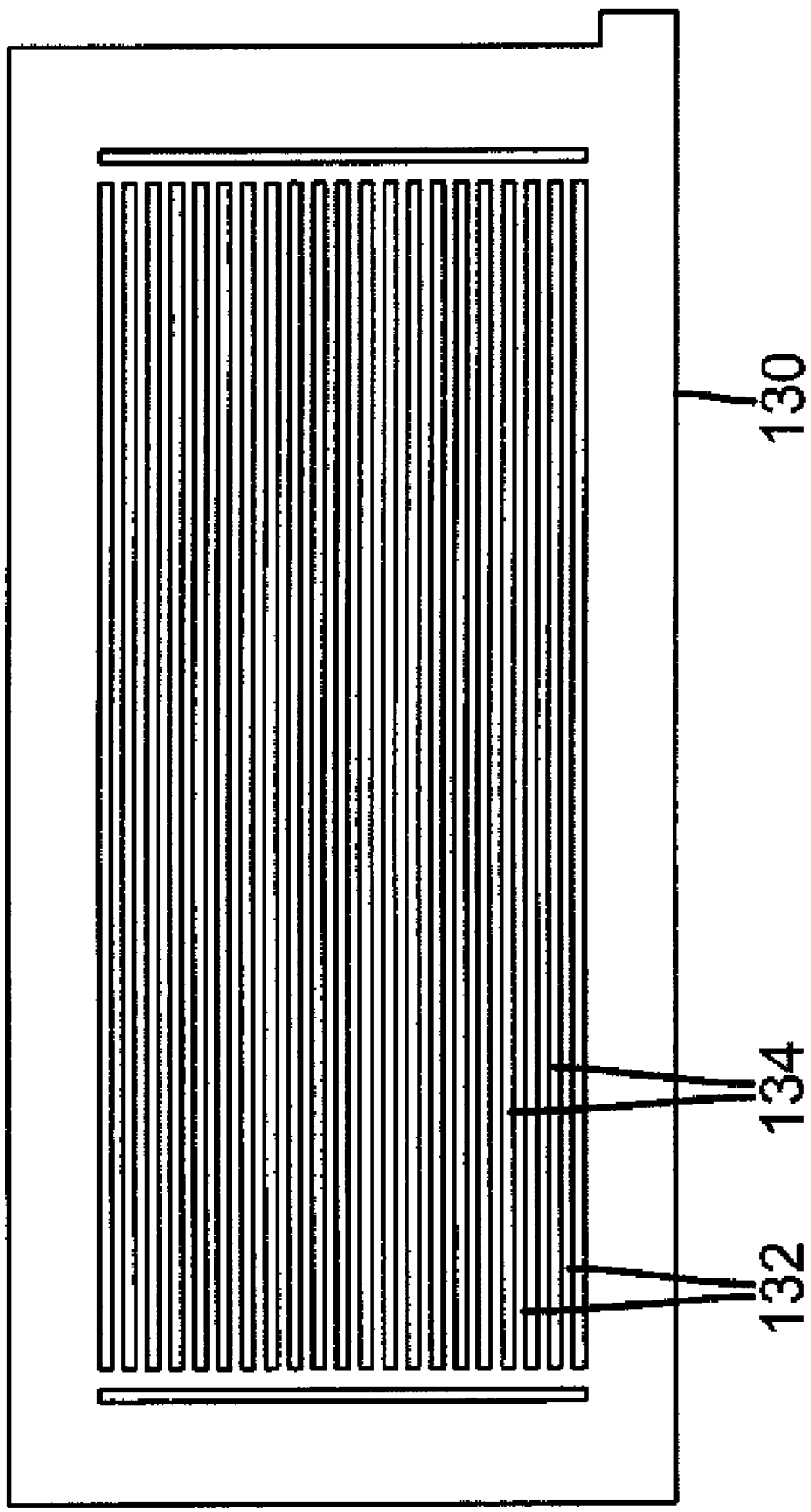
FIG. 5D is a plan view of a base plate for the delivery head of FIG. 4.

FIG. 5D is a plan view of base plate 130 for delivery head 10. Base plate 130 has multiple elongated emissive channels 132 interleaved with exhaust channels 134.

Figure 6:
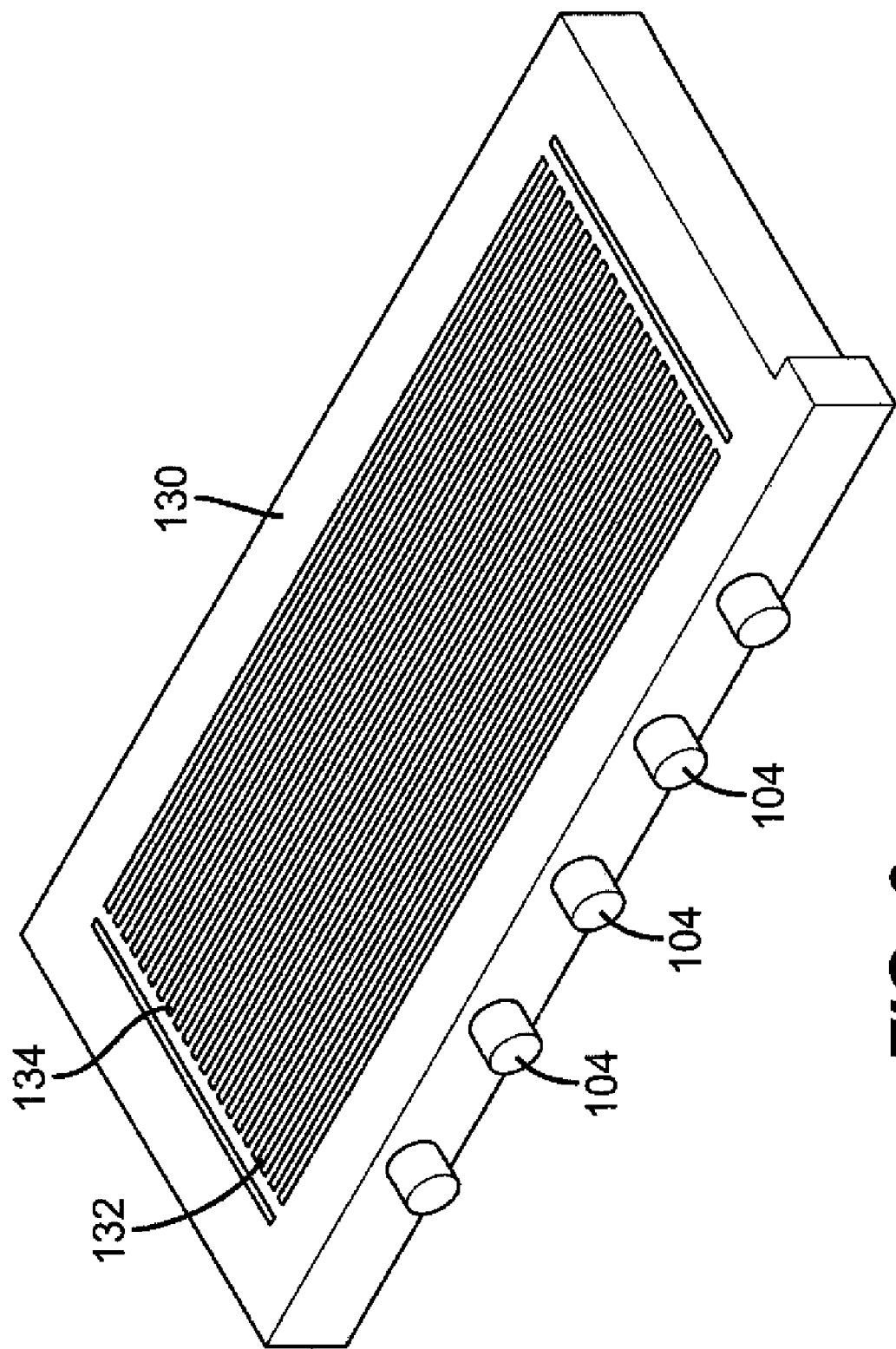
FIG. 6 is a perspective view showing a base plate on a delivery head in one embodiment.

FIG. 6 is a perspective view showing base plate 130 formed from horizontal plates and showing input ports 104. The perspective view of FIG. 6 shows the external surface of base plate 130 as viewed from the output side and having elongated emissive channels 132 and elongated exhaust channels 134. With reference to FIG. 4, the view of FIG. 6 is taken from the side that faces gas diffuser unit 140.

Figure 7:
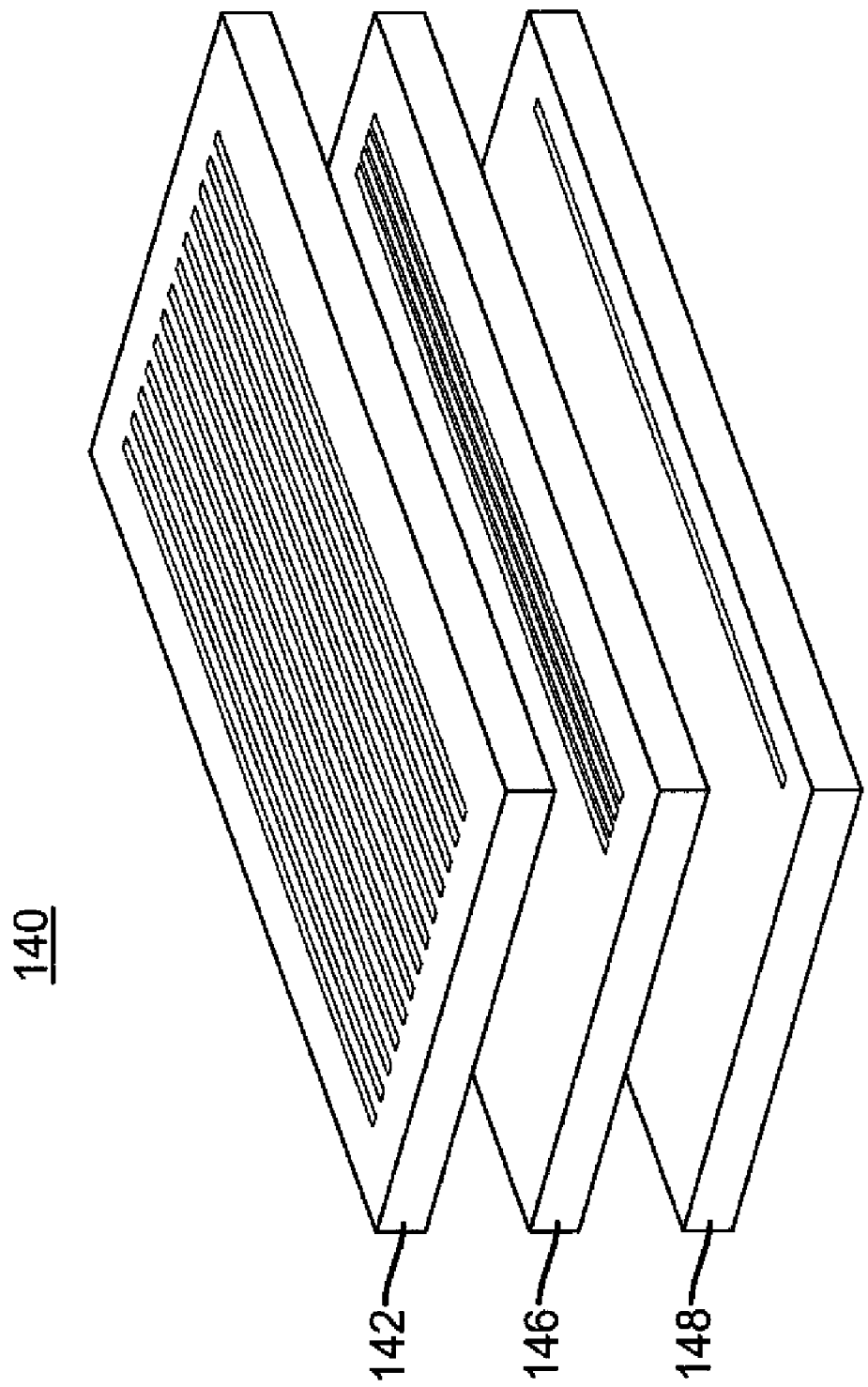
FIG. 7 is an exploded view of a gas diffuser unit according to one embodiment.
Figure 8A:
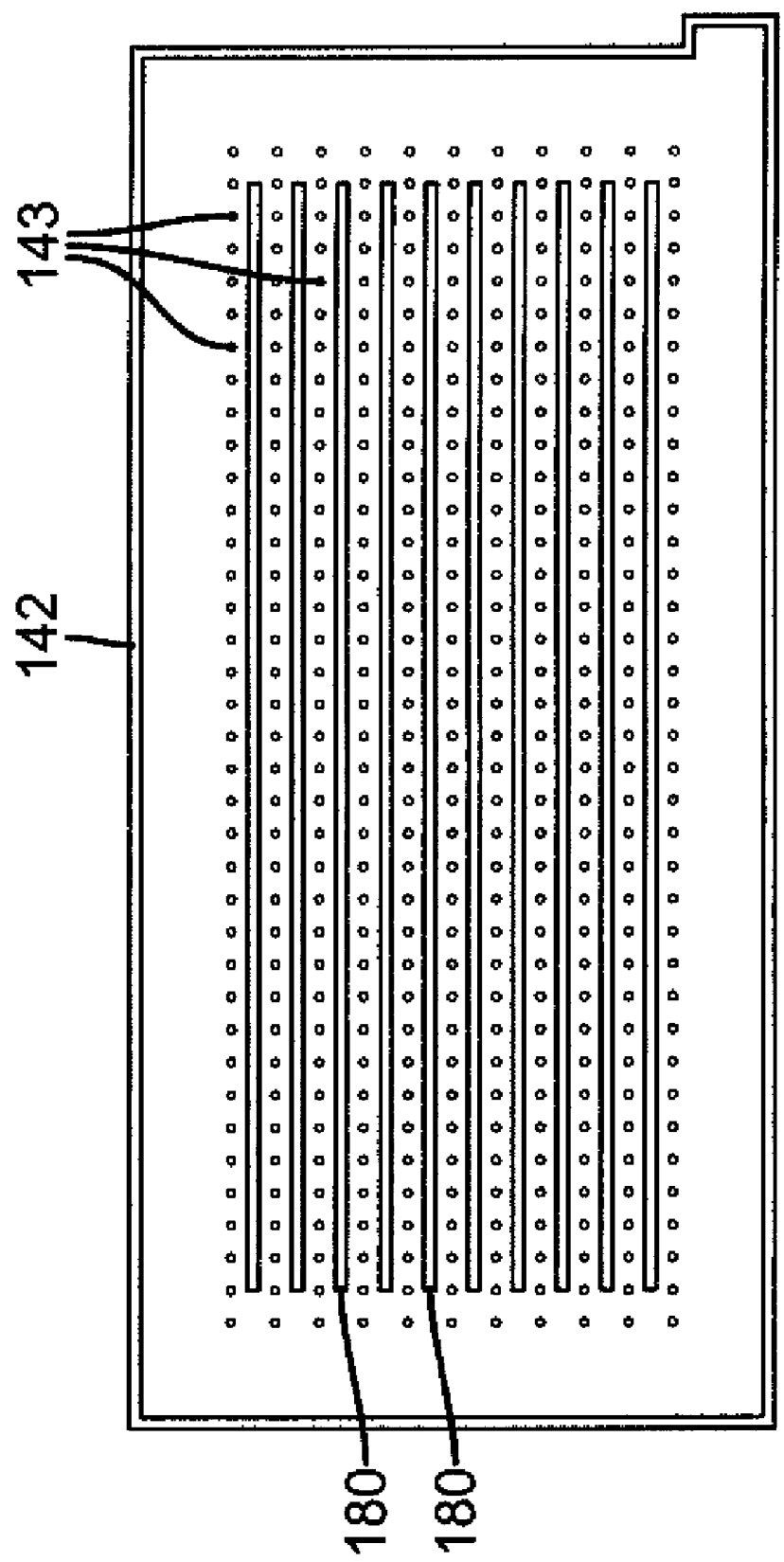
FIG. 8A is a plan view of a nozzle plate of the gas diffuser unit of FIG. 7.

The exploded view of FIG. 7 shows the basic arrangement of components used to form one embodiment of an optional gas diffuser unit 140, as used in the embodiment of FIG. 4 and in other embodiments as described subsequently. These include a nozzle plate 142, shown in the plan view of FIG. 8A. As shown in the views of FIGS. 6, 7, and 8A, nozzle plate 142 mounts against base plate 130 and obtains its gas flows from elongated emissive channels 132. In the embodiment shown, output passages 143 provide the needed gaseous materials. Sequential first exhaust slots 180 are provided in the exhaust path, as described subsequently.

Figure 8B:
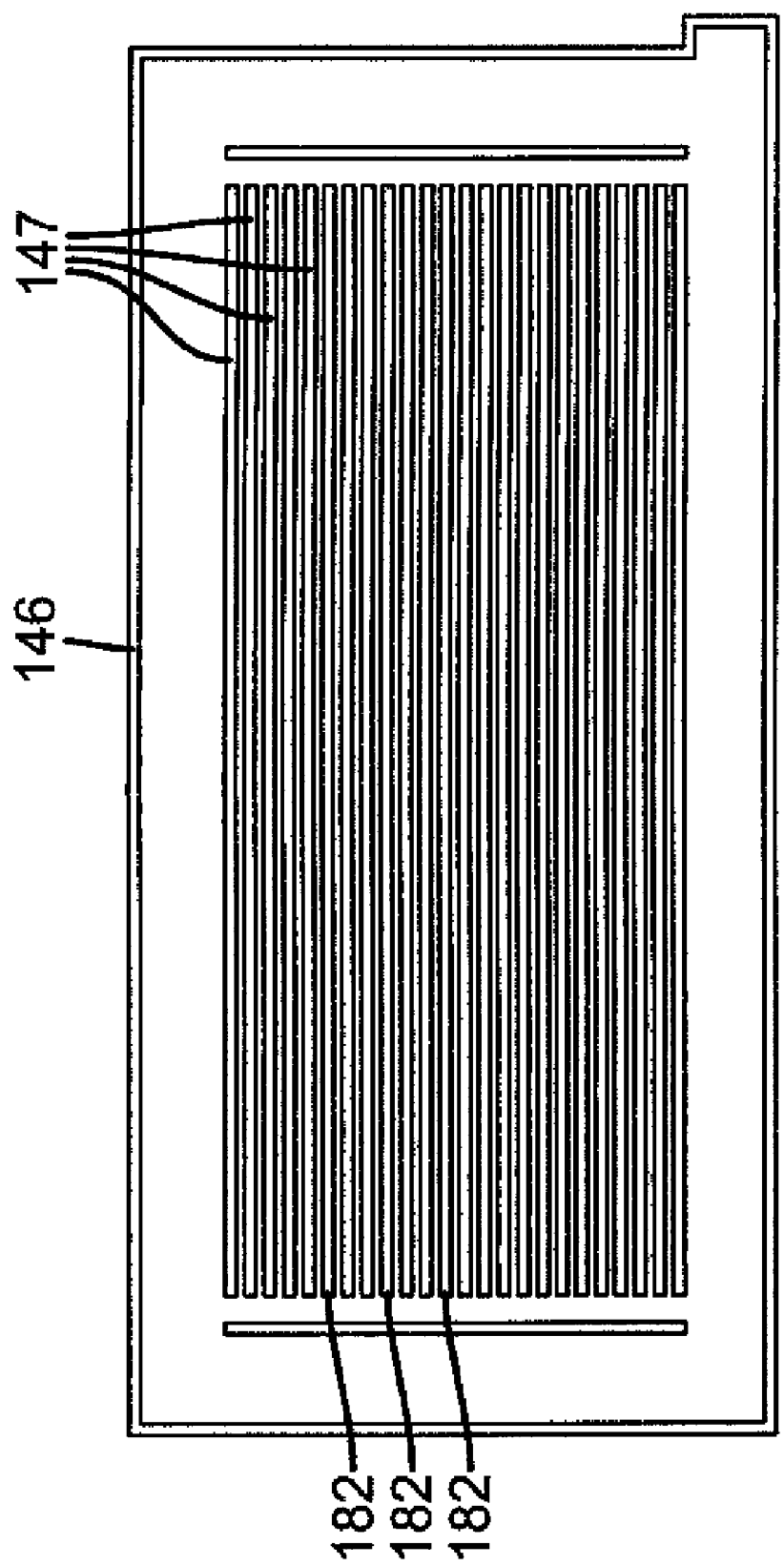
FIG. 8B is a plan view of a gas diffuser plate of the gas diffuser unit of FIG. 7.

Referring to FIG. 8B, a gas diffuser plate 146, which diffuses in cooperation with plates 142 and 148 (shown in FIG. 7), is mounted against nozzle plate 142. The arrangement of the various passages on nozzle plate 142, gas diffuser plate 146, and face plate 148 are optimized to provide the needed amount of diffusion for the gas flow and, at the same time, to efficiently direct exhaust gases away from the surface area of substrate 20. Slots 182 provide exhaust ports. In the embodiment shown, gas supply slots forming second diffuser output passages 147 and exhaust slots 182 alternate in gas diffuser plate 146.

Figure 8C:
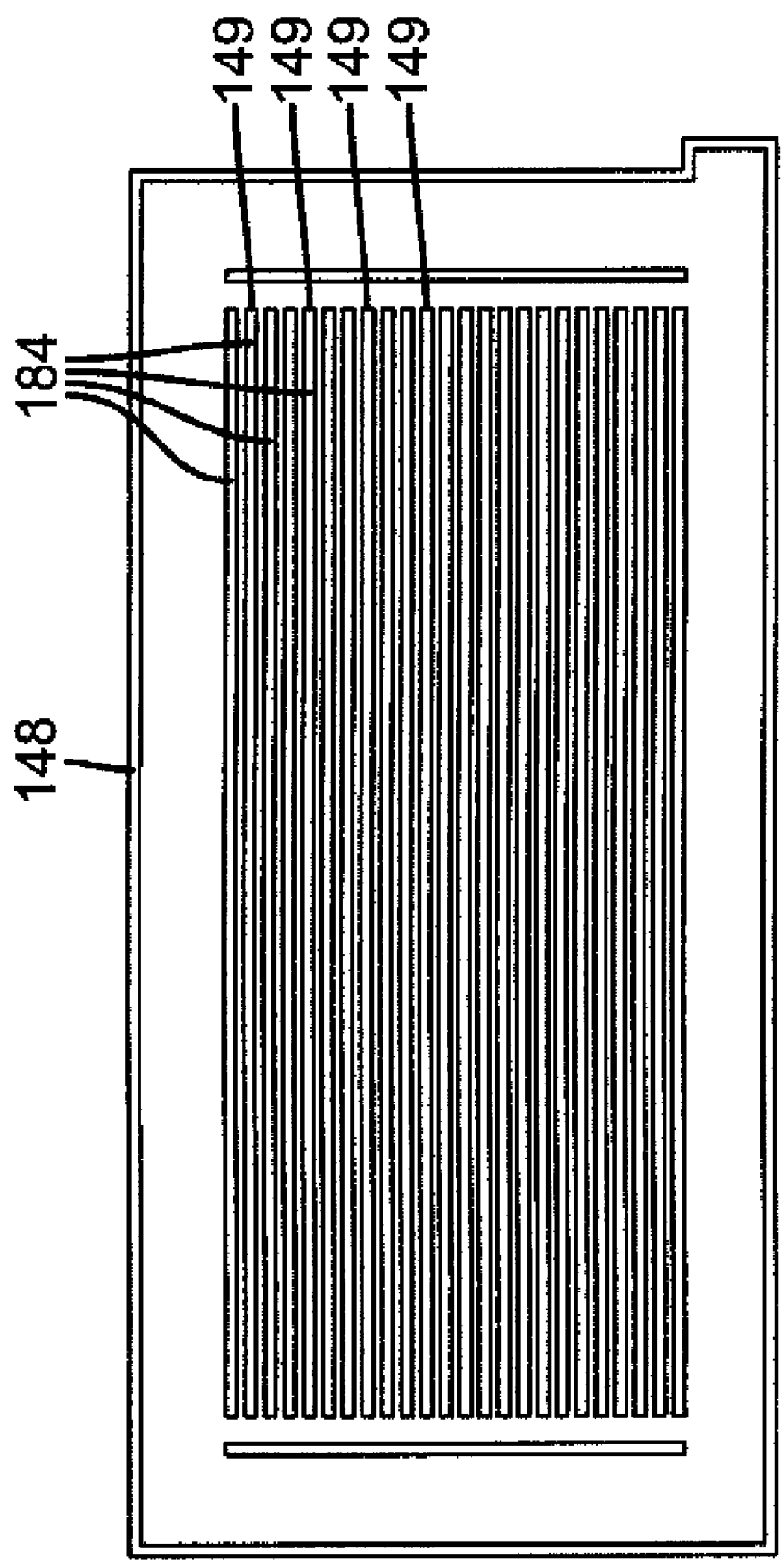
FIG. 8C is a plan view of a face plate of the gas diffuser unit of FIG. 7.

A face plate 148, as shown in FIG. 8C, then faces substrate 20. Third diffuser output passages 149 for providing gases and exhaust slots 184 again alternate with this embodiment.

Figure 8D:
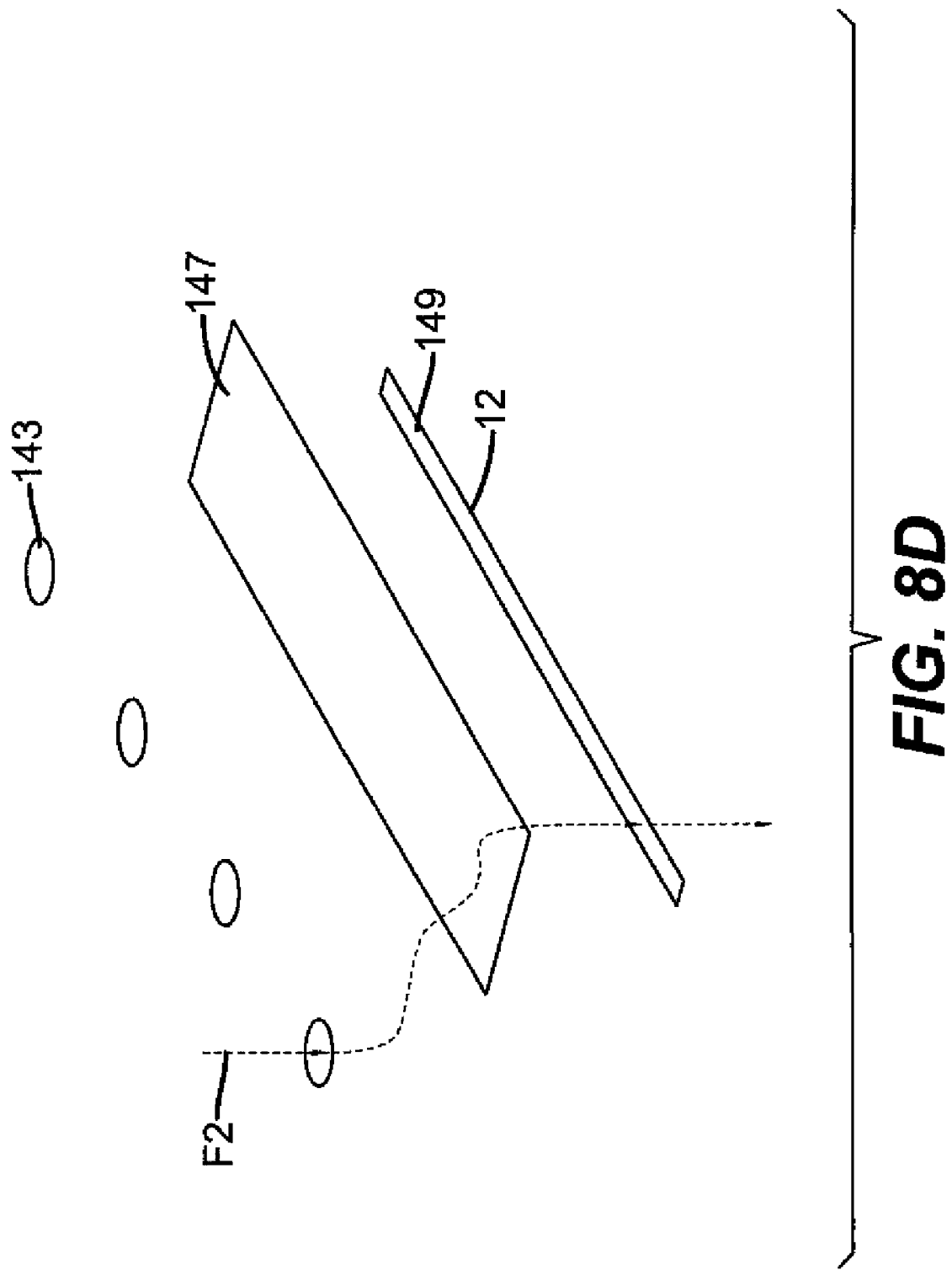
FIG. 8D is a perspective view of gas mixing within the gas diffuser unit of FIG. 7.
Figure 8E:
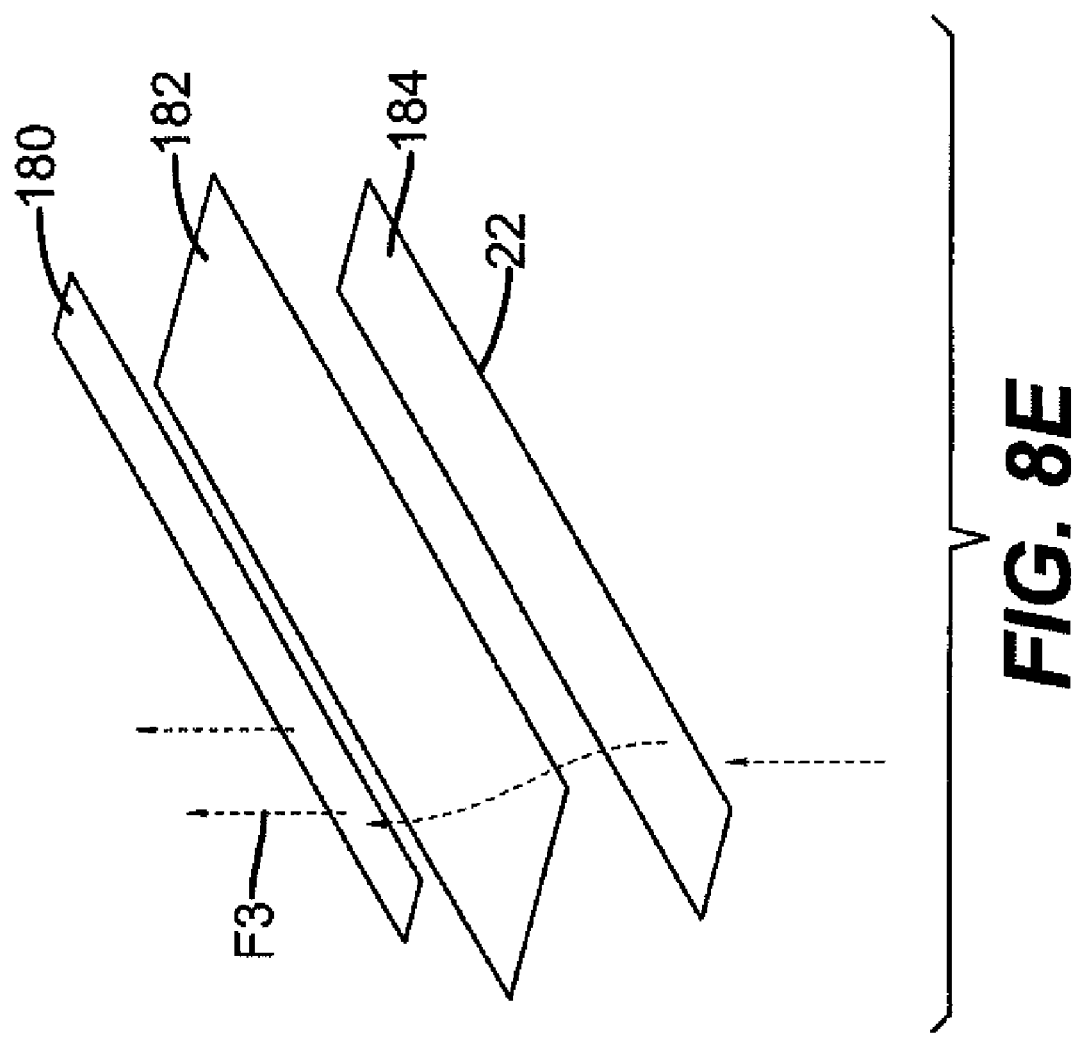
FIG. 8E is a perspective view of the gas ventilation path using the gas diffuser unit of FIG. 7.

FIG. 8D focuses on the gas delivery path through gas diffuser unit 140; FIG. 8E then shows the gas exhaust path in a corresponding manner. Referring to FIG. 8D there is shown, for a representative set of gas ports, the overall arrangement used for thorough diffusion of the reactant gas for an output flow F2 in one embodiment. The gas from base plate 130 (FIG. 4) is provided through first output passage 143 on nozzle plate 142. The gas goes downstream to a second diffuser output passage 147 on gas diffuser plate 146. As shown in FIG. 308D, there can be a vertical offset (that is, using the horizontal plate arrangement shown in FIG. 7, vertical being normal with respect to the plane of the horizontal plates) between passages 143 and 147 in one embodiment, helping to generate backpressure and thus facilitate a more uniform flow. The gas then goes farther downstream to a third diffuser output passage 149 on face plate 148. The different output passages 143, 147 and 149 may not only be spatially offset, but may also have different geometries to optimize mixing.

In the absence of the optional diffuser unit, the elongated emissive channels 132 in the base plate can serve as the output channels 12 for delivery head 10 instead of the third diffuser output passages 149.

FIG. 8E symbolically traces the exhaust path provided for venting gases in a similar embodiment, where the downstream direction is opposite that for supplied gases. A flow F3 indicates the path of vented gases through sequential third, second and first exhaust slots 184, 182, and 180, respectively. Unlike the more circuitous mixing path of flow F2 for gas supply, the venting arrangement shown in FIG. 8E is intended for the rapid movement of spent gases from the surface. Thus, flow F3 is relatively direct, venting gases away from the substrate surface.

Referring back to FIG. 4, the combination of components shown as connection plate 100, gas chamber plate 110, gas direction plate 120, and base plate 130 can be grouped to provide a delivery assembly 150. Alternate embodiments are possible for delivery assembly 150, including one formed from vertical, rather than horizontal, apertured plates, using the coordinate arrangement and view of FIG. 4.

Figure 9A:
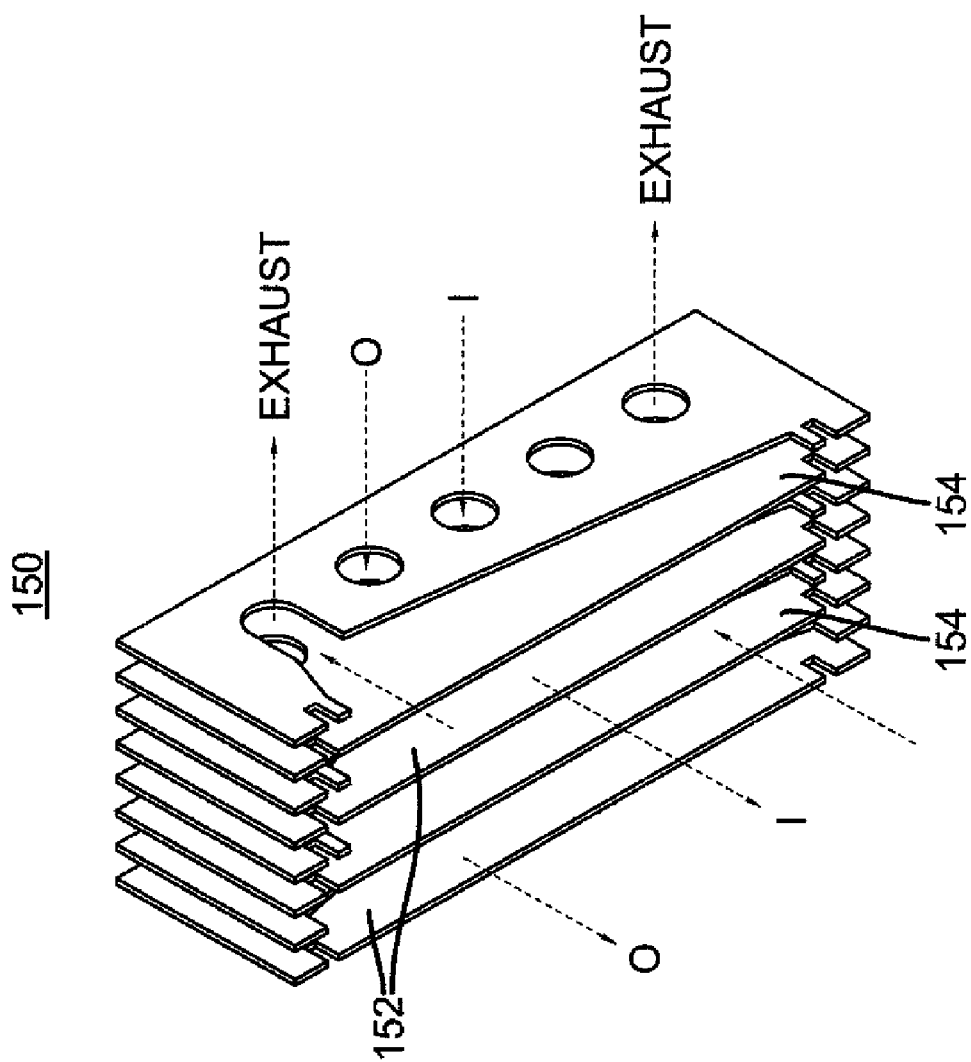
FIG. 9A is a perspective view of a portion of the delivery head in an embodiment using vertically stacked plates.

Referring to FIG. 9A, there is shown, from a bottom view (that is, viewed from the gas emission side) an alternate arrangement that can be used for delivery assembly 150 using a stack of superposed apertured plates that are disposed perpendicularly with respect to depositing output face 36. For simplicity of explanation, the portion of delivery assembly 150 shown in the "vertical embodiment" of FIG. 9A has two elongated emissive channels 152 and two elongated exhaust channels 154. The vertical plates arrangement of FIGS. 9-A through 13C can be readily expanded to provide a number of emissive and exhaust channels. With apertured plates disposed perpendicularly with respect to the plane of depositing output face 36, as in FIGS. 9A and 9B, each elongated emissive channel 152 is formed by having side walls defined by separator plates, shown subsequently in more detail, with a reactant plate centered between them. Proper alignment of apertures then provides fluid communication with the supply of gaseous material.

Figure 9B:
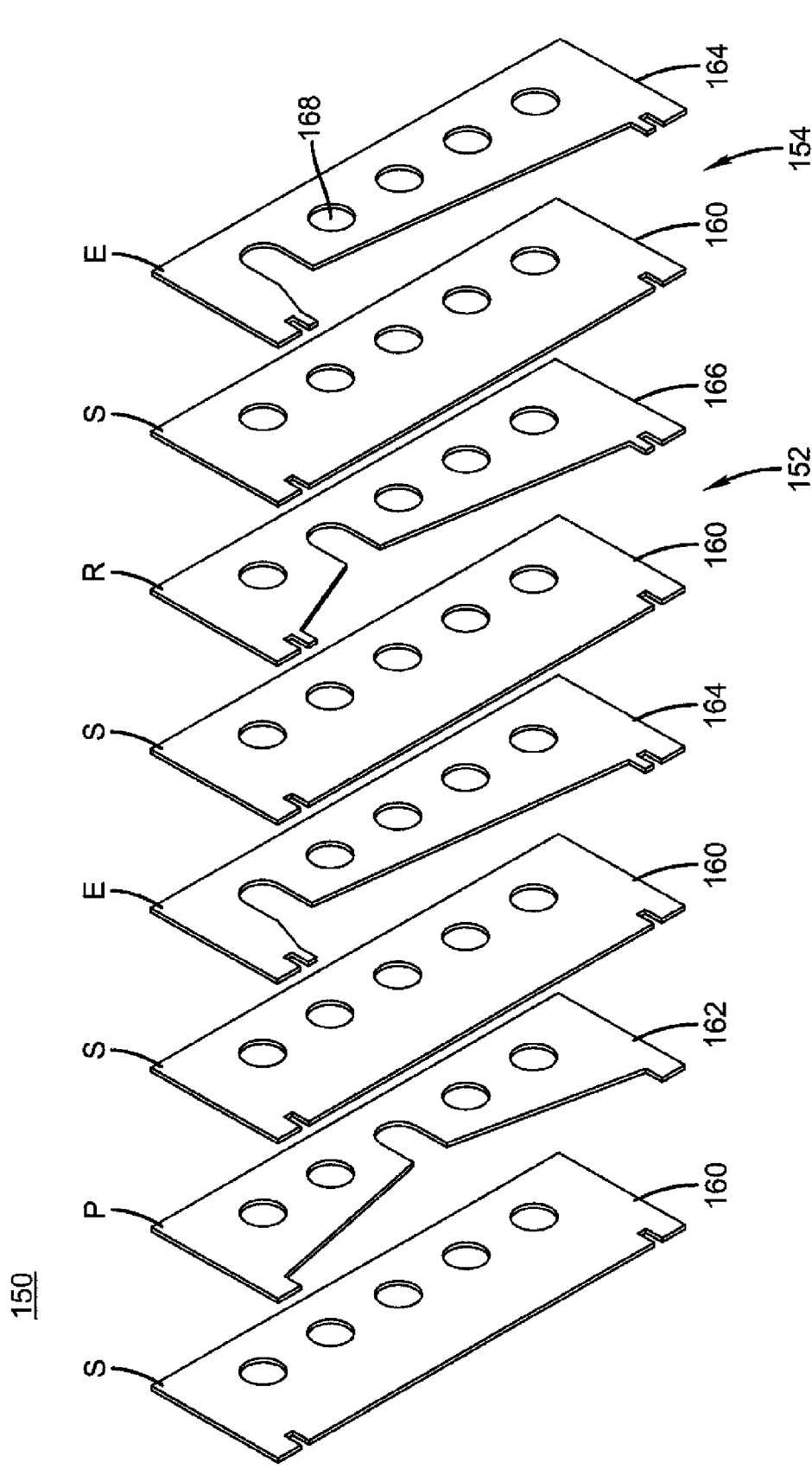
FIG. 9B is an exploded view of the components of the delivery head shown in FIG. 9A.
Figure 9C:
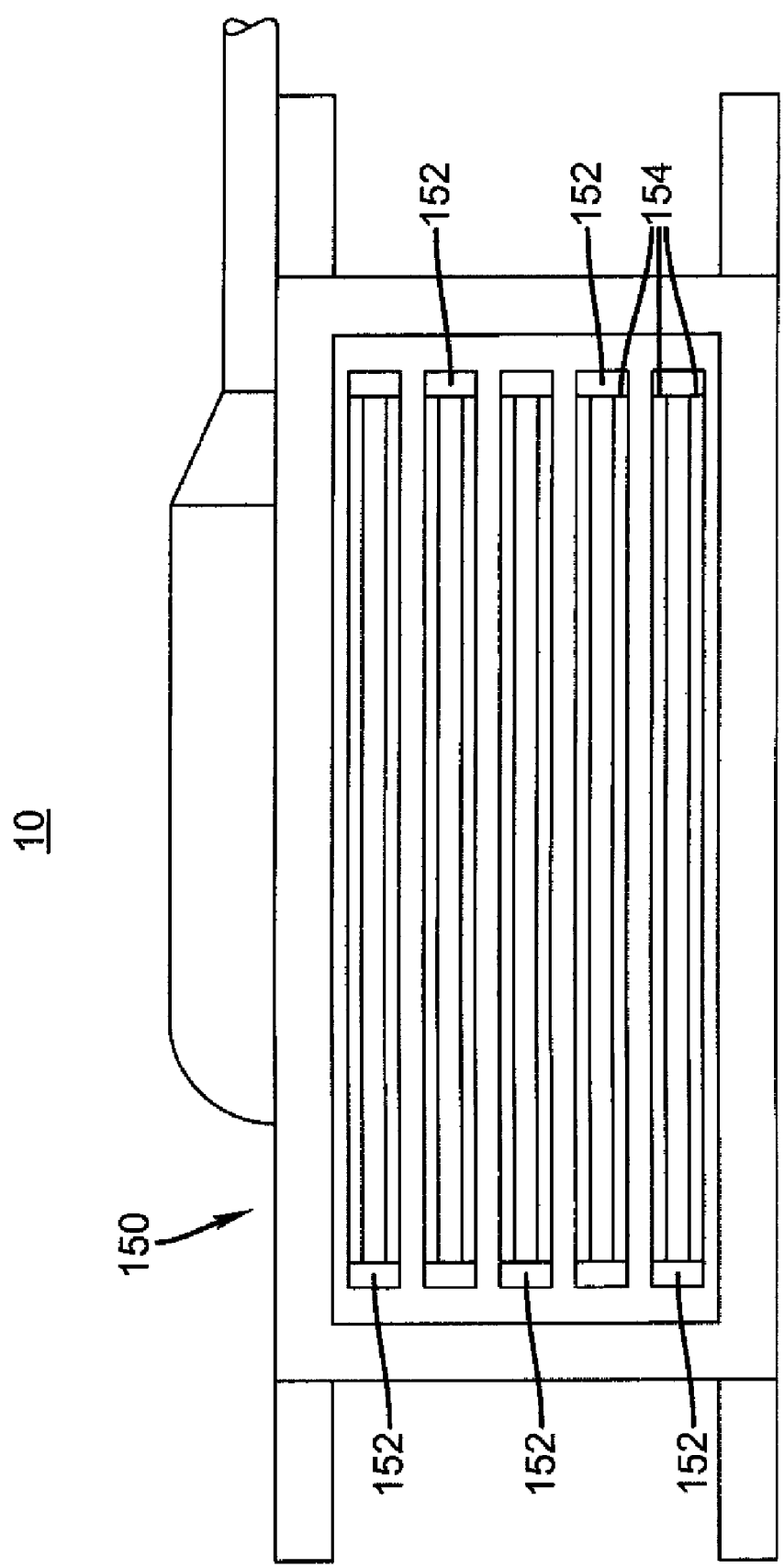
FIG. 9C is a plan view showing a delivery assembly formed using stacked plates.

The exploded view of FIG. 9B shows the arrangement of apertured plates used to form the small section of delivery assembly 150 that is shown in FIG. 9A. FIG. 9C is a plan view showing a delivery assembly 150 having five elongated channels 152 for emitted gases and formed using stacked, apertured plates. FIGS. 10A through 13C then show the various apertured plates in both plan and perspective views. For simplicity, letter designations are given to each type of apertured plate: Separator S, Purge P, Reactant R, and Exhaust E.

Figure 10A:
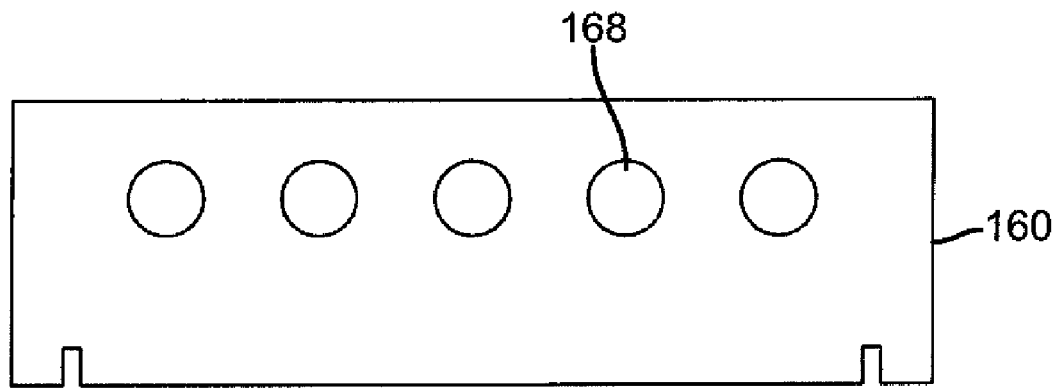
FIGS. 10A and 10B are plan and perspective views, respectively, of a separator plate used in the vertical plate embodiment of FIG. 9A.
Figure 10B:
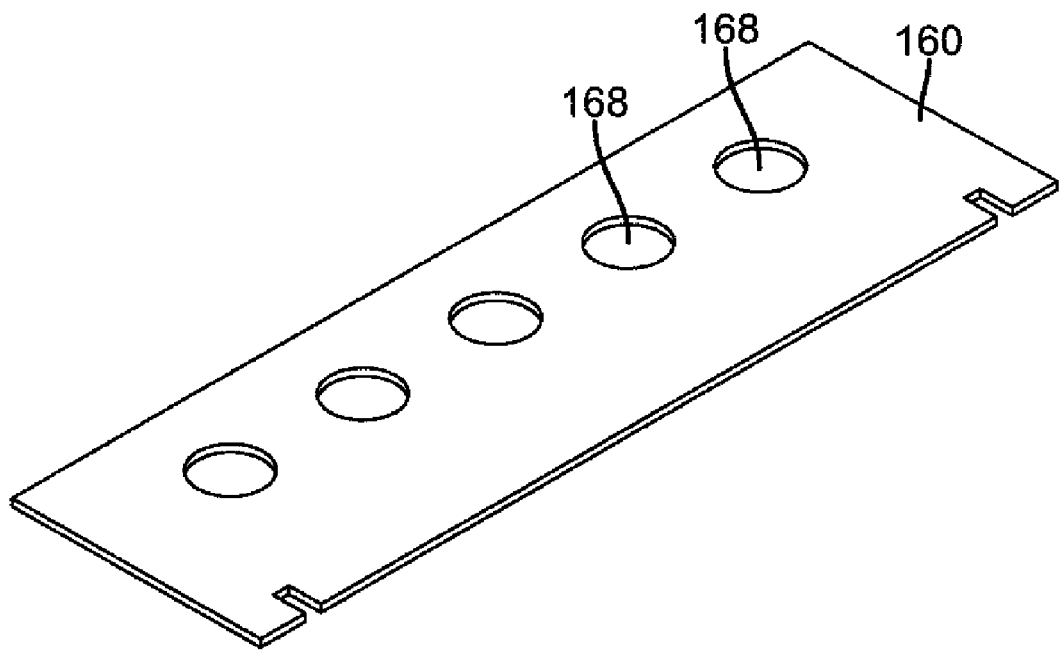
Figure 11A:
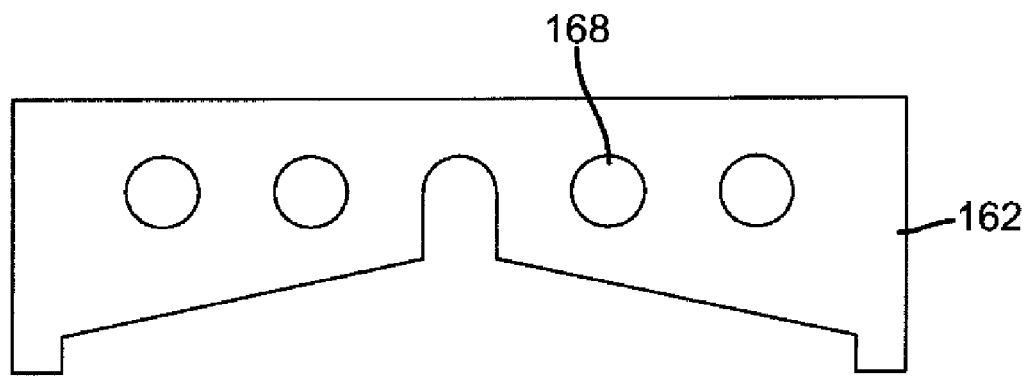
FIGS. 11A and 11B are plan and perspective views, respectively, of a purge plate used in the vertical plate embodiment of FIG. 9A.
Figure 11B:
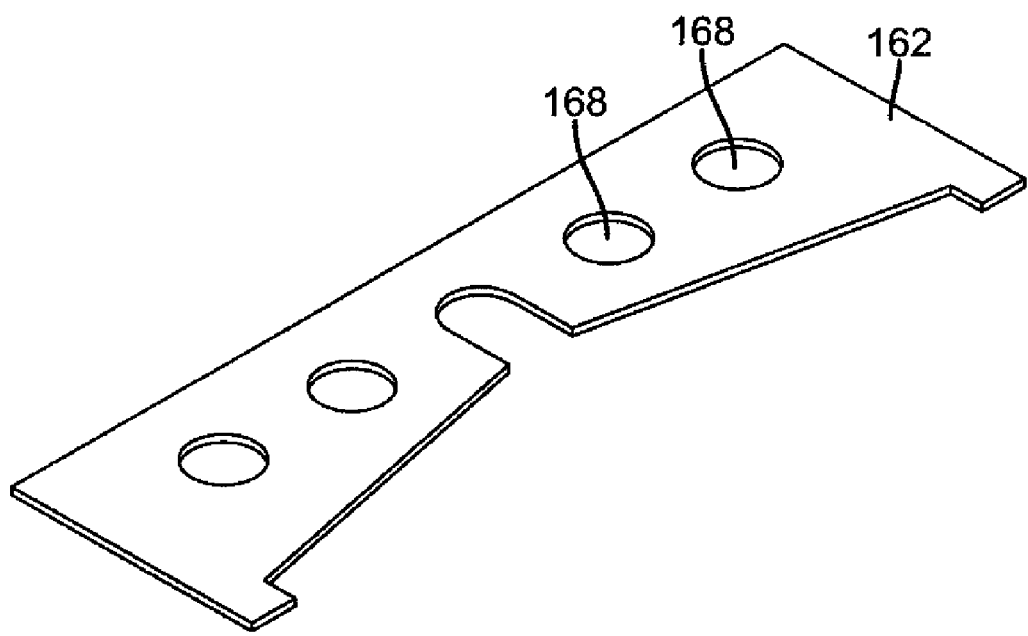
Figure 12A:
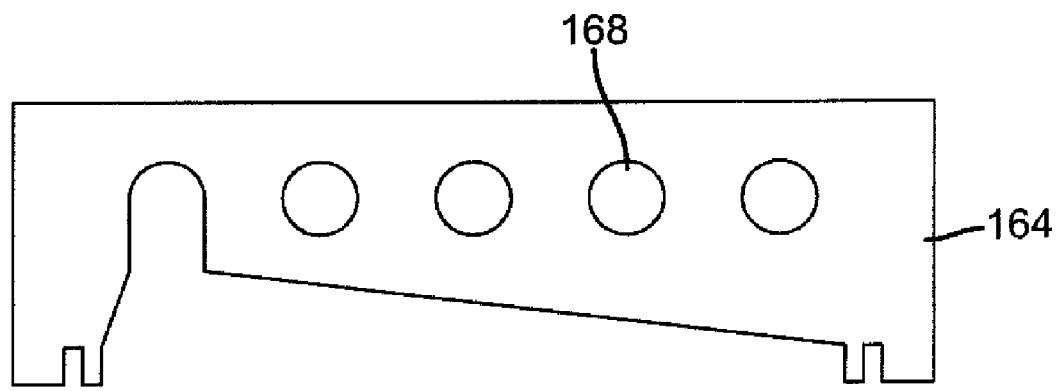
FIGS. 12A and 12B are plan and perspective views, respectively, of an exhaust plate used in the vertical plate embodiment of FIG. 9A.
Figure 12B:
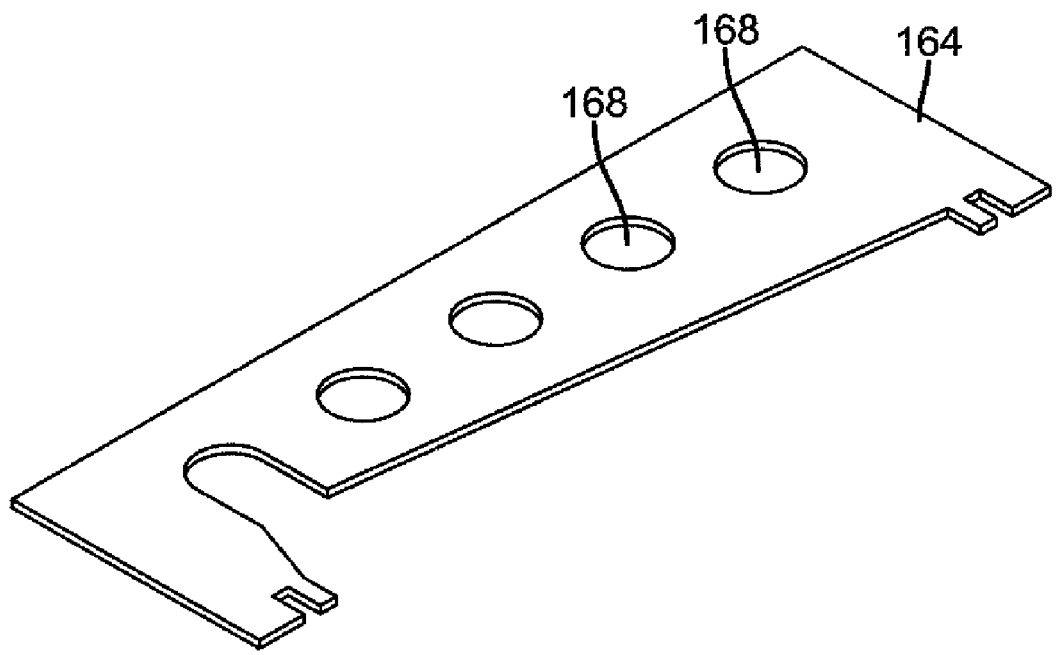
Figure 13A:
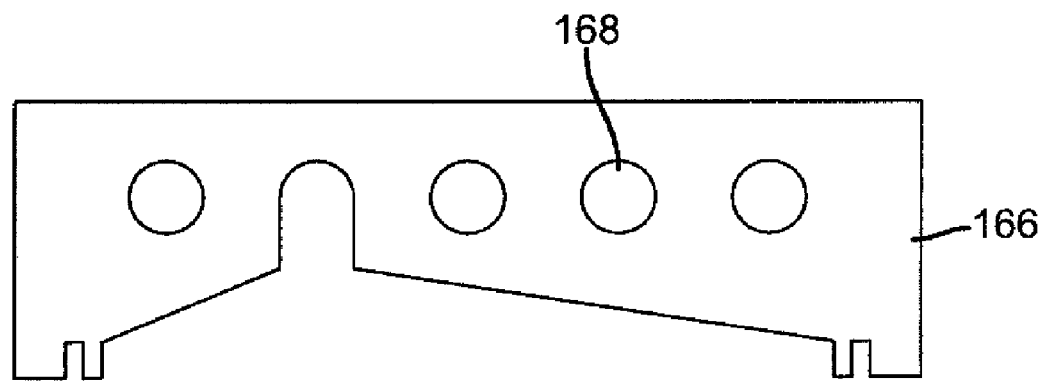
FIGS. 13A and 13B are plan and perspective views, respectively, of a reactant plate used in the vertical plate embodiment of FIG. 9A.
Figure 13B:
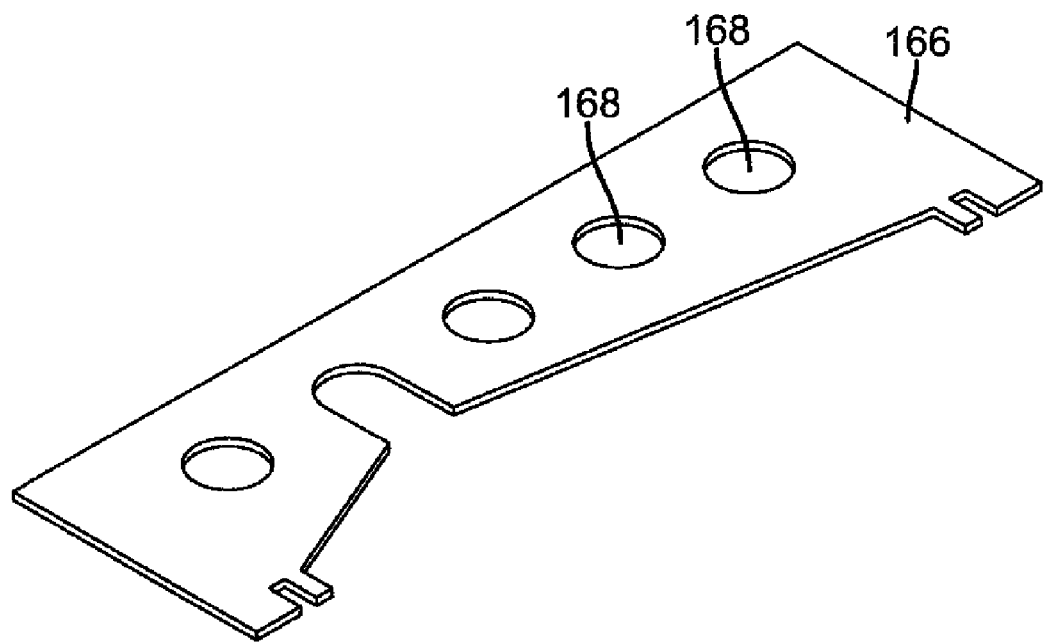
Figure 13C:
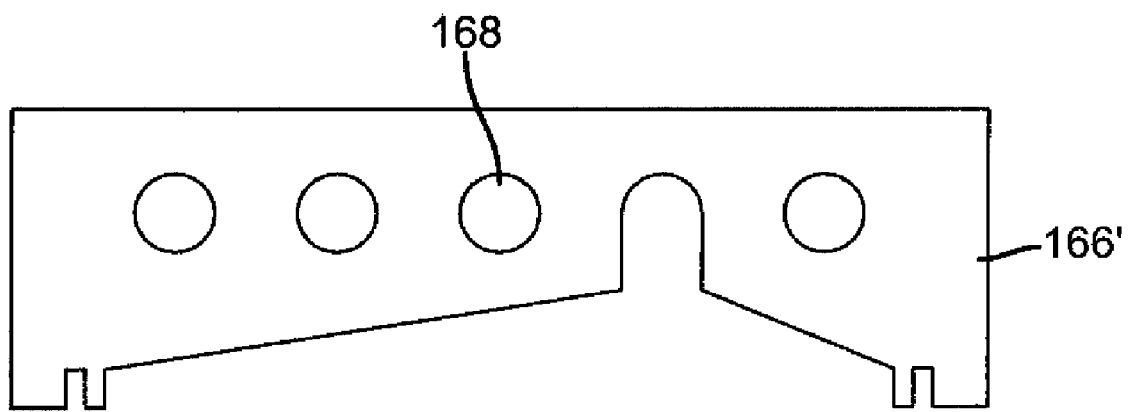
FIG. 13C is a plan view of a reactant plate in an alternate orientation.

From left to right in FIG. 9B are separator plates 160 (S), also shown in FIGS. 10A and 10B, alternating between plates used for directing gas toward or away from the substrate. A purge plate 162 (P) is shown in FIGS. 11A and 11B. An exhaust plate 164 (E) is shown in FIGS. 12A and 12B. A reactant plate 166 (R) is shown in FIGS. 13A and 13B. FIG. 13C shows a reactant plate 166' obtained by flipping the reactant plate 166 of FIG. 13A horizontally; this alternate orientation can also be used with exhaust plate 164, as required. Apertures 168 in each of the apertured plates align when the plates are superposed, thus forming ducts to enable gas to be passed through delivery assembly 150 into elongated emissive output channels 152 and exhaust channels 154, as were described with reference to FIG. 1.

Returning to FIG. 9B, only a portion of a delivery assembly 150 is shown. The plate structure of this portion can be represented using the letter abbreviations assigned earlier, that is:

S-P-S-E-S-R-S-E-(S)

(With the last separator plate in this sequence not shown in FIG. 9A or 9B.) As this sequence shows, separator plates 160 (S) define each channel by forming side walls. A minimal delivery assembly 150 for providing two reactive gases along with the necessary purge gases and exhaust channels for typical ALD deposition would be represented using the full abbreviation sequence:

S-P-S-E1-S-R1-S-E1-S-P-S-E2-S-R2-S-E2-S-P-S-E1-S-R1-S-E1-S-P-S-E2-S-R2-S-E2-S-P-S-E1-S-R1-S-E1-S-P-S where R1 and R2 represent reactant plates 166 in different orientations, for the two different reactant gases used, and E1 and E2 correspondingly represent exhaust plates 164 in different orientations.

Exhaust channel 154 need not be a vacuum port, in the conventional sense, but may simply be provided to draw off the flow from its corresponding output channel 12, thus facilitating a uniform flow pattern within the channel. A negative draw, just slightly less than the opposite of the gas pressure at neighboring elongated emissive channels 152, can help to facilitate an orderly flow. The negative draw can, for example, operate with draw pressure at the source (for example, a vacuum pump) of between 0.2 and 1.0 atmosphere, whereas a typical vacuum is, for example, below 0.1 atmosphere.

Use of the flow pattern provided by delivery head 10 provides a number of advantages over conventional approaches, such as those noted earlier in the background section, that pulse gases individually to a deposition chamber. Mobility of the deposition apparatus improves, and the device of the present invention is suited to high-volume deposition applications in which the substrate dimensions exceed the size of the deposition head. Flow dynamics are also improved over earlier approaches.

The flow arrangement used in the present invention allows a very small distance D between delivery head 10 and substrate 20, as was shown in FIG. 1, preferably under 1 mm. Depositing output face 36 can be positioned very closely, to within about 1 mil (approximately 0.025 mm) of the substrate surface. The close positioning is facilitated by the gas pressure generated by the reactant gas flows. By comparison, CVD apparatus require significantly larger separation distances. Earlier approaches such as the cyclical deposition described in the U.S. Pat. No. 6,821,563 to Yudovsky, cited earlier, were limited to 0.5 mm or greater distance to the substrate surface, whereas embodiments of the present invention can be practiced at less than 0.5 mm, for example, less than 0.450 mm. In fact, positioning the delivery head 10 closer to the substrate surface is preferred in the present invention. In a particularly preferred embodiment, distance D from the surface of the substrate can be 0.20 mm or less, preferably less than 100 μm.

It is desirable that when a large number of plates are assembled in a stacked-plate embodiment, the gas flow delivered to the substrate is uniform across all of the channels delivering a gas flow (I, M, or O channels). This can be accomplished by proper design of the apertured plates, such as having restrictions in some part of the flow pattern for each plate which are accurately machined to provide a reproducible pressure drop for each emissive output or exhaust channel. In one embodiment, output channels 12 exhibit substantially equivalent pressure along the length of the openings, to within no more than about 10% deviation. Even higher tolerances could be provided, such as allowing no more than about 5% or even as little as 2% deviation.

Although the method using stacked apertured plates is a particularly useful way of constructing the article of this invention, there are a number of other methods for building such structures that may be useful in alternate embodiments. For example, the apparatus may be constructed by direct machining of a metal block, or of several metal blocks adhered together. Furthermore, molding techniques involving internal mold features can be employed, as will be understood by the skilled artisan. The apparatus can also be constructed using any of a number of stereolithography techniques.

Figure 14:
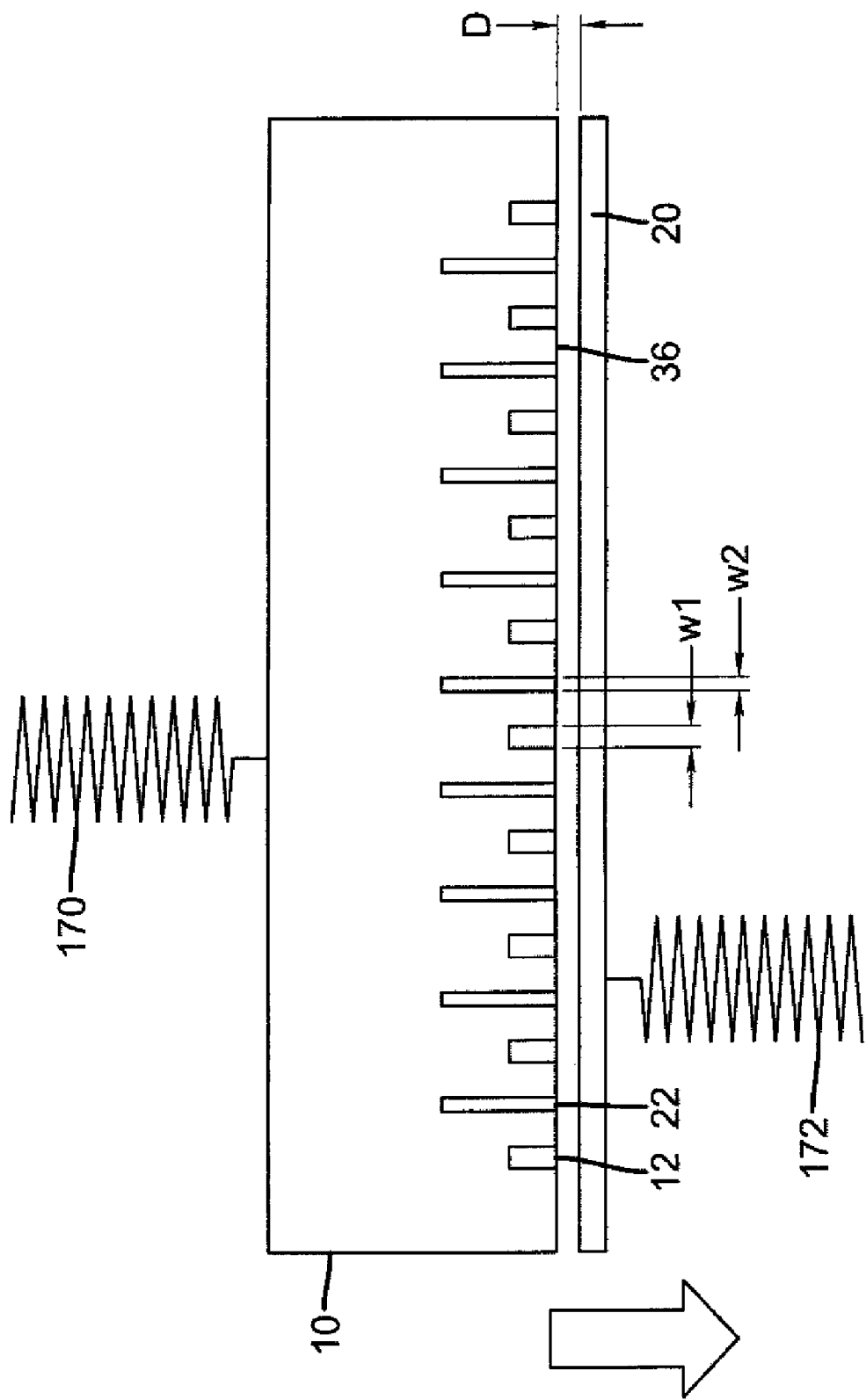
FIG. 14 is a side view of a delivery head showing relevant distance dimensions and force directions.

One advantage offered by delivery head 10 of the present invention relates to maintaining a suitable separation distance D (FIG. 1) between its depositing output face 36 and the surface of substrate 20. FIG. 14 shows some key considerations for maintaining distance D using the pressure of gas flows emitted from delivery head 10.

In FIG. 14, a representative number of output channels 12 and exhaust channels 22 are shown. The pressure of emitted gas from one or more of output channels 12 generates a force, as indicated by the downward arrow in this figure. In order for this force to provide a useful cushioning or "air" bearing (gas fluid bearing) effect for delivery head 10, there must be sufficient landing area, that is, solid surface area along depositing output face 36 that can be brought into close contact with the substrate 20. The percentage of landing area corresponds to the relative amount of solid area of depositing output face 36 that allows build-up of gas pressure beneath it. In simplest terms, the landing area can be computed as the total area of depositing output face 36 minus the total surface area of output channels 12 and exhaust channels 22. This means that the total surface area, excluding the gas flow areas of output channels 12, having a width w1, or of exhaust channels 22, having a width w2, must be maximized as much as possible. A landing area of 95% is provided in one embodiment. Other embodiments may use smaller landing area values, such as 85% or 75%, for example. Adjustment of gas flow rate could also be used in order to alter the separation or cushioning force and thus change distance D accordingly.

It can be appreciated that there would be advantages to providing a gas fluid bearing, so that delivery head 10 is substantially maintained at a distance D above substrate 20. This would allow essentially frictionless motion of delivery head 10 using any suitable type of transport mechanism. Delivery head 10 could then be caused to "hover" above the surface of substrate 20 as it is channeled back and forth, sweeping across the surface of substrate 20 during materials deposition.

As shown in FIG. 14, delivery head 10 may be too heavy, so that the downward gas force is not sufficient for maintaining the needed separation. In such a case, auxiliary lifting components, such as a spring 170, magnet, or other device, could be used to supplement the lifting force. In other cases, gas flow may be high enough to cause the opposite problem, so that delivery head 10 would be forced apart from the surface of substrate 20 by too great a distance, unless additional force is exerted. In such a case, spring 170 may be a compression spring, to provide the additional needed force to maintain distance D (downward with respect to the arrangement of FIG. 14). Alternately, spring 170 may be a magnet, elastomeric spring, or some other device that supplements the downward force. In some embodiments of the present invention, the delivery head 10 may be fixed. In instances where the delivery head 10 is fixed, and the substrate is allowed to float, an additional force may be applied to the substrate 20 as shown in FIG. 14 by spring 172.

Alternately, delivery head 10 may be positioned in some other orientation with respect to substrate 20. For example, substrate 20 could be supported by the air bearing effect, opposing gravity, so that substrate 20 can be moved along delivery head 10 during deposition. One embodiment using the air bearing effect for deposition onto substrate 20, with substrate 20 cushioned above delivery head 10 is shown in FIG. 27.

The alternate embodiment of FIG. 27 shows substrate 20 moving in direction K between delivery head 10 and a gas fluid bearing 98. In this embodiment, delivery head 10 has an air-bearing or, more appropriately, a gas fluid-bearing effect and cooperates with gas fluid bearing 98 in order to maintain the desired distance D between the depositing output face of the delivery head 10 and substrate 20. Gas fluid bearing 98 may direct pressure using a flow F4 of inert gas, or air, or some other gaseous material. It is noted that, in the present deposition system, a substrate support or holder can be in contact with the substrate during deposition, which substrate support can be a means for conveying the substrate, for example a roller. Thus, thermal isolation of the substrate being treated is not a requirement of the present system.

Figure 15:
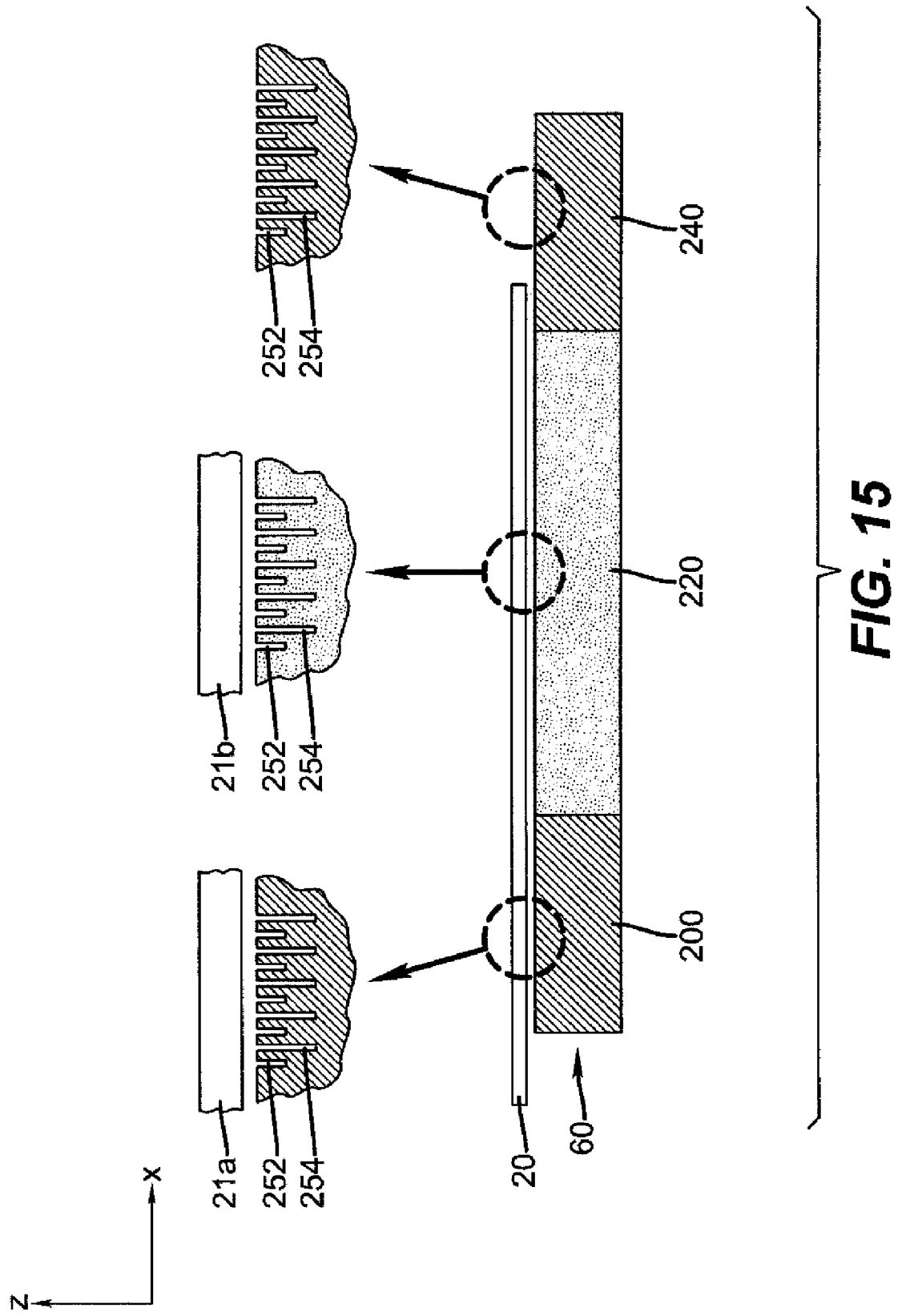
FIG. 15 is a side view of one embodiment of a deposition system showing a main coating section and entrance and exit sections.

Although deposition only occurs in the areas of the deposition head which exhibit an alternating sequence of reactive gases, practical considerations dictate that a deposition system have sections adjacent to the deposition head to provide an area on which to load and unload a substrate into or out of the coating section, as well as to optionally provide support for portions of the substrate that extend past the deposition area as indicated in the deposition system 60 of FIG. 15, in which portions of the substrate 20 are shown as magnified portions 21a and 21b. For purposes of definition, the entrance section 200 is the section before the deposition or coating section 220, and the exit section 240 is the section after the deposition or coating section 220, considering the direction of substrate travel.

Since the deposition head maintains its proximity to the substrate via a gas bearing effect, it is convenient that the entrance and exit sections also use a similar effect. These sections may have a distribution of gas delivery slots (or more generally, ports) that is very similar to that of the deposition section. In fact, it is possible in some circumstances that the entrance and exit slots be identical to output slots in the deposition region except that they are supplied only with a single gas.

The entrance section 200 and exit section 240 may be supplied with any gas for floatation that does not adversely impact the manufacture and performance of the thin films. In many cases, it may be desirable to use an inert gas as the flotation gas for entrance section 200 and exit section 240. Alternatively, since the substrate is likely to see air before and after deposition, there may be times when cost savings in terms of gas utilization can be achieved by using air as the floatation gas for one or both of these sections.

The entrance section 200 and exit section 240 can optionally use only a single gas supply without additional gas handling considerations. In a preferred embodiment, the non-depositing output faces of the entrance section 200 and exit section 240 have an arrangement of non-depositing output openings 252 supplying gas to the non-depositing output face of the entrance or exit section and an arrangement of gas exhaust ports 254 withdrawing gas from the surface of the non-depositing output face. The use of exhaust ports 254 allows for more robust positioning of the substrate and maintenance of an appropriate gap between the substrate and the non-depositing output face.

As indicated above, for the entrance section 200 and exit section 240 the non-depositing output face may have output openings 252 and exhaust ports 254 that may take the form of slots as envisioned for the deposition or coating sections. However, these openings may be of any convenient shape since containment or separation of gas from one type of opening to another is not required in these sections, as compared to the coating section. Examples of other types of openings would be square, pentagonal, or preferably circular openings, just to name a few.

In the case where the non-depositing output openings 252 and exhaust ports 254 are slots, the preferred arrangement of slots would be to have each exhaust port or channel 254 surrounded on each side by non-depositing output openings 252, and likewise at each non-depositing output opening 252 surrounded on each side by exhaust ports 254. In a preferred embodiment, the openings at the furthest ends of the entrance and exit sections would be non-depositing output openings. In the case where non-depositing output openings 252 and exhaust ports 254 are circular openings, these could be disposed in any manner that provides an alternation of said types of openings. One preferred arrangement would be holes on a square pattern in which each output opening 252 is surrounded by its nearest neighbors with exhaust ports 254, and likewise each exhaust port surrounded by non-depositing output opening 252.

Alternately, the entrance and exit sections could employ porous materials to deliver gases to the non-depositing output face.

The entrance, exit, and coating sections may be maintained at a specified, pre-selected temperature or temperature range, optionally with different temperature set points for each of the sections.

Any manner in which a substrate can be repeatedly exposed to the alternating sequence of gases from the coating head will cause the ALD growth of a film. A reciprocation motion has been envisioned in the prior art for such a growth. However, reciprocating motion involves a complex mechanical system to allow for substrate loading and repeated reversing of substrate direction. A less obvious but still significant problem with the reciprocating motion is that at least a portion of the substrate during it growth must be withdrawn from the deposition area between each stroke, leading to the exposure of the withdrawn regions to a possibly uncontrolled environment.

One approach to the above problem involves designing the coating or delivery head with enough ALD cycles so that a substrate need only make a single pass, or at most a single bi-directional pass, through the coating region in order to receive the required amount of deposition for a particular thin film.

It can be seen that in such a configuration, the entire ALD growth at any location on the substrate can be accomplished, as in one preferred embodiment, without any need to cause a reversal in direction of the substrate for deposition purposes.

Again with reference to the deposition system 60 of the embodiment of FIG. 15, a complete thin film layer of a desired thickness can be formed by loading the substrate into the entrance section 200, transporting the substrate through the entrance section 200, to and through the coating section 220, continuing to transport the substrate into the exit section 240 wherein the substrate 20 may be removed with the completed thin film. This has the additional advantage that there is no reason for the substrate to be removed from the coating area prior to the completion of the desired layer thickness. In addition to avoiding any exposure to an uncontrolled environment, the continuous growth in a single pass should increase the overall deposition rate on any given point on the substrate.

Another advantage of a unidirectional motion during a pass through the deposition system is simplification of the mechanical systems required for substrate transport. Substrate transport can be accomplished with the use of any sort of device causing linear motion, such as a linear motor driven linear stage, a rotary motor driven linear stage, a belt drive, or any other methods of introducing linear motion as known by a skilled artisan. Non-contact methods to provide movement of the substrate could also be accomplished. Such methods include viscous forces, such as directed gas streams, magnetic, and electrical forces.

Because such a system embodiment does not require any change in direction of the substrate, and the gas bearing effect produces low friction, travel of the substrate through the deposition zone can also be accomplished by providing the substrate with an initial velocity and then allowing the substrate to glide by its own inertia though the deposition zone, at least to some extent. An initial velocity to the substrate could be imparted by any of the motion methods discussed above.

It is also possible that the substrate velocity be imparted by the effect of gravity. Thus, the coating, entrance, and exit sections may be inclined to allow gravity feed to accomplish part or all of the motion of the substrate. Furthermore, the degree of incline of these sections may be variable mechanically such that during the course of a deposition a stationary substrate could be accelerated by changing the incline of the coating section, entrance section, or exit section from horizontal to some level of incline.

Although a unidirectional single pass deposition system may be preferred for simplicity of substrate transport, a bi-directional system may be preferred for a deposition system with a smaller foot-print. In the case of a bi-directional system, the entrance and exit section would be of similar length to that of the unidirectional system, but the coating section would only need to be half the length, relatively speaking. Again referring to FIG. 15, a complete thin film layer of desired thickness, in such an embodiment, would be formed by loading the substrate 20 into the entrance section 200, transporting the substrate through the entrance section 200, to and through the coating section 220, continuing to transport the substrate into the exit section 240, wherein the substrate transport direction would reversed and the substrate would be transported back through the coating section 220, into entrance section 200 where the substrate may be removed with the completed thin film.

The coating section 220, entrance section 200, and exit section 240 of the current invention are complex mechanical systems with a high number of internal passageways and depositing output face openings. Often these systems will be constructed of a large number of bonded parts. Furthermore, in order to achieve a single pass deposition, the length of the coating section and number of depositing output face slots can be quite large. For example, a single deposition cycle may require eight elongated slots: Purge-Exhaust-First Reactive Gas-Exhaust-Purge-Exhaust-Second Reactive Gas-Exhaust. If it is assumed that a single deposition cycle produces 1 Å of layer thickness, then to achieve 1000 Å of layer thickness would require 1000 of the above cycles. If we further assume that each of the elongated slots is separated from its neighbor by 0.025 inches, then the total length of the deposition zone would be 16.7 feet. Furthermore, if the entrance section and exit section need to be at some reasonable length to support the substrate, these sections could easily exceed 5 feet in length.

Creating such a large deposition region may be difficult to achieve by creating a single monolithic deposition head. The difficulty arises from several factors. First of all such long heads will be composed of thousands of parts, and a successfully constructed head will require assembling this large number of parts without significant or unacceptable defects. Furthermore, there may be significant problems in mounting and handling a very large head into the overall deposition system. Finally, if the head is damaged in operation, replacing a single large head will be very costly and time consuming.

Figure 16:
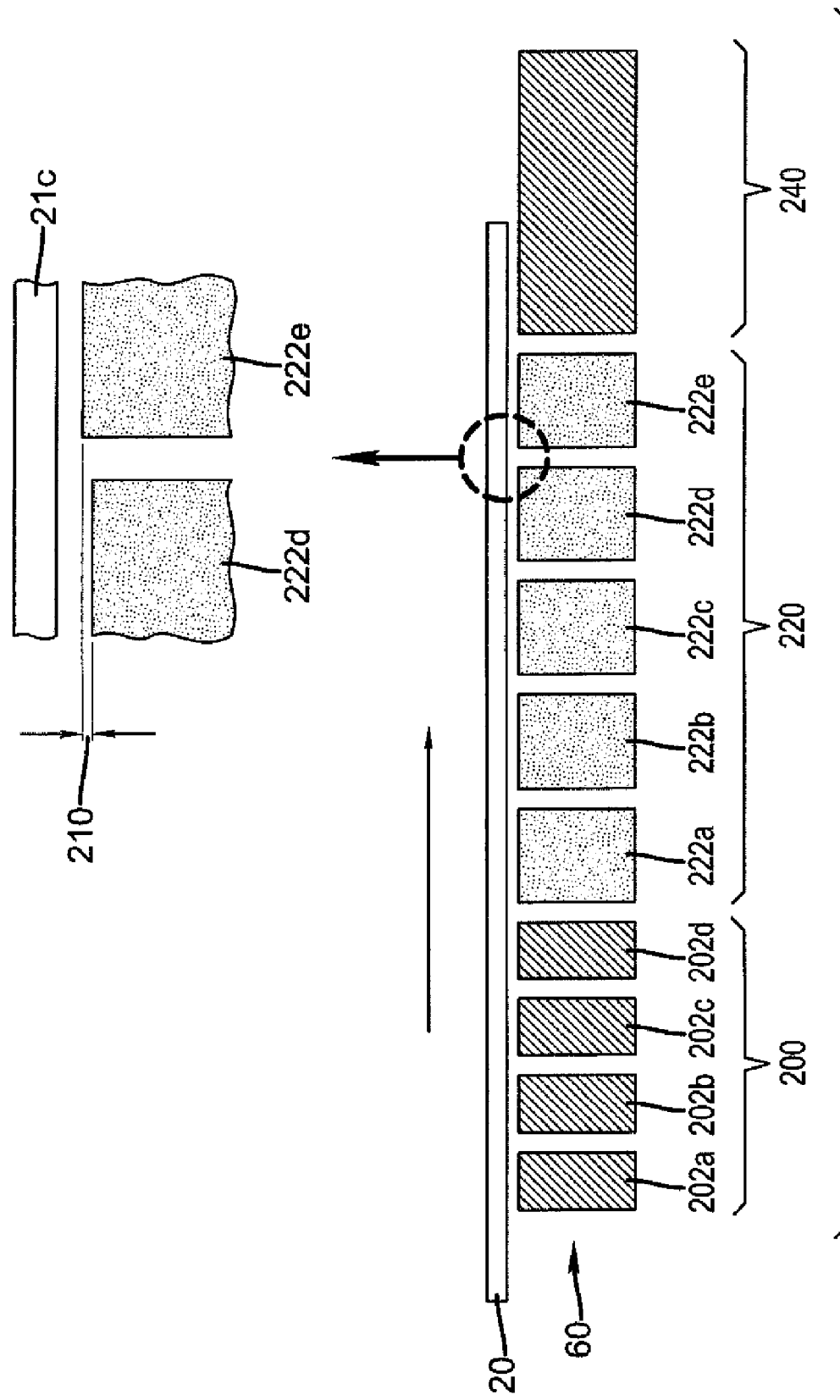
FIG. 16 is a perspective view showing one embodiment of a deposition system containing a plurality of modules.

An alternative to the single large deposition head is to construct the head of independent modules. A module can represent a full section, such as the entrance, exit, or coating section. Alternatively, a given section can be constructed from a number of modules. FIG. 16 shows a view of one embodiment involving modular configuration. In FIG. 16, the entrance section 200 is composed of 4 modules 202a, 202b, 202c and 202d. The coating section 220 of deposition system 60 is composed of 5 modules 222a, 222b, 222c, 222d, and 222e. A magnified portion of the coating section shows the vicinity of two modules to a substrate portion 21c, in which the variation in the placement of the faces of the modules, with respect to the substrate, are kept within a maximum desired variation of distance xx for improved results. These coating section modules may be identical or different, depending on the design of the final deposition system 60. For practical purposes, each of a plurality of coating section modules minimally contain the appropriate number of output openings and exhaust ports to complete a single ALD cycle. Preferably, the modules would be designed for one to fifty complete ALD cycles. FIG. 16 shows an exit section 240 composed of a single module. It should be understood by one skilled in the art that many combinations of modules are available for construction of a final deposition system, and FIG. 16 merely serves to illustrate one illustrative embodiment or possible arrangement, which will, of course depend on, and be adapted to, the particular substrate being coated, the particular process, the materials and thin films that are involved, and the particular type of device being manufactured.

In one preferred embodiment, the deposition system can comprise, for example eight or more modules in the coating section, preferably 10 to 100 modules. Each of such modules can comprises a delivery head that is substantially separately and independently constructed, assembled, and placed in the deposition system.

To understand how the number of modules can impact the yield in constructing the coating section, consider the example of a coating section that is composed of 8000 plates. Assume that, in assembly, there is a defect rate such that in assembling every 200 plates there is a 2% chance of having a defect in the assembly. In assembling this section as modules of 200 plates each, there will be required 40 working modules, and therefore approximately 41 modules will need to be assembled to yield 40 usable modules (approximately 2% wasted work). To attempt a single construction of 8000 plates, the probability of a single construction working is $0.98^{40}=44\%$. As a result, approximately 2 full coating sections will be required to yield a single working section (approximately 50% wasted work). The present modular aspect in one embodiment of the invention can significantly avoid or reduce that problem.

Often it is desired to coat a thin film consisting of a single material. There are however desirable thin films in which a complete film containing a number of layers of different materials can be useful. It is possible in the case of a modular coating section that a plurality of modules within the coating section are capable of delivering the different gases, thus not all modules produce the same coatings.

Figure 17:
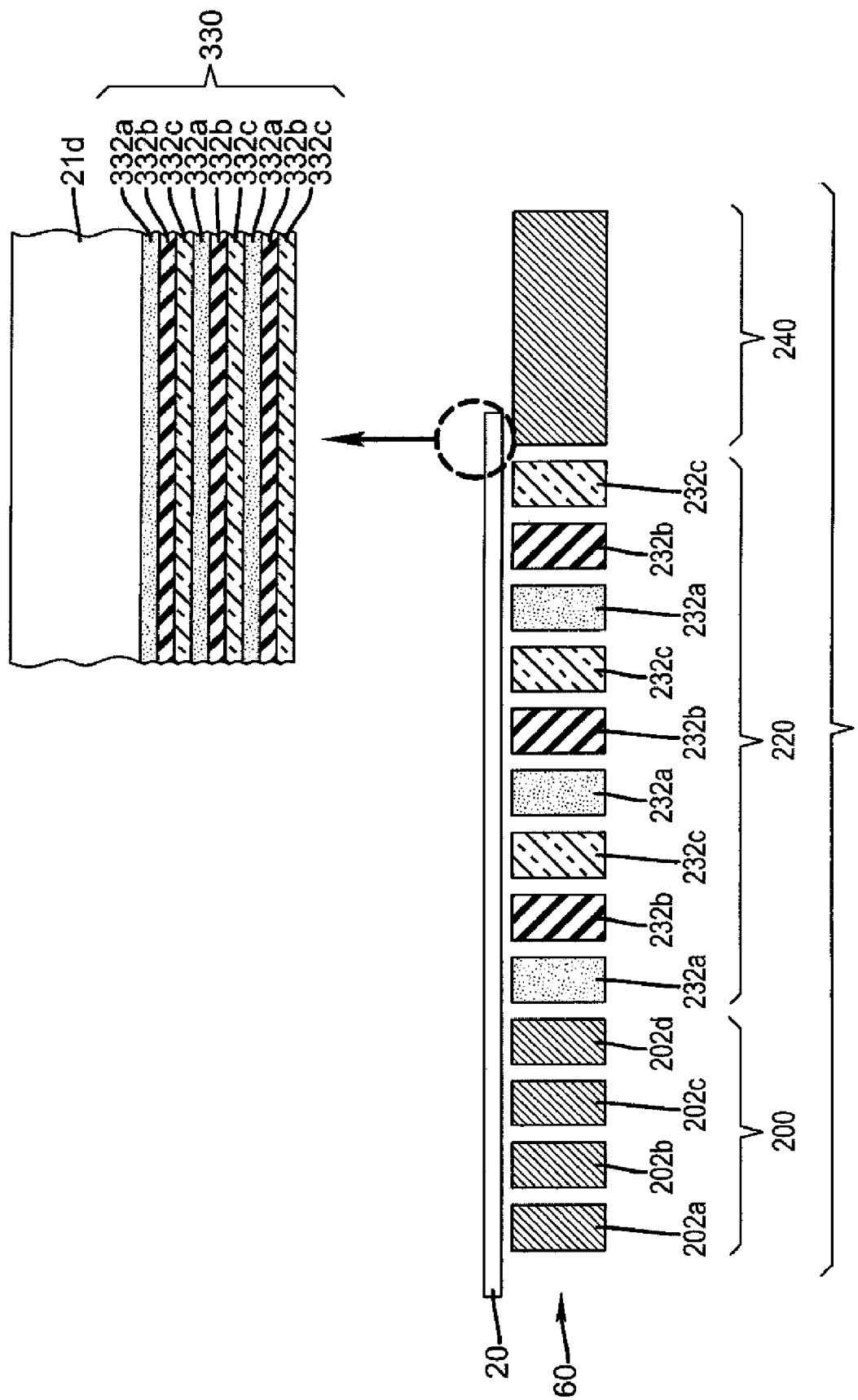
FIG. 17 is a perspective view illustrating the formation of thin films using one embodiment of the inventive deposition system.

FIG. 17 illustrates one embodiment of a deposition system 60 in which the modules of the coating section deliver different deposition chemistries. Coating section 220 is composed of nine modules. Module 232a is adapted to deliver chemistry to form a first thin film material, module 232b is adapted to deliver chemistry to form a second thin film material, and module 232c is adapted to deliver chemistry to form third thin film material. Modules 232a, 232b, and 232c are arranged such that the complete thin film coating entering the exit section 240 contains alternating thin films layers of, respectively, first thin film material 332a, second thin film material 332b, and third thin film material 332c in overall multiple thin film structure 330, shown with respect to substrate portion 21d. The thickness of each of these layers is determined by the number of ALD cycles within the corresponding module of coating section 220. It should be understood by one skilled in the art that the first, second and third materials could be any material that can suitably be deposited using this ALD deposition system as has been previously described. FIG. 17 should not be considered limiting, rather it should serve as one possible construction for forming a multilayer thin film. The exit section 240 and modules 202a to 202d in the entrance section 200, in FIG. 17, are similar to those explained in previous figures.

For the purposes of coating a flat substrate, it is generally assumed that depositing output face of the coating apparatus will also be flat. However, there can be advantages to having a depositing output face with a degree of curvature.

The curvature of a surface can generally be defined by a radius of curvature. The radius of curvature is the radius of a circle where a section of that circle matches the curvature of the depositing output face. In the case where the curvature of the surface varies and cannot be described by a single radius, then the maximum curvature and the minimum radius of curvature may be used to define the characteristic radius of curvature of the system.

For certain substrates it may be useful to have some curvature of the deposition head in the direction of movement of the substrate. This can have the beneficial effect of allowing the leading edge of the substrate to have lower downward force than the remaining portion of the substrate since curvature of the head will tend to pull the leading edge of the substrate away from the coating section depositing output face.

For certain substrates it may be useful to have curvature in a direction that is perpendicular to the direction of substrate motion. This degree of curvature will have the effect of corrugation, which is to increase the rigidity of the substrate and perform a more robust coating.

Figure 18:
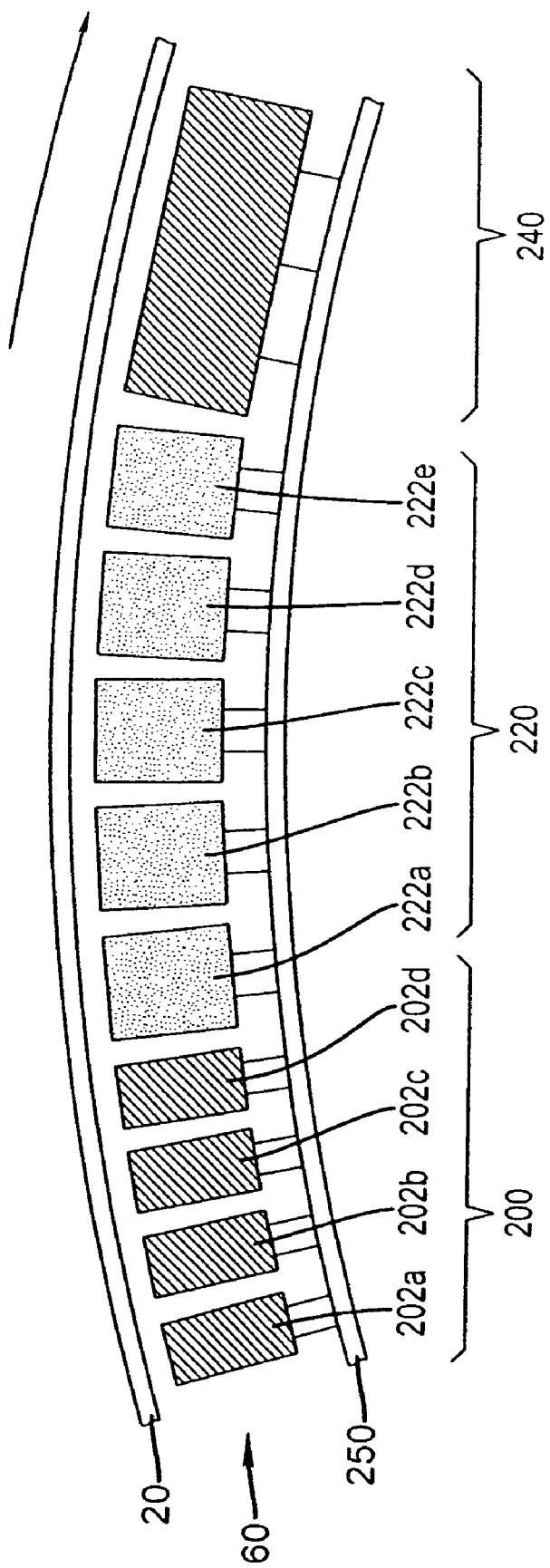
FIG. 18 is a cross-sectional side view of one embodiment of a delivery system with a depositing output face having curvature.

In the case of a modular deposition system, the surface of the individual modules may or may not be curved. FIG. 18 shows an example of a curved deposition region that results for the placement and rotation of modules along an arc that matches the desired arc of the substrate during deposition. The parts in FIG. 18 correspond to those in FIG. 16 except for the curvature provided with respect to the modules aligned with curved support for modules 250.

For depositing of some materials in some processes, it may be advantageous to heat the substrate. FIGS. 19A and 19B respectively illustrate radiant and convective heat sources as part of one embodiment of a deposition system. Radiant heat source 260 can be made from IR lamps 265 as illustrated in FIG. 19A or alternatively any radiant heat source known in the art such as quartz halogen lamps. Convective heat source 270 illustrated in FIG. 19B can employ a heated air blower. Alternatively, convective heat source 270 can be used to cool the substrate, employing a cool air blower. The other parts in FIGS. 19A and 19B correspond to those in FIG. 16 except for the parts just previously mentioned with respect to FIGS. 19A and 19B. The apparatus of the present invention is advantaged in its capability to perform deposition onto a substrate over a broad range of temperatures, including room or near-room temperature in some embodiments. The apparatus of the present invention can operate in a vacuum environment, but is particularly well suited for operation at or near atmospheric pressure.

In a preferred embodiment, ALD can be performed at or near atmospheric pressure and over a broad range of ambient and substrate temperatures, preferably at a temperature of under 300° C. Preferably, a relatively clean environment is needed to minimize the likelihood of contamination; however, full "clean room" conditions or an inert gas-filled enclosure would not be required for obtaining good performance when using preferred embodiments of the apparatus of the present invention.

Referring back to FIG. 16, the separation between the substrate and the deposition head can be very small, sometimes as low as 10 microns, especially in an embodiment operating with a gas bearing effect between the coating modules and the substrate. It is, therefore, very important that the output faces of sections have surfaces free of discontinuities. In a modular configuration, the modules of a section, illustrated with the coating section of FIG. 16, must have well aligned output faces. The distance 210 of the inset of FIG. 16 needs to be small in order to accomplish this alignment and have a very low mismatch in location/height. In one embodiment, the distance 210 should be less than 10 microns, preferably less than 5, even more preferably less than 2 microns.

Figure 20B:
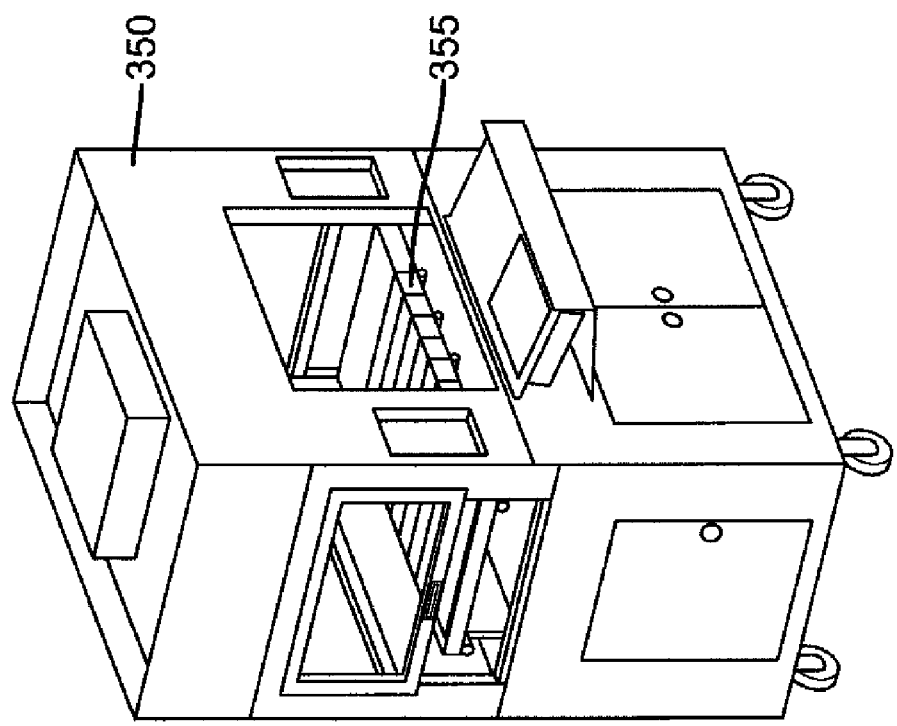
FIGS. 20A and 20B show side and perspective views, respectively, of one embodiment of a deposition system according to the present invention including a deposition system housing.
Figure 20A:
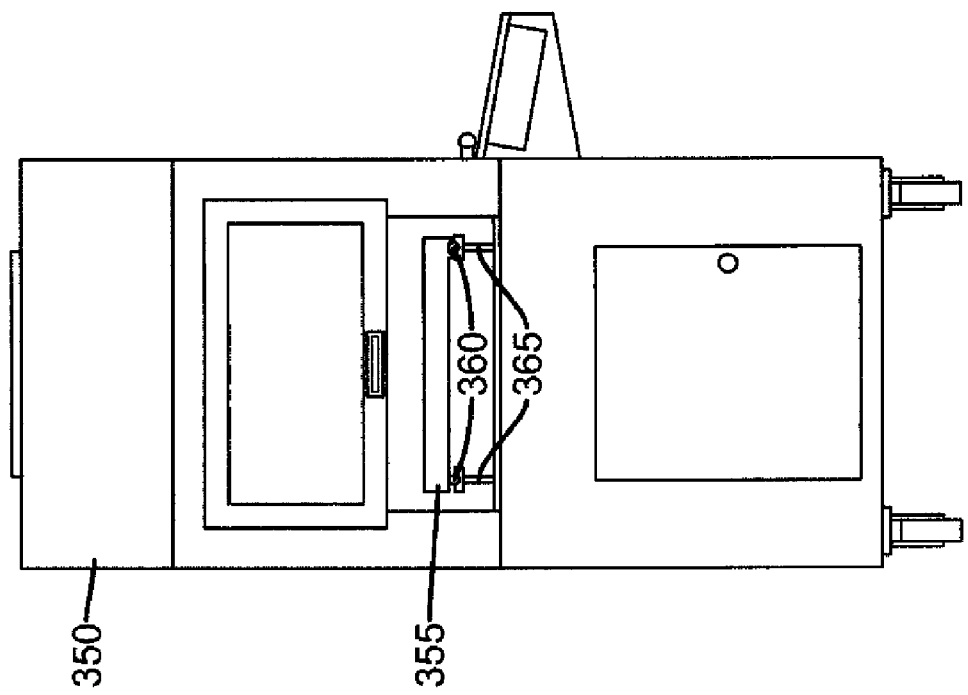

The present invention can advantageously provide a deposition system containing a module mounting mechanism to easily provide the required tolerance limitations. FIGS. 20A and 20B show one embodiment of such a deposition system, including a housing 350 for enclosing at least a coating section, optionally also an entrance and exit section, as described herein. Contained within the housing 350 is a set of modules 355 which are mounted on a set of rods 360 for module support and rod supports 365.

Figure 21:
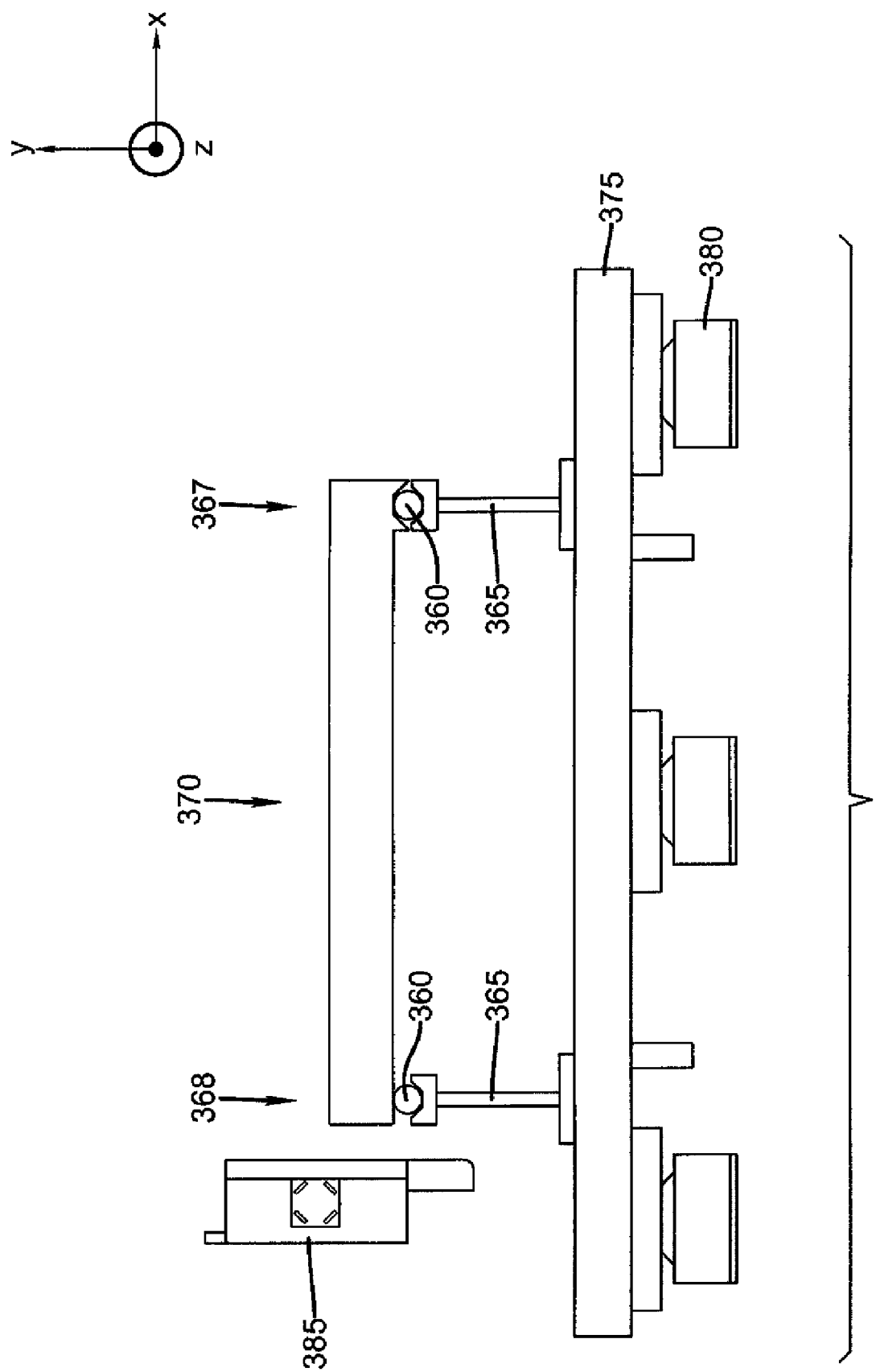
FIG. 21 shows a side view of a coating module located on rods and rod supports.

FIG. 21 shows a closer view of the rods 360, rod supports 365, and an individual module 370. Although the term "rod" is used herein, the term "bar" is interchangeable and the rod/bar is not limited to a particular shape in cross-section, whether circular, square or other shape. In the embodiment shown in FIG. 21, the rod or elongated piece happens to have a circular cross-section.

Also included in FIG. 21 are some of the elements in one embodiment of this invention, notably a support table 375, mounting supports 380 for the table, and a drive mechanism 385 for suitable coupling to the substrate if desired for transport of the substrate through the deposition system. Although FIG. 21 shows a coating module held only with two rods, it is clearly optionally useful for the system to have one or more additional rod locations. One possible reason for this is that in a relatively wide coating setup, there may be a need for one or more support rods between the end rods to prevent flex of the coating head or module thereof. Alternatively, a set of rod locations may allow the same coating system to be used with shorter or longer modules with are intended to interface with only a subset of the available rods.

The axes of freedom for the module are defined by the elements of FIG. 21. FIG. 21 contains an axis key showing the x, y, and z directions where the z direction is facing directly out of the page. For purposes of description, first alignment assembly 367 contains a first rod/bar for alignment and second alignment assembly 368 contains a second rod/bar for alignment. Both the first and second rods/bars provide for a freedom of movement in the z axis, since the rod may move or expand thermally in the z axis while maintaining contact with both bars (even with resistance from optional magnetic forces in one embodiment). This is the only axis of movement for the first bar region since that bar sits in a V or other channel to prevent any x axis movement. On the other hand, the second bar region provides an additional freedom in the x axis to accommodate movements such as the lateral thermal expansion of the module. There is not rotation freedom in this system since it is assumed that for proper operation both regions of first alignment assembly 367 and second alignment assembly 368 must maintain contact of the bar to the module. The coating module is removable from contact with the first and second bars by application of a force at least acting against the weight of the module.

Figure 22A:
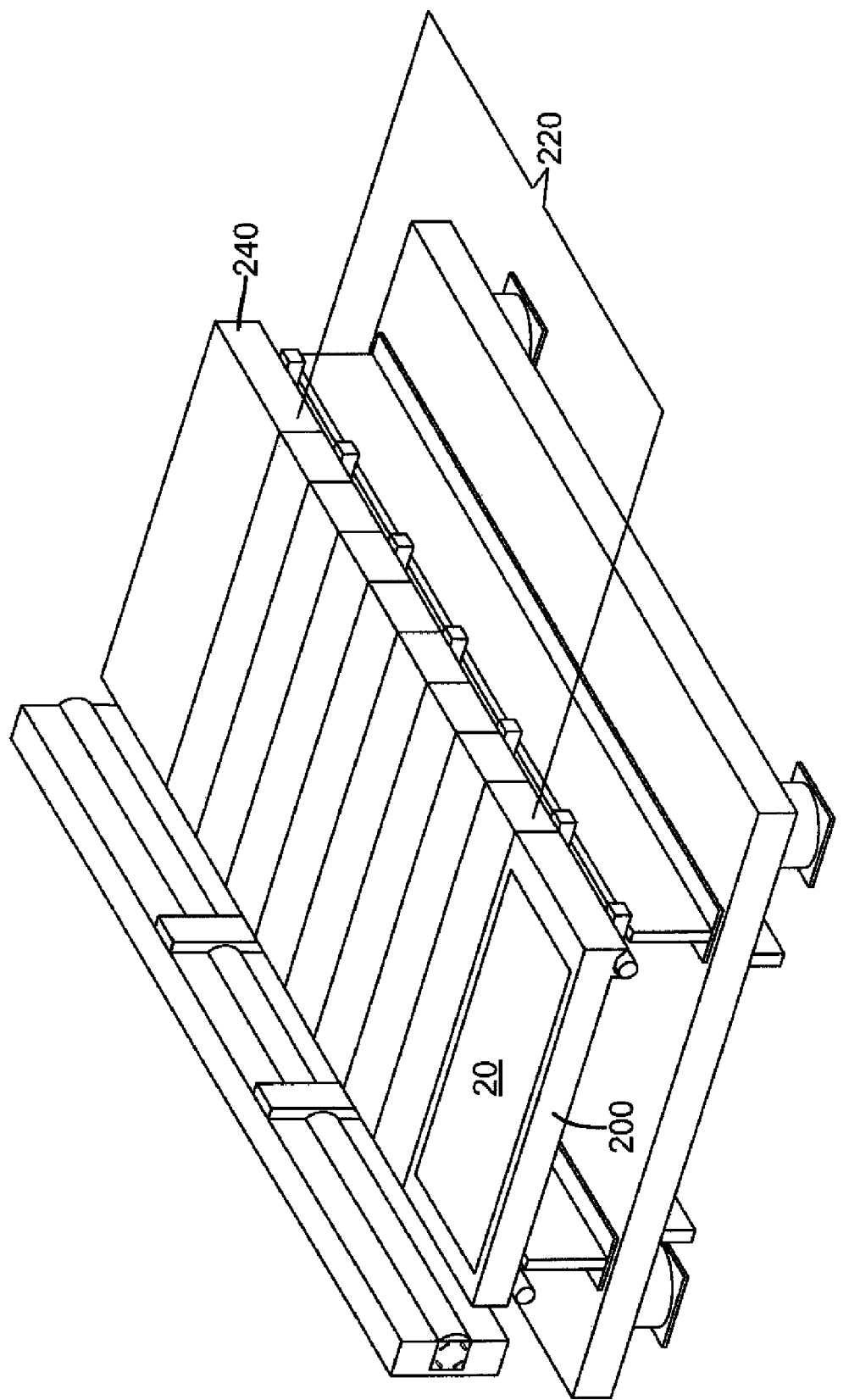
FIG. 22A shows a perspective view of a set of coating modules with a substrate at the entrance region according to one embodiment of the invention.
Figure 22B:
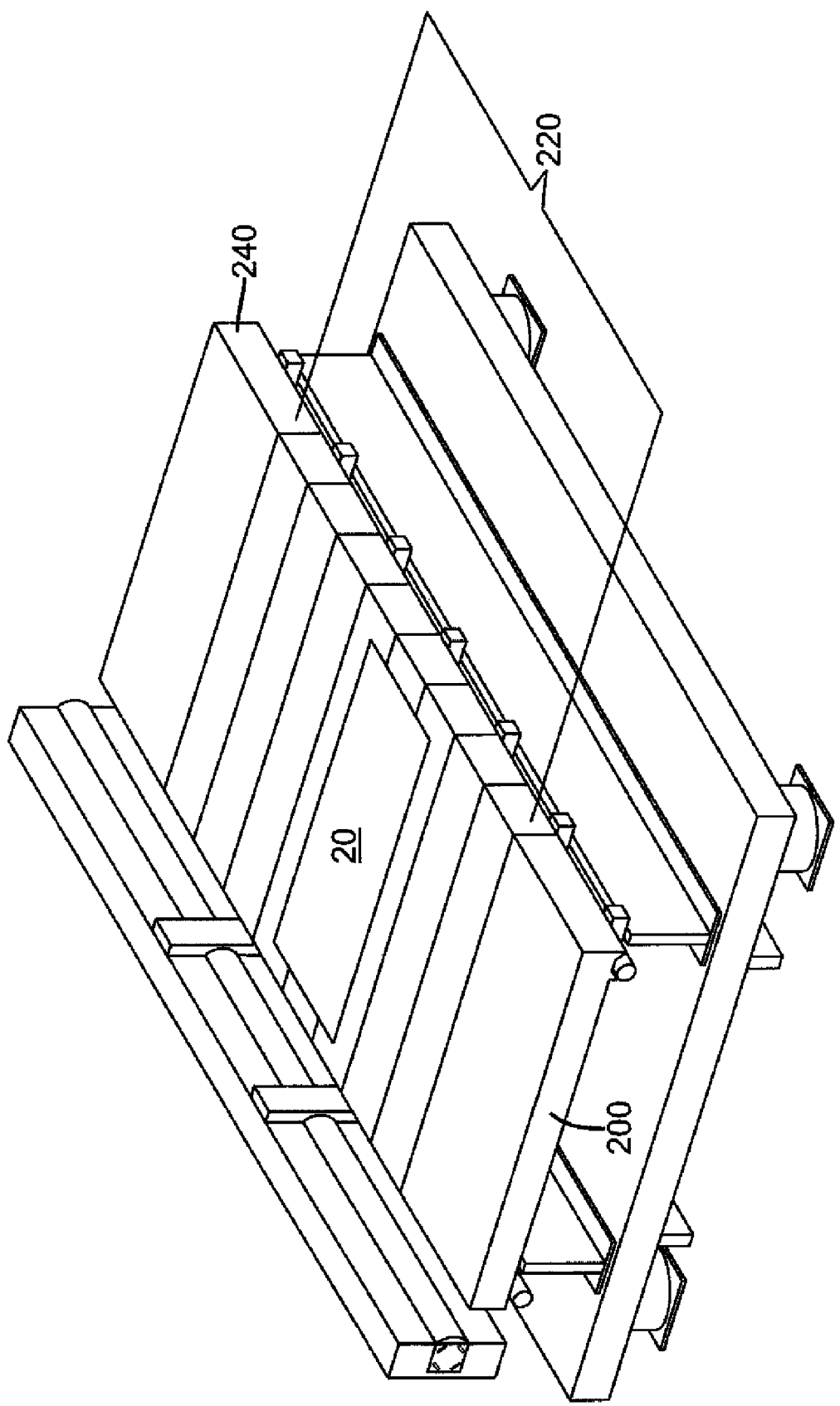
FIG. 22B shows a perspective view of a set of coating modules with a substrate at the coating region according to one embodiment of the invention.
Figure 22C:
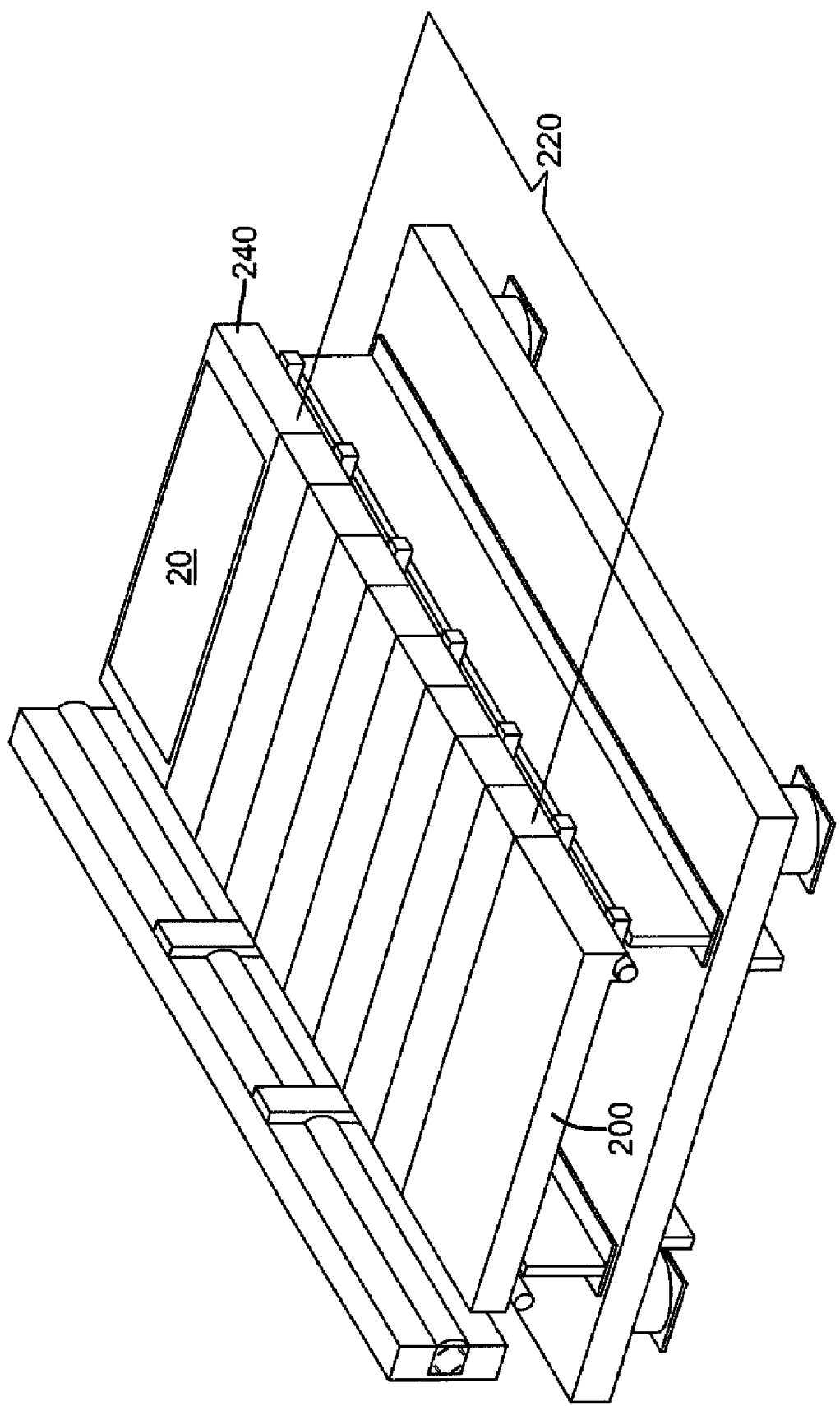
FIG. 22C shows a perspective view of a set of coating modules with a substrate at the exit region according to one embodiment of the invention.

FIGS. 22A through 22C show application of a coating to a substrate 20, as it moves from the entrance area 200 in FIG. 22A, through the coating section 220 in FIG. 22A, to the exit area 240 in FIG. 22C.

Figure 23:
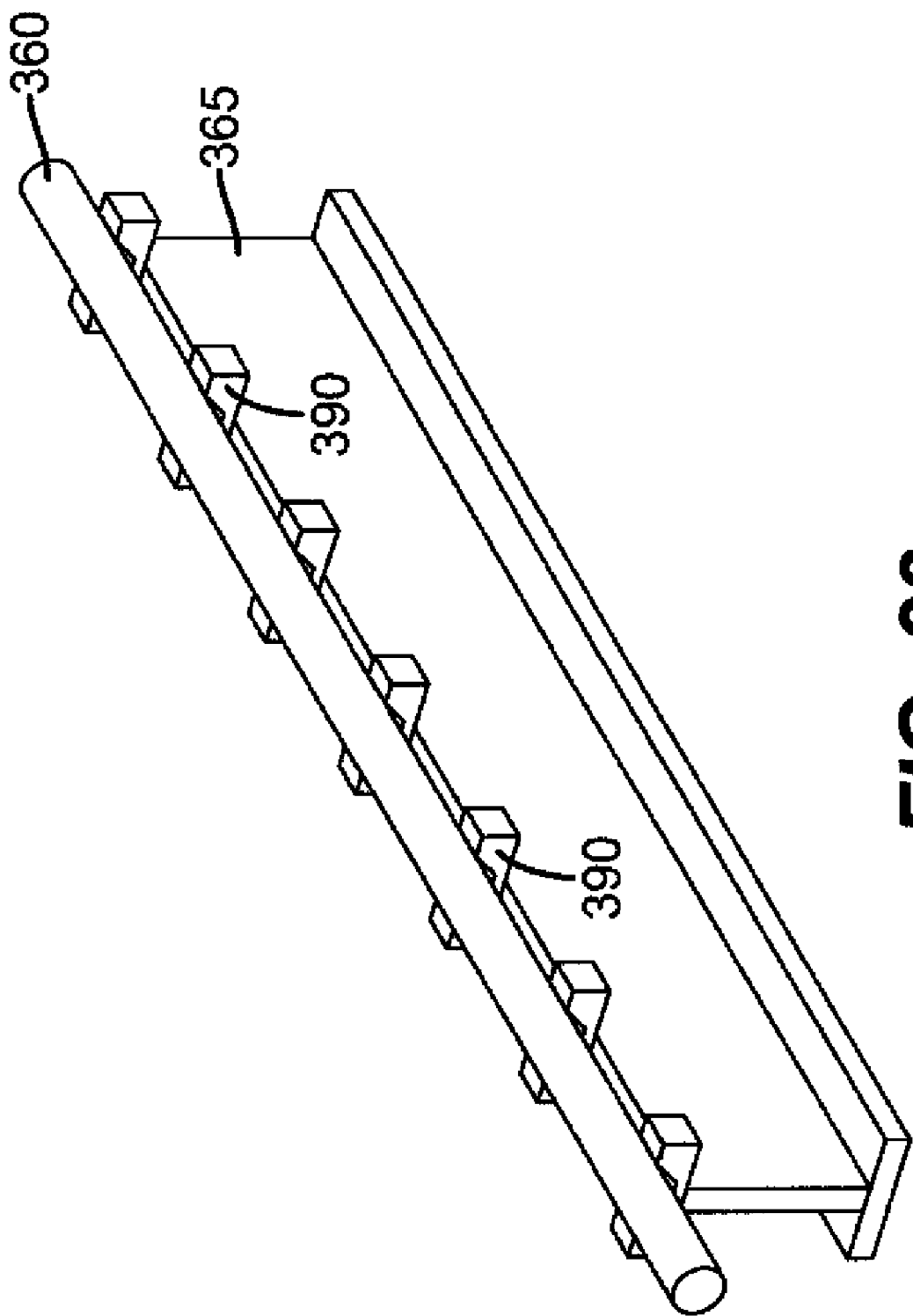
FIG. 23 shows a perspective view of a rod and rod support assembly according to one embodiment of the invention.

FIG. 23 shows a close-up of the rod 360 and rod support 365 in one embodiment of the present invention. The modules placed upon this rod should have a very tight tolerance relating to the position where they contact the rod to the position of the top surface of the output face of a module. As such, when a module sits on this rod and a neighboring module is placed upon the rod in an adjacent position, the top surfaces of these two rods will be in a very closely adjusted position satisfying the need for distance 210 of FIG. 16 to be very small.

The embodiment of FIG. 23 shows a plurality of bar mounting structures 390 along the length of the bar 360. However, an alternative embodiment could have a single integral bar mounting structure. The bar mounting structures 390 can be integrally attached to the support structure 365. The rod 360 need not be perfectly straight. Since the rod surface does not need an excessively tight tolerance, it is possible that the rods exist as an integral part of the coating system frame, produced by such processes as casting or machining.

In fact, it may be desired for the aggregate top surface areas (or output faces facing the substrate) of the entrance, coating, and exit sections 200, 220, and 240 to have a particular curvature or arbitrary profile. This profile can be easily generated by causing the rod 360 to having the top mating surfaces of a plurality of rod mounting structures 390, extending in the direction of substrate movement, to have a desired profile, which can then be transferred to the profile of the bar 360 that sits in contact with those rod mounting structures, and thus transferred to the top surface of the modules. Examples of non-linear profiles could be an arc, an arc combined with other arcs or straight areas, and a combination desired to produce the desired top output face profile. The desired profile can be only in the coating section or extend over more than one section. The profile can also be used to cause pre-engineered substrate motion. An example of such a profile would be a downward incline followed by a flat section followed by an upward incline. In this embodiment, a substrate placed on the output face surface, assuming nearly frictionless motion of an air bearing system, would accelerate by the action of gravity in the first downward incline, pass at a constant velocity through the flat section, and then slow in the final upward incline to a velocity suitable for extraction of the substrate from the coating system.

Figure 24:
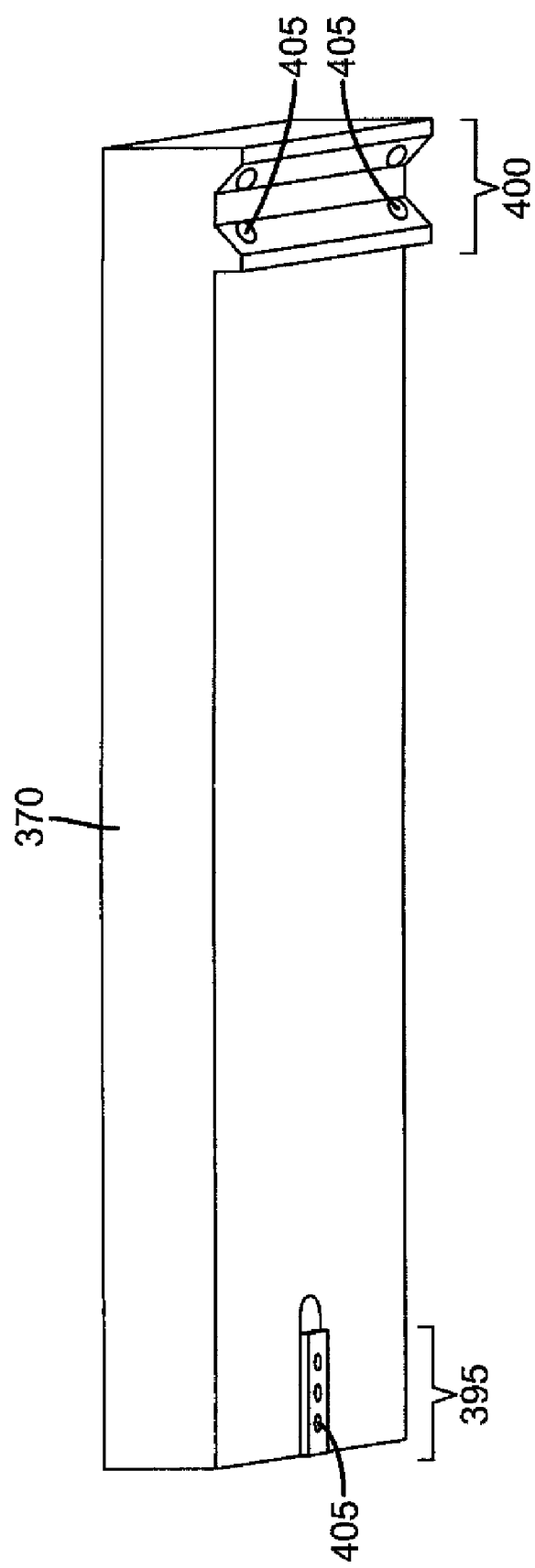
FIG. 24 shows a perspective view of a coating module.

One embodiment of a module that sits on the rods is shown in perspective view in FIG. 24 (viewed from the bottom so that the coating output face is not seen). This module has a first contact section 400 for contact with a first rod or bar and a second contact section 395 for contact with a second rod or bar. Within these areas are particular rod mating surfaces 405 which preferably employs a magnetic aligning capability as discussed later.

As an alternate embodiment to the one shown in FIG. 24, the module can have contact sections facing in the same direction as the output face of the module, for example, by placing them under arms each comprising a contact section facing in the same direction as the output face, with the arms horizontally extending on opposite sides of the delivery head, as will be appreciated by the skilled artisan. Each of the two contact sections can then be supported by a rod, such that the arms of the delivery head are supported on the rods and the delivery head extends down below the rods. Alternately still, magnets, as described below, that are sufficiently strong could allow the embodiment of FIG. 24 to be positioned with the output face of the module facing downwards if the magnets supporting each module are cumulatively sufficiently strong to support the weight of the delivery head.

Figure 25B:
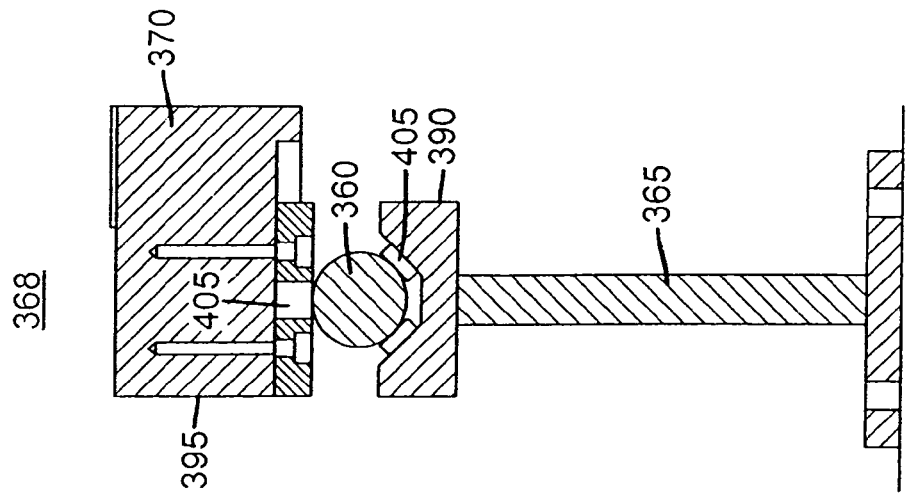
FIG. 25B shows a section view of the second bar assembly of the coating module with supports according to one embodiment of the invention.
Figure 25A:
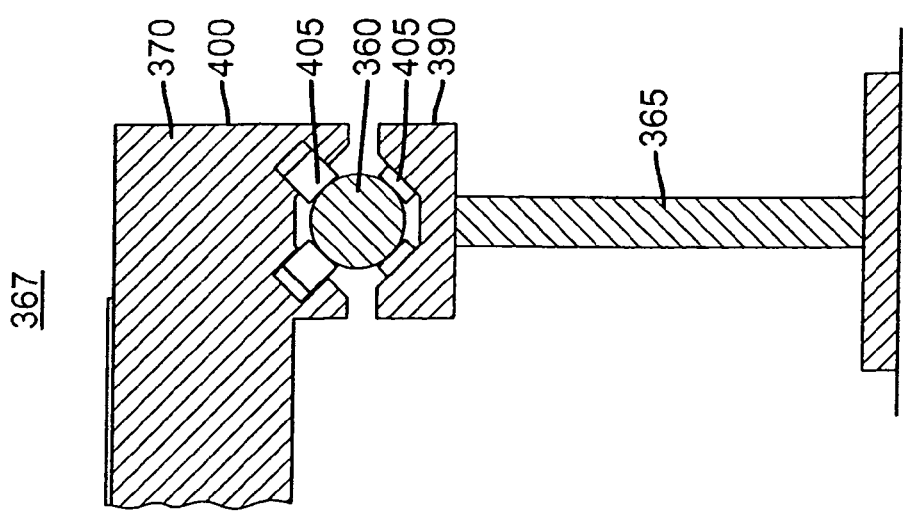
FIG. 25A shows a section view of the first bar assembly of the a coating module with supports according to one embodiment of the invention.

FIG. 25A shows a cross-sectional view of a first alignment assembly 367 including module contact section 400, while FIG. 25B shows a cross-sectional view of the second alignment assembly 368 including module contact section 395. Both assemblies show the rod supports 365, the rod or bars 360, and mating surfaces 405 which exist optionally on the modules 370 and the rod mounting structure 390 on rod supports 365.

Figure 26:
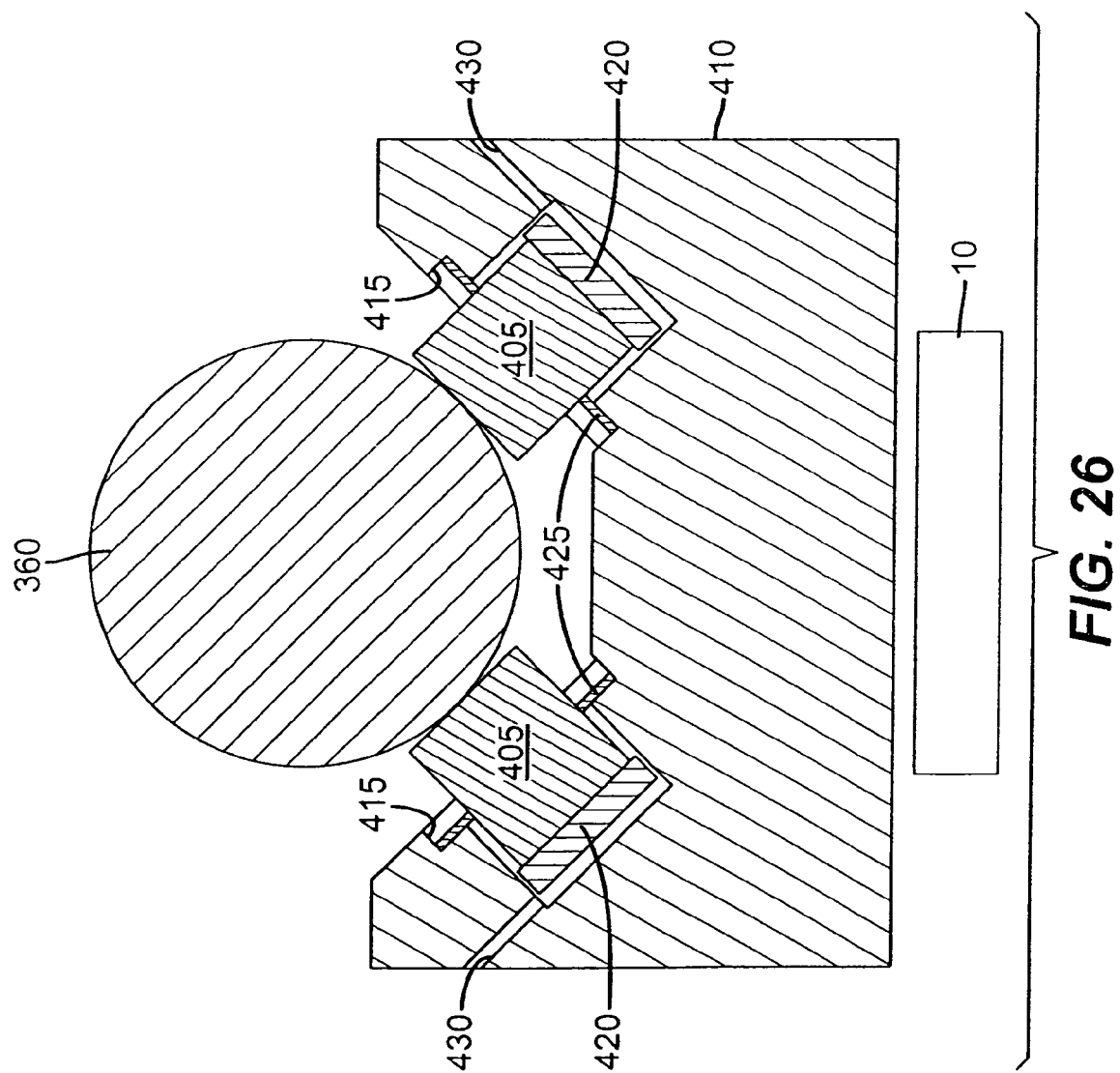
FIG. 26 shows a detailed view of a bar receptacle according to one embodiment of the invention.

In a particularly preferred embodiment, the rod mating elements 405, in order to ensure their alignment, employ a magnetic method of alignment. Referring to FIG. 26, an illustration of the attachment of the bar/rod 360 in a rod receptacle 410 is shown. The rod receptacle 410 can represent any of the rod receptacles discussed herein, either the rod mounting structure 390 or a similar feature forming the module contact section 400. Those skilled in the art will readily recognize that any of the rod contact areas or means discussed herein, may involve attachment by the same method and apparatus. In this regard, a plurality of neodymium iron boron (NdFeB) magnets are used as the rod mating elements 405 and are positioned in the rod receptacle 410, respectively, in a plurality of preferably circular-shaped holes or counterbores 415 for permitting the rod mating elements, specifically magnets 405 to receive the bar 360 by magnetic attraction. Each magnet 405 is preferably positioned directly opposite another magnet 405 on the opposite side of the rod receptacle 410 for forming a mated pair. Each magnet 405 also preferably includes a magnetic force of substantially four and one-half pounds, and includes a magnet keeper 420 magnetically attached on its bottom portion for enhancing the strength of the magnet 405.

A plurality of optional plastic, circular-shaped alignment seals 425 rest on a lip of a counterbore for abuttingly receiving the magnets 405. Each alignment seal 425 is sufficiently flexible so that the magnet is manually slidable into the seal, and is also sufficiently rigid so that once the magnet is in its desired position it is retained in this position until the below-described process for rigidly attaching the magnet 405 is completed.

For installing the magnets 405, a temporary installation rod having a desired and known profile is initially installed on the receptacle 410 for aligning the magnets 405 in their desired positions; the installation rod, also referred to as a "master rod" or "master set tool," is replaced after such initial alignment by a commercially available rod 360. In this regard, the installation rod is inserted into their respective installation holes and placed on the magnets 405. Since the installation rod can be desirably straight or can desirably contain some desired and known profile, within the tolerances required, the magnets 405 align themselves in a position defining a profile for any rod placed thereon. A potting operation to set or fix the magnets then ensues, for example, as described below.

A fill port 430 passes into the interior of the receptacle 410 and connects with each counterbore 415 for providing a passageway for a binding solution, such as STYCAST epoxy, to the counterbore 415 from the exterior. With the installation rod aligning the magnets in their desired position, the binding solution is injected into the fill port 430 until the counterbore 415 beneath the alignment seal 425 is completely full. The seal 425 functions to contain the solution such that other counterbore orientations, upside down or horizontal orientations, may also be potted. After a period of time, the solution hardens thereby rigidly attaching the magnets 405 to the receptacle 410.

The temporary installation rod is then removed and any commercially available rod 360 which typically includes a curvature along its longitudinal axis is placed on the magnets 405. The magnets 405 each magnetically attract the surface of the commercially available rod 360 to which it is adjacent so that the longitudinal axis of the rod 360 can match the desired profile that has been set into the potted or set magnets 405.

The above procedure can then be repeated for any other rod receptacles in the system. In the case of the coating modules 370, a temporary installation rod is used in a fixture that allows the position of the temporary installation rod relative to the output face of the module to be accurately maintained during the potting operation.

The coating section profile can be defined by the plurality of magnets within the one or more bar mounting structures for each rod, wherein the position of the plurality of magnets is set using a master set tool, as taught in U.S. Pat. No. 6,677,975.

The first plurality of magnets 405 on the left side of the rod receptacle 410 in FIG. 26 (in combination with FIG. 23), when a bar mounting structure, can extend along the length of a first rod. The first plurality of magnets each have a surface that is substantially parallel to each other on which surfaces the rod rests, the first plurality of magnets magnetically attracting said first rod. Similarly, a second plurality of magnets 405 on the right side of the rod receptacle 410 in FIG. 26 (in combination with FIG. 23), when a bar mounting structure, also can extend along the length of the first road. The second plurality of magnets each have a surface that is substantially parallel to each other on which surfaces said first rod rests and said second plurality of magnets magnetically attract said first rod. As evident in the embodiment of FIG. 26, the surfaces of each of the first plurality of magnets on the left side and each of the second plurality of magnets on the right side are at an angle of less than 180 degrees to each other. The first plurality of magnets and second plurality of magnets magnetically attract said first bar so that the curvature is as desired, for example straightened, due to said attraction.

Magnets may be selected from different types. In a preferred embodiment, coated magnets may be chosen. Coating of magnets is widely used to provide a surface that resists oxidation or corrosion in numerous applications, including use with medical appliances (where the magnetic material must be protected from corrosion, such as is disclosed in U.S. Pat. No. 4,857,873). Caps for magnets may be used, as in various applications where the magnet must be protected, such as is disclosed for fabricating a sensor component in U.S. Pat. No. 5,213,251, in which a cap is applied to a magnetized piece, and then the assembled unit is case-hardened for wear-resistance. Coatings and caps bonded to the magnet are preferably optimized to not only prevent oxidation and corrosion but also to provide a bearing surface capable of withstanding sliding forces across its surface during adjustment without damage. It can be easily recognized that the modules and bars of this invention are held in their positions primarily by the magnetic force of the magnets. Although extra holding mechanisms can be envisioned, the simple magnetic holding as described provided the additional feature that bars/rods and modules can be removed without sophisticated tools by simply applying forces that overcome the magnetic and weight forces of the parts to be removed.

Returning to FIG. 20, the Atomic Layer Deposition (ALD) system comprises an optional housing for providing a relatively well-controlled and contaminant-free environment. The deposition system may also comprise gas supplies (not shown) to provide the first, second, and third gaseous materials to a coating section through supply lines (not shown). Preferably, these supply lines will have a quick release mechanism; also the exhaust lines preferably have quick release mechanisms. For simplicity, optional vacuum vapor recovery apparatus and other support components are not shown in FIG. 20, but could also be used. Such vapor recovery apparatus would preferably be used to recycle the gases used in an entrance section and exit section. A transport subsystem 385, partially shown in FIG. 21, can convey substrate 20 along the non-depositing output faces of the entrance section 200, coating section 220 and exit section 240, providing movement in the x direction, using the coordinate axis system employed in the present disclosure. Motion control, as well as overall control of valves and other supporting components, can be provided by a control logic processor, such as a computer or dedicated microprocessor assembly, for example, preferably a PLC or programmable logic computer.

In another embodiment that can be particularly useful for web fabrication, an ALD system can have multiple delivery heads, or dual delivery heads, with one disposed on each side of a substrate subject to deposition. A flexible delivery head of flexible material could alternately be provided. This would provide a deposition apparatus that exhibits at least some conformance to the deposition surface.

In still another embodiment, one or more output channels of a delivery head may use the transverse gas flow arrangement that was disclosed in US Publication No. 2007/0228470, cited earlier and incorporated herein by reference. In such an embodiment, gas pressure that supports separation between a delivery head and a substrate can be maintained by some number of output channels, such as by those channels that emit purge gas (channels labeled I in FIGS. 2-3B), for example. Transverse flow would then be used for one or more output channels that emit the reactant gases (channels labeled O or M in FIGS. 2-3B).

Also, while air-bearing effects may be used to at least partially separate a delivery head from the surface of a substrate, the apparatus of the present invention may alternately be used to lift or levitate a substrate from the depositing output surface of a delivery head. Other types of substrate holders could alternately be used, including a platen, for example.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention.

PARTS LIST 10 delivery head
12 output channel
14, 16, 18 gas inlet conduit
20 substrate
21a, 21b, 21c, 21d portion of substrate
22 exhaust channel
24 exhaust conduit
36 depositing output face
60 Atomic Layer Deposition (ALD) system
90 directing channel for precursor material
91 exhaust directing channel
92 directing channel for purge gas
96 substrate support
98 gas fluid bearing
100 connection plate
102 directing chamber 104 input port
110 gas chamber plate
112, 113, 115 supply chamber
114, 116 exhaust chamber
120 gas direction plate
122 directing channel for precursor material
123 exhaust directing channel
130 base plate
132 elongated emissive channel
134 elongated exhaust channel
140 gas diffuser unit
142 nozzle plate
143, 147, 149 first, second, third diffuser output passage
146 gas diffuser plate
148 face plate
150 delivery assembly
152 elongated emissive channel
154 elongated exhaust channel
160 separator plate
162 purge plate
164 exhaust plate
166, 166' reactant plate
168 aperture
170, 172 spring
180 sequential first exhaust slot
182 sequential second exhaust slot
184 sequential third exhaust slot
200 entrance section
202a, 202b, 202c, 202d entrance section module
210 distance
220 coating section
222a, 222b coating section module
222c, 222d, 222e coating section module
232a module adapted for first thin film material
232b module adapted for second thin film material
232c module adapted for third thin film material
240 exit section
250 curved support for modules
252 output opening
254 exhaust port
260 radiant heat source
265 IR lamp
270 convective heat source
330 completed thin film
332a thin film of first thin film material
332b thin film of second thin film material
332c thin film of third thin film material
350 housing for enclosing deposition system
355 set of coating modules
360 rods for module support
365 rod supports
367 first alignment assembly
368 second alignment assembly
370 individual coating module
375 support table
380 mounting supports for table
385 drive mechanism for substrate transport
390 rod mounting structure
395 second contact section of coating module for contact with a second rod
400 first contact section of coating module for contact with a first rod
405 rod mating surfaces
410 rod receptacle
415 counterbore in rod receptacle
420 magnet keeper
425 alignment seal for counterbore
430 fill port
A arrow
D distance
E exhaust plate
F1, F2, F3, F4 gas flow
I third inert gaseous material
K direction
M second reactant gaseous material
O first reactant gaseous material
P purge plate
R reactant plate
S separator plate

The invention claimed is:

1. An apparatus for maintaining the alignment or positional relationship between at least two coating modules in an atomic layer deposition (ALD) system, the apparatus comprising:
(a) a plurality of coating modules in a coating section of the ALD system;
(b) at least a first bar and a second bar for supporting the plurality of coating modules; and
(c) at least a first bar mounting structure and a second bar mounting structure for supporting, respectively, the first bar and the second bar;
wherein each of the plurality of coating modules are supported by both of the first bar and the second bar, wherein the combination of the plurality of coating modules and the first bar and the second bar define a coating section profile for the output faces of the plurality of coating modules and wherein each of the plurality of coating modules has an axis of freedom defined by the first bar and the second bar.

2. The apparatus of claim 1 wherein the first bar and the second bar are substantially parallel in the direction of substrate movement through the ALD system, and the first bar mounting structure and the second bar mounting structure are fixed with respect to the ground or a housing for the ALD system supported by the ground.

3. The apparatus of claim 1 wherein the first bar and the second bar are attached to their corresponding bar mounting structures magnetically.

4. The apparatus of claim 1 wherein each of the plurality of coating modules are magnetically attached to at least one of the first bar and the second bar.

5. The apparatus of claim 1 wherein the first bar and the second bar are attached to their corresponding bar mounting structures magnetically and wherein the plurality of coating modules are magnetically attached to at least one of the first bar and the second bar.

6. The apparatus of claim 1 wherein the coating section profile is an arc.

7. The apparatus of claim 1 wherein the coating section profile is a plane that is horizontal, vertical, or inclined.

8. The apparatus of claim 1 wherein the ALD system also comprises at least one of an exit section and an entrance section, each having a profile, and at least one exit module and an entrance module, respectively.

9. The apparatus of claim 8 wherein the ALD system is formed from at least two sections wherein each section has a different section profile, with respect to the output faces of the coating modules, and the at least one exit module and the entrance module contained in each section.

10. The apparatus of claim 9 wherein the section profile of each section is selected to correspond to desired substrate movement.

11. The apparatus of claim 1 further comprising a substrate transport mechanism for transporting a substrate through the ALD system.

12. The apparatus of claim 1 further comprising a third bar mounting structure and a third bar.

13. The apparatus of claim 1 wherein the length of the coating section is defined by the number of modules.

14. The apparatus of claim 1 wherein each module contains the means for deposition of at least one full ALD cycle.

15. The apparatus of claim 1 further comprising a first plurality of magnets in the at least one first bar mounting structure which magnets extend along the length of the bar and are disposed on the at least one first bar mounting structure, the first plurality of magnets each having a surface that is substantially parallel to each other on which surfaces the first bar rests and the first plurality of magnets magnetically attracting the first bar.

16. The apparatus of claim 15 further comprising a second plurality of magnets in the at least one first bar mounting structure which magnets extend along the length of the bar and are disposed on the at least one first bar mounting structure, the second plurality of magnets each having a surface that is substantially parallel to each other on which surfaces the first bar rests and the second plurality of magnets magnetically attracting the first bar, wherein the surfaces of the first plurality of magnets and the surfaces of the second plurality of magnets are at an angle of less than 180 degrees to each other.

17. The apparatus of claim 16 wherein the first plurality of magnets and the second plurality of magnets magnetically attract the first bar so that the curvature is straightened due to magnetic attraction.

18. The apparatus of claim 1 wherein each of the plurality of coating modules is removable from contact with the first and the second bars by application of a force at least acting against the weight of each module.

19. The apparatus of claim 1 wherein the at least one first bar mounting structure and second bar mounting structure is integrally attached to a first and a second support structure, respectively.

20. An apparatus for maintaining the positional relationship of at least two modules in an atomic layer deposition (ALD) system, the apparatus comprising:
  (a) a plurality of coating modules in a coating section of the ALD system;
  (b) at least a first bar and a second bar for supporting the plurality of coating modules; and
  (c) at least a first bar mounting structure and a second bar mounting structure for supporting, respectively, the first bar and the second bar;

wherein the first bar is magnetically attached to the first bar mounting structure and the second bar is magnetically attached to the second bar mounting structure and optionally the plurality of coating modules are magnetically attached to at least one of the first bar and the second bar, wherein the combination of the plurality of coating modules and the first bar and the second bar define a coating section profile and wherein each of the plurality of coating modules has an axis of freedom defined by the first bar and the second bar.

21. The apparatus of claim 20, wherein there is a single integral first bar mounting structure or a plurality of first bar mounting structures along the length of the first bar.

22. A method of making the apparatus of claim 20 wherein the coating section profile is defined by a first and a second plurality of magnets within the bar mounting structures, and wherein the position of the plurality of magnets is set using a master set tool.

* * * * *